US010704888B2

(12) United States Patent
Ishigaki et al.

(10) Patent No.: US 10,704,888 B2
(45) Date of Patent: Jul. 7, 2020

(54) THREE-DIMENSIONAL MEASUREMENT DEVICE

(71) Applicant: CKD Corporation, Aichi (JP)

(72) Inventors: Hiroyuki Ishigaki, Aichi (JP);
Takahiro Mamiya, Aichi (JP)

(73) Assignee: CKD CORPORATION, Aichi (JP)

( * ) Notice: Subject to any disclaimer, the term of this patent is extended or adjusted under 35 U.S.C. 154(b) by 0 days.

(21) Appl. No.: 15/820,816

(22) Filed: Nov. 22, 2017

(65) Prior Publication Data

US 2018/0106590 A1    Apr. 19, 2018

Related U.S. Application Data

(63) Continuation of application No. PCT/JP2016/064465, filed on May 16, 2016.

(30) Foreign Application Priority Data

May 25, 2015 (JP) ................... 2015-105495
Sep. 9, 2015 (JP) ................... 2015-177399
Dec. 8, 2015 (JP) ................... 2015-239056

(51) Int. Cl.
*G01B 9/02* (2006.01)
*G01B 11/24* (2006.01)
(Continued)

(52) U.S. Cl.
CPC ....... *G01B 9/0203* (2013.01); *G01B 9/02007* (2013.01); *G01B 9/02011* (2013.01);
(Continued)

(58) Field of Classification Search
CPC ............ G01B 9/02057; G01B 9/02027; G01B 9/02018
See application file for complete search history.

(56) References Cited

U.S. PATENT DOCUMENTS

2006/0139656 A1* 6/2006 Kulawiec ............... G01B 11/06
356/512

FOREIGN PATENT DOCUMENTS

JP    H11-211417 A    8/1999
JP    2000-074618 A    3/2000
(Continued)

OTHER PUBLICATIONS

International Search Report for corresponding International Application No. PCT/JP2016/064465, dated Aug. 2, 2016 (6 pages).
(Continued)

*Primary Examiner* — Hwa Andrew Lee
(74) *Attorney, Agent, or Firm* — Osha Liang LLP

(57) ABSTRACT

A three-dimensional measurement device includes an optical system that: splits an incident light into two lights; radiates one light to a measurement object and the other light to a reference surface; and emits the combined light; a first irradiator that emits a first light that comprises a polarized light of a first wavelength and enters a first element of the optical system; a second irradiator that emits a second light that comprises a polarized light of a second wavelength and enters a second element of the optical system; a first camera that takes an image of the first light emitted from the second element when the first light enters the first element; a second camera that takes an image of the second light emitted from the first element when the second light enters the second element; and an image processor that performs measurement based on the images.

18 Claims, 18 Drawing Sheets

(51) Int. Cl.
*G01J 3/02* (2006.01)
*H01L 21/66* (2006.01)
*H05K 3/00* (2006.01)

(52) U.S. Cl.
CPC ..... *G01B 9/02018* (2013.01); *G01B 9/02024* (2013.01); *G01B 9/02027* (2013.01); *G01B 9/02057* (2013.01); *G01B 9/02079* (2013.01); *G01B 9/02081* (2013.01); *G01B 11/2441* (2013.01); *G01J 3/0205* (2013.01); *H01L 22/12* (2013.01); *H05K 3/00* (2013.01); *G01B 2290/45* (2013.01); *G01B 2290/70* (2013.01)

(56) References Cited

FOREIGN PATENT DOCUMENTS

| | | |
|---|---|---|
| JP | 2000-310518 A | 11/2000 |
| JP | 2001-227927 A | 8/2001 |
| JP | 2006-126192 A | 5/2006 |
| JP | 2006-308594 A | 11/2006 |
| JP | 2007-93288 A | 4/2007 |
| JP | 2010-164389 A | 7/2010 |
| JP | 2013-238850 A | 11/2013 |

OTHER PUBLICATIONS

Office Action in corresponding Japanese Patent Application No. 2015-239056 dated Jul. 25, 2017 (6 pages).
Office Action in corresponding Japanese Patent Application No. 2015-239056 dated Oct. 3, 2017 (6 pages).
International Preliminary Report on Patentability for corresponding International Application No. PCT/JP2016/064465, dated Dec. 7, 2017 (10 pages).
Written Opinion for coresponding International Application No. PCT/JP2016/064465, dated Aug. 2, 2016 (13 pages).

* cited by examiner

THREE-DIMENSIONAL MEASUREMENT DEVICE

BACKGROUND OF THE INVENTION

Technical Field

The present disclosure relates to a three-dimensional measurement device for measuring the shape of a measurement object.

Background

A three-dimensional measurement device using an interferometer has been known as the three-dimensional measurement device configured to measure the shape of a measurement object.

In such a three-dimensional measurement device, half (for example, 750 nm) the wavelength of the measurement light (for example, 1500 nm) is the measurement range (dynamic range).

In the case of a measurement object that has a height difference equal to or greater than half the wavelength of the measurement light, this provides an insufficient measurement range and is likely to fail in appropriately measuring the shape of the measurement object. Increasing the wavelength of the measurement light, however, reduces the resolution and is likely to decrease the measurement accuracy.

By taking into account the foregoing, a recently proposed three-dimensional measurement device is configured to perform measurement by using two different lights having different wavelengths (for example, as described in Patent Literature 1).

This three-dimensional measurement device causes a combined light of a first wavelength light and a second wavelength light to enter an interference optical system (for example, polarizing beam splitter) and causes an interfering light emitted from the interference optical system to be subjected to wavelength separation by a predetermined optical separator (for example, dichroic mirror), so as to obtain an interfering light with regard to the first wavelength light and an interfering light with regard to the second wavelength light. The shape of a measurement object is measured, based on interference fringe images obtained by individually taking images of the interfering lights with regard to the respective wavelength lights.

CITATION LIST

Patent Literature

PTL 1: JP 2010-164389A

SUMMARY OF THE INVENTION

In order to expand the measurement range in three-dimensional measurement by using two different lights having different wavelengths, there is a need to decrease the wavelength difference between the two different lights. The nearer wavelengths of the two different lights provide the wider measurement range.

The closer wavelengths of the two different lights, however, cause difficulty in appropriately separating the wavelengths of the two different lights.

In other words, in three-dimensional measuring using two different lights having a small wavelength difference, there is a need to take an image of the interfering light with regard to the first wavelength light and an image of the interfering light with regard to the second wavelength light at different times. This is likely to decrease the measurement efficiency.

For example, in three-dimensional measurement using the phase-shift method, when phases are changed in four different levels, there is a need to obtain four different image data. Accordingly, in the case of using two different lights, a required imaging time is for four imaging processes at different times, i.e., a total of eight imaging processes.

By taking into account the circumstances described above, one or more embodiments of the invention provide a three-dimensional measurement device that uses two different lights having different wavelengths to expand a measurement range and improve measurement efficiency.

The following describes each of various aspects provided adequately to solve the problems described above. Functions and advantageous effects that are characteristic of each of the aspects are also described as appropriate.

Aspect 1. There is provided a three-dimensional measurement device comprising a predetermined optical system (specific optical system) configured to split a predetermined incident light into two lights, to radiate one of the two lights as a measurement light to a measurement object and the other of the two lights as a reference light to a reference surface, and to recombine the two lights to a combined light and emit the combined light; a first irradiator configured to emit a first light that includes a polarized light of a first wavelength and enters the predetermined optical system; a second irradiator configured to emit a second light that includes a polarized light of a second wavelength and enters the predetermined optical system; a first imaging unit configured to take an image of an output light with regard to the first light that is emitted from the predetermined optical system; a second imaging unit configured to take an image of an output light with regard to the second light that is emitted from the predetermined optical system; and an image processor configured to perform three-dimensional measurement of the measurement object, based on interference fringe images taken by the first imaging unit and the second imaging unit. The first light and the second light enter different positions of the predetermined optical system. The output light with regard to the first light and the output light with regard to the second light are emitted from different positions of the predetermined optical system.

The configuration of Aspect 1 described above causes the first light and the second light to enter different positions of the predetermined optical system and thereby causes the first light and the second light to be separately emitted from different positions of the predetermined optical system without interfering with each other. There is accordingly no need to use a predetermined separator to separate the light emitted from the predetermined optical system into the first light and the second light.

The "output light with regard to the first light" output from the "predetermined optical system (specific optical system)" includes "a combined light of the reference light and the measurement light with regard to the first light or an interfering light by interference of the combined light", and the "output light with regard to the second light" includes "a combined light of the reference light and the measurement light with regard to the second light or an interfering light by interference of the combined light". Accordingly the "predetermined optical system" includes not only "an optical system that causes interference of the reference light and the measurement light inside thereof and outputs the reference light and the measurement light as interfering lights" but "an
} optical system that outputs the reference light and the measurement light as a simple combined light without causing interference of the reference light and the measurement light inside thereof". When the "output light" output from the "predetermined optical system" is a "combined light", the combined light is to be converted into "interfering light" by a predetermined interfering unit in a stage prior to at least imaging by an "imaging unit", in order to take "interference fringe images". The same applies hereinafter.

Accordingly, an optical system configured to split a predetermined incident light into two lights, to radiate one of the lights as a measurement light to a measurement object and the other of the lights as a reference light to a reference surface, and to recombine the two lights to a combined light and emit the combined light for the purpose of causing interference of lights (taking interference fringe images) may be called "interference optical system". Accordingly, in Aspect 1 described above, the "predetermined optical system (specific optical system)" may be regarded as "interference optical system" (the same applied to the respective aspects described below).

As a result, this configuration can use two different lights having wavelengths near to each other as the first light and the second light and thus further expands the measurement range in three-dimensional measurement.

Additionally, this configuration enables imaging of the output light with regard to the first light and imaging of the output light with regard to the second light to be performed simultaneously. This shortens the total imaging time and improves the measurement efficiency.

A configuration that uses two interference optical systems (interferometer modules) to measure a measurement object may be employed as a configuration that uses two lights. This configuration, however, uses a different reference surface as the standard for each interference optical system and causes the two lights to have different optical path intervals that respectively give optical path differences between the reference light and the measurement light. This is likely to decrease the measurement accuracy. It is additionally difficult to make the optical path lengths of the two interference optical systems precisely equal to each other, and an operation for such adjustment also has extreme difficulty.

The configuration of this aspect, on the other hand, uses two lights for one interference optical system (predetermined optical system) including one reference surface as the standard and accordingly causes the two lights to have an identical optical path interval that gives an optical path difference between the reference light and the measurement light. As a result, this configuration prevents various troubles caused by providing two interference optical systems.

The "first light" radiated from the "first irradiator" may be any light including at least the "polarized light having a first wavelength (first polarized light)" and may be a light (for example, "non-polarized light" or "circularly polarized light") including other extra components that are subsequently cut in the "predetermined optical system". The same applies to aspects described below.

Similarly, the "second light" radiated from the "second irradiator" may be any light including at least the "polarized light having a second wavelength (second polarized light)" and may be a light (for example, "non-polarized light" or "circularly polarized light") including other extra components that are subsequently cut in the "predetermined optical system".

Aspect 2. There is provided a three-dimensional measurement device comprising a predetermined optical system (specific optical system) configured to split a predetermined incident light into two lights, to radiate one of the two lights as a measurement light to a measurement object and the other of the two lights as a reference light to a reference surface, and to recombine the two lights to a combined light and emit the combined light; a first irradiator configured to emit a first light that includes a polarized light of a first wavelength and enters a first input-output element of the predetermined optical system; a second irradiator configured to emit a second light that includes a polarized light of a second wavelength and enters a second input-output element of the predetermined optical system; a first imaging unit configured to take an image of an output light with regard to the first light that is emitted from the second input-output element when the first light enters the first input-output element; a second imaging unit configured to take an image of an output light with regard to the second light that is emitted from the first input-output element when the second light enters the second input-output element; and an image processor configured to perform three-dimensional measurement of the measurement object, based on interference fringe images taken by the first imaging unit and the second imaging unit.

The configuration of Aspect 2 described above causes the first light and the second light to enter different positions (first input-output element and second input-output element) of the predetermined optical system. The first light and the second light accordingly go through the same optical path in reverse directions and are separately emitted from different positions (first input-output element and second input-output element) of the predetermined optical system without interfering with each other. There is accordingly no need to use a predetermined separator to separate the light emitted from the predetermined optical system into the first light and the second light. As a result, this configuration has similar functions and advantageous effects to those of Aspect 1 described above.

In order to make the configuration of Aspect 2 described above serve more appropriately, "the polarizing direction of the first light that enters the first input-output element is identical with the polarizing direction of the output light with regard to the second light that is emitted from the first input-output element" and that "the polarizing direction of the second light that enters the second input-output element is identical with the polarizing direction of the output light with regard to the first light that is emitted from the second input-output element, when the measurement object is flush with the reference surface". The same applies to aspects described below.

Similarly, "the polarizing direction of the first light differs from the polarizing direction of the second light by 90 degrees, when the incident direction of the first light entering the first input-output element is aligned with the incident direction of the second light entering the second input-output element on a plane including both the incident directions".

Additionally, "the polarizing directions of the first light (or its measurement light or reference light) and the second light (or its measurement light or reference light) that travel in an identical direction on an identical axial line (toward, for example, a measurement object or a reference surface) differ from each other by 90 degrees".

Aspect 3. There is provided a three-dimensional measurement device comprising a polarizing beam splitter configured to have a boundary surface that splits a predetermined incident light into two polarized lights having polarizing directions orthogonal to each other, to radiate one of the split polarized lights as a measurement light to a measurement object and the other of the split polarized lights as a reference light to a reference surface, and to recombine the two polarized lights to a combined light and emit the combined light; a first irradiator configured to emit a first light that includes a polarized light of a first wavelength and enters a first surface as a first input-output element of the polarizing beam splitter, out of the first surface and a second surface of the polarizing beam splitter arranged to adjoin to each other across the boundary surface; a second irradiator configured to emit a second light that includes a polarized light of a second wavelength and enters the second surface as a second input-output element of the polarizing beam splitter; a first quarter wave plate placed between the reference surface and a third surface of the polarizing beam splitter which the reference light enters and is emitted from; a second quarter wave plate placed between the measurement object and a fourth surface of the polarizing beam splitter which the measurement light enters and is emitted from; a first imaging unit configured to take an image of an output light with regard to the first light that is emitted from the second surface when the first light enters the first surface of the polarizing beam splitter; a second imaging unit configured to take an image of an output light with regard to the second light that is emitted from the first surface when the second light enters the second surface of the polarizing beam splitter; and an image processor configured to perform three-dimensional measurement of the measurement object, based on interference fringe images taken by the first imaging unit and the second imaging unit.

Aspect 3 described above can implement the configuration of Aspect 1 or Aspect 2 described above by the relatively simple configuration based on the principle of the Michelson interferometer.

The "polarizing beam splitter" has the boundary surface that serves to transmit a first polarized light (for example, P-polarized light) having a first polarizing direction and to reflect a second polarized light (for example, S-polarized light) having a second polarizing direction. Accordingly, the first light entering the first surface of the polarizing beam splitter is split into, for example, a reference light that is the first polarized light and a measurement light that is the second polarized light, and the second light entering the second surface of the polarizing beam splitter is split into, for example, a reference light that is the second polarized light and a measurement light that is the first polarized light. The same applied to aspects described later.

The configuration that causes the first light and the second light to enter different positions (first surface and second surface) of the predetermined optical system splits the first light into the reference light and the measurement light of different polarized light components (P-polarized light or S-polarized light) and splits the second light into the reference light and the measurement light of different polarized light components. The first light and the second light accordingly do not interfere with each other but are separately emitted from the predetermined optical system.

In the case where two different lights having different wavelengths are used, the "quarter wave plate" used in common by the two lights is more likely to fail in serving appropriately with an increase in wavelength difference between the two lights. From this point of view, two different lights having a small wavelength difference may be used.

Aspect 4. There is provided a three-dimensional measurement device comprising a first irradiator configured to emit a first light including a polarized light of a first wavelength; a second irradiator configured to emit a second light including a polarized light of a second wavelength; a first polarizing beam splitter configured to split the first light entering from the first irradiator into two polarized lights having polarizing directions orthogonal to each other, to radiate one of the polarized lights as a measurement light to a measurement object and the other of the polarized lights as a reference light to a reference surface, and to serve as a first input-output element that combines a measurement light of the second light entering via the measurement object with a reference light of the second light entering via the reference surface to a combined light and emits the combined light; a second polarizing beam splitter configured to split the second light entering from the second irradiator into two polarized lights having polarizing directions orthogonal to each other, to radiate one of the polarized lights as a measurement light to the measurement object and the other of the polarized lights as a reference light to the reference surface, and to serve as a second input-output element that combines a measurement light of the first light entering via the measurement object with a reference light of the first light entering via the reference surface to a combined light and emit the combined light; a first quarter wave plate placed between the first polarizing beam splitter and the reference surface; a second quarter wave plate placed between the first polarizing beam splitter and the measurement object; a third quarter wave plate placed between the second polarizing beam splitter and the reference surface; a fourth quarter wave plate placed between the second polarizing beam splitter and the measurement object; a first imaging unit configured to take an image of an output light with regard to the first light that is emitted from the second polarizing beam splitter when the first light enters the first polarizing beam splitter; a second imaging unit configured to take an image of an output light with regard to the second light that is emitted from the first polarizing beam splitter when the second light enters the second polarizing beam splitter; and an image processor configured to perform three-dimensional measurement of the measurement object, based on interference fringe images taken by the first imaging unit and the second imaging unit.

Aspect 4 described above can implement the configuration of Aspect 1 or Aspect 2 described above by the relatively simple configuration based on the principle of the Mach-Zehnder interferometer.

Aspect 5. There is provided a three-dimensional measurement device comprising a polarizing beam splitter having a boundary surface configured to transmit a first polarized light (for example, P-polarized light) that is a polarized light having a first polarizing direction and reflect a second polarized light (for example, S-polarized light) that is a polarized light having a second polarizing direction; a first irradiator configured to emit a first light that includes the first polarized light of a first wavelength and enters a first surface as a first input-output element of the polarizing beam splitter, out of the first surface and a second surface of the polarizing beam splitter arranged to adjoin to each other across the boundary surface; a second irradiator configured to emit a second light that includes the second polarized light of a second wavelength and enters the second surface as a second input-output element of the polarizing beam splitter; a quarter wave plate arranged to be opposed to a third surface of the polarizing beam splitter, from which the first light transmitted through the boundary surface and the second light reflected by the boundary surface are emitted; a half mirror (reference surface) arranged to be opposed to the quarter wave plate on an opposite side to the polarizing beam splitter and configured to transmit part of a light radiating via the quarter wave plate as a measurement light and radiate the measurement light to a measurement object, while reflecting a remaining part of the light as a reference light; a first imaging unit configured to take an image of an output light with regard to the first light that is emitted from the second surface when the first light enters the first surface of the polarizing beam splitter; a second imaging unit configured to take an image of an output light with regard to the second light that is emitted from the first surface when the second light enters the second surface of the polarizing beam splitter; and an image processor configured to perform three-dimensional measurement of the measurement object, based on interference fringe images taken by the first imaging unit and the second imaging unit.

Aspect 5 described above can implement the configuration of Aspect 1 or Aspect 2 described above by the relatively simple configuration based on the principle of the Fizeau interferometer.

Aspect 6. The three-dimensional measurement device described in any one of Aspects 2 to 5 above may further comprise a first light guiding unit configured to cause at least part of the first light emitted from the first irradiator to enter the first input-output element and to cause at least part of the output light with regard to the second light emitted from the first input-output element to enter the second imaging unit; and a second light guiding unit configured to cause at least part of the second light emitted from the second irradiator to enter the second input-output element and to cause a least part of the output light with regard to the first light emitted from the second input-output element to enter the first imaging unit.

Aspect 6 described above can implement the configuration of Aspect 2 described above or the like by the relatively simple configuration.

One exemplary configuration may "comprise a first non-polarizing beam splitter (for example, half mirror) configured to transmit part of the first light emitted from the first irradiator and reflect a remaining part of the first light, to cause the transmitted light or the reflected light of the first light to enter the first input-output element, to transmit part of an output light with regard to the second light emitted from the first input-output element and reflect a remaining part of the output light, and to cause the transmitted light or the reflected light of the second light to enter the second imaging unit; and a second non-polarizing beam splitter (for example, half mirror) configured to transmit part of the second light emitted from the second irradiator and reflect a remaining part of the second light, to cause the transmitted light or the reflected light of the second light to enter the second input-output element, to transmit part of an output light with regard to the first light emitted from the second input-output element and reflect a remaining part of the output light, and to cause the transmitted light or the reflected light of the first light to enter the first imaging unit."

Aspect 7. The three-dimensional measurement device described in Aspect 6 above may further comprise a first light isolator placed between the first irradiator and the first light guiding unit and configured to transmit only a light in one direction out of the light emitted from the first irradiator and block a light in a reverse direction; and a second light isolator placed between the second irradiator and the second light guiding unit and configured to transmit only a light in one direction out of the light emitted from the second irradiator and block a light in a reverse direction.

In the case where a non-polarizing beam splitter is provided as the light guiding unit of Aspect 6 above, the non-polarizing beam splitter transmits part of the light emitted from the input-output element, while reflecting a remaining part of the light. While one of the transmitted light and the reflected light of this light enters the imaging unit, the other of the transmitted light and the reflected light that does not enter the imaging unit travels toward the irradiator. The other light entering the irradiator is likely to damage the irradiator or destabilize the operation of the irradiator.

The configuration of this Aspect 7, on the other hand, includes the light isolator to prevent damage and destabilization of the irradiator.

Aspect 8. There is provided a three-dimensional measurement device comprising a predetermined optical system (interference optical system) configured to split a predetermined incident light into two polarized lights having polarizing directions orthogonal to each other, to radiate one of the polarized lights as a measurement light to a measurement object and the other of the polarized lights as a reference light to a reference surface, and to recombine the two polarized lights to a combined light and emit the combined light; a first irradiator configured to emit a first light that has a first wavelength and enters the predetermined optical system; a second irradiator configured to emit a second light that has a second wavelength different from the first wavelength and enters the predetermined optical system; a first imaging unit configured to take an image of an output light with regard to the first light that is emitted from the predetermined optical system; a second imaging unit configured to take an image of an output light with regard to the second light that is emitted from the predetermined optical system; and an image processor configured to perform three-dimensional measurement of the measurement object, based on interference fringe images taken by the first imaging unit and the second imaging unit. The first light and the second light enter different positions of the predetermined optical system. The predetermined optical system is configured to: split the first light into the reference light that is a first polarized light (for example, P-polarized light) having a first polarizing direction and the measurement light that is a second polarized light (for example, S-polarized light) having a second polarizing direction; split the second light into the reference light that is the second polarized light and the measurement light that is the first polarized light; and emit the output light with regard to the first light by recombining the split lights and the output light with regard to the second light by recombining the split lights from different positions of the predetermined optical system.

The configuration of Aspect 8 described above causes the first light and the second light to enter different positions of the predetermined optical system and thereby splits the first light into the reference light and the measurement light of different polarized light components (P-polarized light or S-polarized light) and splits the second light into the reference light and the measurement light of different polarized light components. The first light and the second light entering the predetermined optical system accordingly do not interfere with each other but are separately emitted from the predetermined optical system.

Aspect 8 described above can accordingly implement the configuration of Aspect 1 described above by the relatively simple configuration based on the principle of the Michelson interferometer or the Mach-Zehnder interferometer.

Aspect 9. The three-dimensional measurement device described in any one of Aspects 1 to 8 above may further comprise a first phase shift unit configured to give a relative phase difference between the reference light and the measurement light with regard to the first light; and a second phase shift unit configured to give a relative phase difference between the reference light and the measurement light with regard to the second light. The image processor may comprise a first measurement value acquirer configured to perform shape measurement of the measurement object by a phase shift method, based on a plurality of interference fringe images of the output light with regard to the first light taken by the first imaging unit when the output light with regard to the first light is subjected to phase shift a plurality of times (for example, three or four times) by the first phase shift unit, and to obtain a measurement value of the shape measurement as a first measurement value; a second measurement value acquirer configured to perform shape measurement of the measurement object by the phase shift method, based on a plurality of interference fringe images of the output light with regard to the second light taken by the second imaging unit when the output light with regard to the second light is subjected to phase shift a plurality of times (for example, three or four times) by the second phase shift unit, and to obtain a measurement value of the shape measurement as a second measurement value; and a height information acquirer configured to obtain height information specified from the first measurement value and the second measurement value, as height information of the measurement object.

In a conventional three-dimensional measurement device using the phase shift method, there is a need to change the phase in four different levels or in three different levels and take corresponding four different or three different interference fringe images. When two different lights having a small wavelength difference for the purpose of improvement of the measurement range, a required imaging time is accordingly for four imaging processes (or six imaging processes) at different timings, i.e., a total of eight (or a total of six) imaging processes.

The configuration of this Aspect 9, on the other hand, enables images of the output light with regard to the first light and the output light with regard to the second light to be taken simultaneously and accordingly obtains a total of eight (or a total of six) interference fringe images with regard to the two different lights in an imaging time for a total of four (or a total of three) imaging processes. As a result, this shortens the total imaging time and achieves improvement of the measurement efficiency.

Aspect 10. The three-dimensional measurement device described in Aspect 9 above may further comprise a first spectroscopic unit configured to split the output light with regard to the first light into a plurality of lights; a first filtering unit configured as the first phase shift unit to give different phase differences to at least a required number of (for example, three or four) split lights required for measurement by the phase shift method, out of a plurality of split lights split by the first spectroscopic unit; a second spectroscopic unit configured to split the output light with regard to the second light into a plurality of lights; and a second filtering unit configured as the second phase shift unit to give different phase differences to at least a required number of (for example, three or four) split lights required for measurement by the phase shift method, out of a plurality of split lights split by the second spectroscopic units. The first imaging unit may be configured to simultaneously take images of at least the plurality of split lights transmitted through the first filtering unit, and the second imaging unit may be configured to simultaneously take images of at least the plurality of split lights transmitted through the second filtering unit.

The above phase shift unit may be configured, for example, to move the reference surface along the optical axis and thereby physically change the optical path length. This configuration, however, takes a considerable time to obtain all the interference fringe images required for measurement. This not only increases the measurement time but is likely to decrease the measurement accuracy by the effect of, for example, fluctuation of the air or vibration.

The configuration of this Aspect 10, however, enables all the interference fringe images required for measurement to be obtained simultaneously. For example, this configuration enables eight different (or six different) interference fringe images with regard to two different lights to be obtained simultaneously. As a result, this improves the measurement accuracy and significantly shortens the total imaging time, thus achieving remarkable improvement of the measurement efficiency.

The "spectroscopic unit" may be, for example, a "spectroscopic unit configured to split an incident light into four lights having equal optical path lengths and having optical paths that are arrayed in matrix on a plane perpendicular to the traveling direction of light". One example is a configuration of Aspect 11 described below.

Aspect 11. In the three-dimensional measurement device described in Aspect 10 above, the spectroscopic unit (first spectroscopic unit or second spectroscopic unit may comprise a first optical member (first Koester prism) that is a triangular prism having a triangular sectional shape along a first plane and includes a first splitting unit (first half mirror) arranged along a plane that goes through a line of intersection between a first surface and a second surface out of three surfaces along a direction perpendicular to the first plane and that is orthogonal to a third surface; and a second optical member (second Koester prism) that is a triangular prism having a triangular sectional shape along a second plane orthogonal to the first plane and includes a second splitting unit (second half mirror) arranged along a plane that goes through a line of intersection between a first surface and a second surface out of three surfaces along a direction perpendicular to the second plane and that is orthogonal to a third surface. The third surface of the first optical member may be arranged to be opposed to the first surface of the second optical member, such that: a light (vertically) entering the first surface of the first optical member is split in two directions by the first splitting unit; a split light reflected by the first splitting unit is reflected at the first surface toward the third surface, and a split light transmitted through the first splitting unit is reflected at the second surface toward the third surface, so that two parallel split lights are emitted from the third surface; the two split lights emitted from the third surface of the first optical member (vertically) enter the first surface of the second optical member; each of the two split lights is split in two directions by the second splitting unit; two split lights reflected by the second splitting unit are respectively reflected at the first surface toward the third surface, and two split lights transmitted through the second splitting unit are respectively reflected at the second surface toward the third surface, so that four parallel split lights are emitted from the third surface.

The configuration of above Aspect 11 enables a light emitted from the predetermined optical system (interference optical system) to be split into four lights arrayed in two by two matrixes. In a configuration of taking images of a plurality of split lights simultaneously by one single imaging element like Aspect 12 described later, divisional areas determined by dividing the imaging region of the imaging element in matrix of four equal areas may thus be respectively allocated to the four split lights. This configuration accordingly ensures the effective use of the imaging region of the imaging element. For example, when the imaging region of a general imaging element having an aspect ratio of 4 to 3 is divided into four equal areas, the respective divisional areas have the same aspect ratio of 4 to 3. This makes a wider range in each divisional area usable and thereby further improves the measurement accuracy.

Using diffraction grating as the spectroscopic unit is likely to reduce the resolution. The configuration of this aspect, however, splits one light into two parallel lights and further splits each of the two parallel lights into two parallel lights, so as to split one light into four parallel lights. This configuration suppresses reduction of the resolution.

Additionally, this aspect employs the optical member having the above configuration (Koester prism) as the means for splitting one light into two parallel lights, so that the two split lights have optically identical optical path lengths. As a result, there is no need to provide an optical path adjuster to adjust the optical path lengths of the two split lights. This configuration reduces the total number of components and achieves, for example, simplified configuration and downsizing of the device.

The configuration that the third surface of the first optical member is in contact with the first surface of the second optical member causes the light to travel only in the optical member and is not exposed to the air until one light entering the spectroscopic unit is emitted as four split lights. This configuration reduces the effect of, for example, fluctuation of the air.

Aspect 12. In the three-dimensional measurement device described in either Aspect 10 or Aspect 11 above, the first imaging unit may include a single imaging element configured to simultaneously take images of at least the plurality of split lights transmitted through the first filtering unit, and the second imaging unit may include a single imaging element configured to simultaneously take images of at least the plurality of split lights transmitted through the second filtering unit.

A configuration for taking images of a plurality of split lights simultaneously may use a plurality of cameras (imaging elements) configured as imaging units to respectively take images of respective split lights. This configuration is, however, likely to cause a measurement error due to, for example, the difference of the respective cameras (imaging elements).

The configuration of this aspect, however, simultaneously takes images of a plurality of split lights by one single imaging element. This suppresses the occurrence of a measurement error or the like and improves the measurement accuracy.

Aspect 13. In the three-dimensional measurement device described in any one of Aspects 1 to 12 above, the measurement object may be either solder paste printed on a printed circuit board or a solder bump formed on a wafer substrate.

The configuration of Aspect 13 described above allows for, for example, height measurement of solder paste printed on the printed circuit board or a solder bump formed on a wafer substrate. This configuration accordingly enables the quality of the solder paste or the solder bump to be determined, based on the measurement value in inspection of the solder paste or the solder bump. This allows for quality judgement with the high accuracy by providing the functions and the advantageous effects of the above respective components in this inspection. As a result, this improves the inspection accuracy of a solder printing inspection device or a solder bump inspection device.

DETAILED DESCRIPTION

Figure 1:
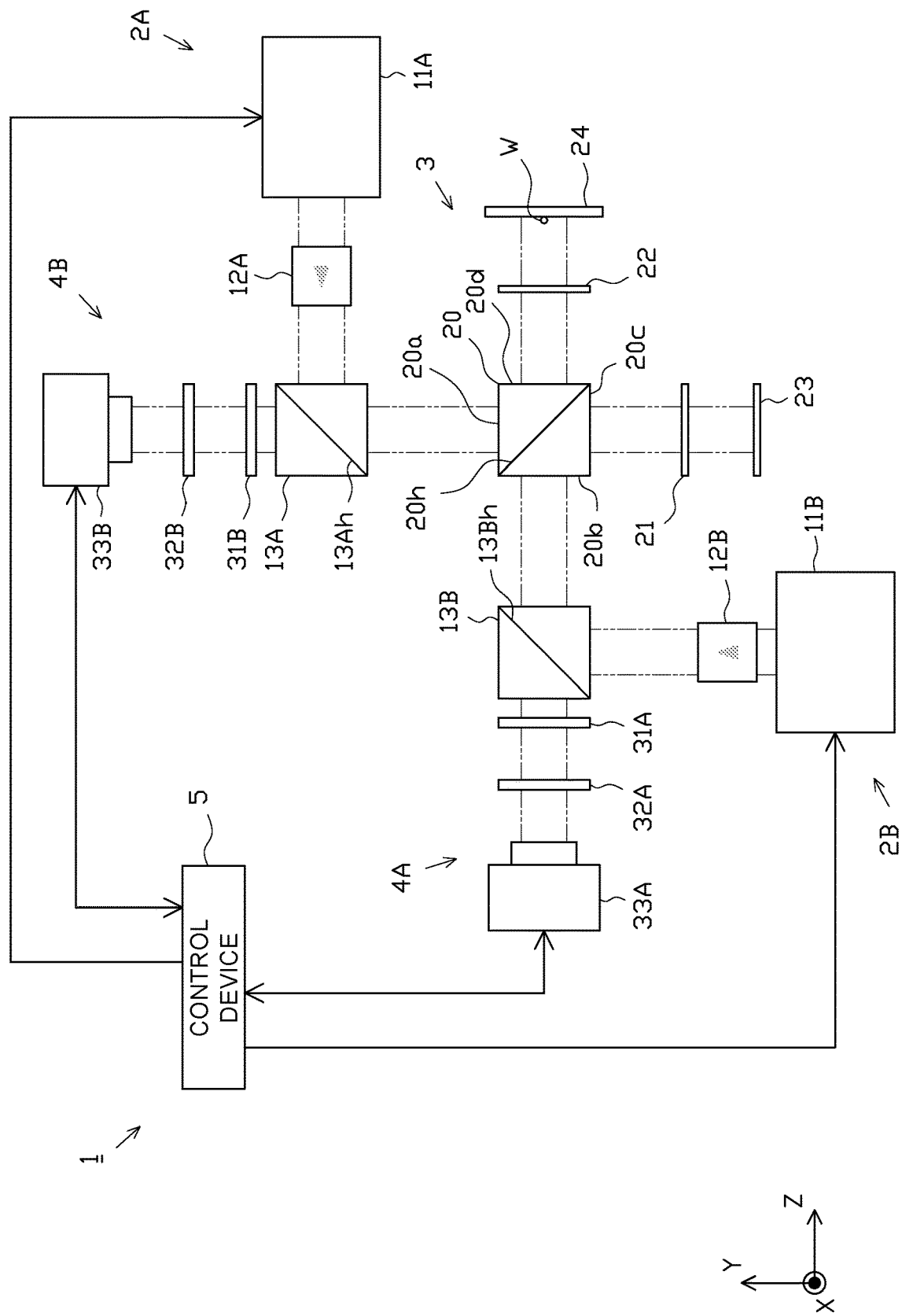
FIG. 1 is a schematic configuration diagram illustrating a three-dimensional measurement device according to one or more embodiments of the invention.
Figure 2:
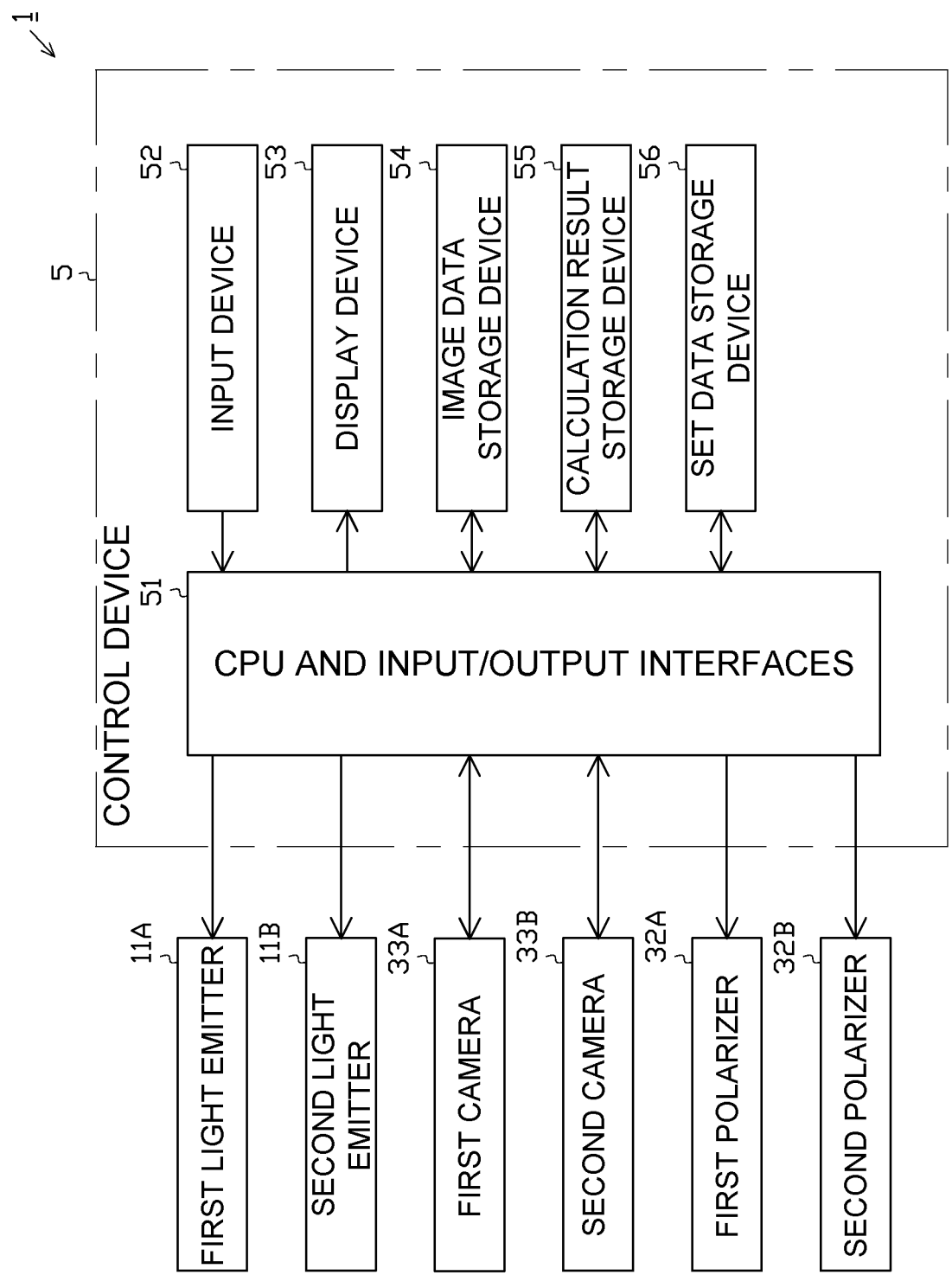
FIG. 2 is a block diagram illustrating the electrical configuration of the three-dimensional measurement device according to one or more embodiments of the invention.

The following describes embodiments of a three-dimensional measurement device with reference to the drawings. FIG. 1 is a diagram illustrating the schematic configuration of a three-dimensional measurement device 1 according to one or more embodiments of the invention. FIG. 2 is a block diagram illustrating the electrical configuration of the three-dimensional measurement device 1 according to one or more embodiments of the invention. Hereinafter, as a matter of convenience, a front-back direction of the sheet surface of FIG. 1 is called "X-axis direction", a top-bottom direction of the sheet surface is called "Y-axis direction" and a left-right direction of the sheet surface is called "Z-axis direction".

The three-dimensional measurement device 1 is configured based on the principle of the Michelson interferometer and includes two projection optical systems 2A and 2B (first projection optical system 2A and second projection optical system 2B) configured to emit lights of specific wavelengths, an interference optical system 3 configured to receive the lights respectively emitted from the projection optical systems 2A and 2B, two imaging systems 4A and 4B (first imaging system 4A and second imaging system 4B) configured to take images of the lights emitted from the interference optical system 3, and a control device 5 configured to perform various controls, image processing, calculations and the like involved in the projection optical systems 2A and 2B, the interference optical system 3, the imaging systems 4A and 4B and the like.

The "control device 5" is configured as the "image processor" according to one or more embodiments of the invention, and the "interference optical system 3" is configured as the "predetermined optical system (specific optical system)" according to one or more embodiments of the invention. In one or more embodiments of the invention, the "interference optical system" denotes an optical system configured to split a predetermined incident light into two lights (measurement light and reference light), provide the two lights with an optical path difference, recombine the two lights and output the combined light, for the purpose of causing interference of light (taking an interference fringe image). In other words, the "interference optical system" is not limited to an optical system that internally causes interference of two lights and outputs the interfering light but may also be an optical system that simply combines two lights and outputs the combined light without internally causing interference of two lights. Accordingly, as described later, when two lights (measurement light and reference light) are output as the combined light without interference from the "interference optical system", the combined light is converted to interfering light by means of a predetermined interfering unit in a stage at least prior to imaging (for example, inside of the imaging system).

The configuration of the two projection optical systems 2A and 2B (first projection optical system 2A and second projection optical system 2B) is described first in detail. The first projection optical system 2A includes, for example, a first light emitter 11A, a first light isolator 12A and a first non-polarizing beam splitter 13A. The "first light emitter 11A" is configured as the "first irradiator" according to one or more embodiments of the invention.

Although not being illustrated, the first light emitter 11A includes, for example, a laser light source configured to output a linearly polarized light of a specific wavelength $\lambda_1$, a beam expander configured to expand the linearly polarized light output from the laser light source and emit the expanded light as parallel light, a polarizer configured to adjust the intensity and a half wave plate configured to adjust the polarizing direction.

According to one or more embodiments of the invention, a linearly polarized light of the wavelength $\lambda_1$ (for example, $\lambda_1$=1500 nm) having a polarizing direction that is a direction inclined at 45 degrees to the X-axis direction and the Y-axis direction is emitted leftward in the Z-axis direction from the first light emitter 11A. The "wavelength $\lambda_1$" corresponds to the "first wavelength" according to one or more embodiments of the invention. Hereinafter the light of the wavelength $\lambda_1$ emitted from the first light emitter 11A is called "first light".

The first light isolator 12A is an optical element configured to transmit only a light traveling in one direction (leftward in the Z-axis direction according to one or more embodiments of the invention) but block a light traveling in a reverse direction (rightward in the Z-axis direction according to one or more embodiments of the invention). This configuration allows for transmission of only the first light emitted from the first light emitter 11A and thereby prevents damage and destabilization of the first light emitter 11A by return light.

The first non-polarizing beam splitter 13A is a cube-shaped known optical member configured by joining right angle prisms (triangular prisms having a bottom face in an isosceles right triangle shape: the same applies hereinafter) together to be integrated, and its joint surface 13Ah is coated with, for example, a metal film. The "first non-polarizing beam splitter 13A" is configured as the "first light guiding unit" or "first light guide" according to one or more embodiments of the invention.

The non-polarizing beam splitter is configured to split the incident light including polarization state into a transmitted light and a reflected light at a predetermined ratio. The same applies hereinafter. According to one or more embodiments of the invention, a half mirror having a 1:1 split ratio is employed as the non-polarizing beam splitter. The half mirror splits the incident light to provide a P-polarized light component and an S-polarized light component of the transmitted light and a P-polarized light component and an S-polarized light component of the reflected light all at identical rates and provide the respective polarization states of the transmitted light and the reflected light that are identical with the polarization state of the incident light.

According to one or more embodiments of the invention, a linearly polarized light having a polarizing direction that is a direction parallel to the sheet surface of FIG. 1 (Y-axis direction or Z-axis direction) is called P-polarized light (P-polarized light component). A linearly polarized light having a polarizing direction that is the X-axis direction perpendicular to the sheet surface of FIG. 1 is called S-polarized light (S-polarized light component). The "P-polarized light" corresponds to the "first polarized light having the first polarizing direction". The "S-polarized light" corresponds to the "second polarized light having the second polarizing direction".

The first non-polarizing beam splitter 13A is arranged such that one of two surfaces adjoining to each other across the joint surface 13Ah is perpendicular to the Y-axis direction and the other of the two surfaces is perpendicular to the Z-axis direction. In other words, the joint surface 13Ah of the first non-polarizing beam splitter 13A is arranged to be inclined at 45 degrees to the Y-axis direction and the Z-axis direction. For example, the first non-polarizing beam splitter 13A is arranged to transmit part (half) of the first light that enters leftward in the Z-axis direction from the first light emitter 11A via the first light isolator 12A, leftward in the Z-axis direction and reflect the remaining part (remaining half) of the first light downward in the Y-axis direction.

Like the first projection optical system 2A described above, the second projection optical system 2B includes, for example, a second light emitter 11B, a second light isolator 12B and a second non-polarizing beam splitter 13B. The "second light emitter 11B" is configured as the "second irradiator" according to one or more embodiments of the invention.

Like the first light emitter 11A described above, the second light emitter 11B includes, for example, a laser light source configured to output a linearly polarized light of a specific wavelength $\lambda_2$, a beam expander configured to expand the linearly polarized light output from the laser light source and emit the expanded light as parallel light, a polarizer configured to adjust the intensity and a half wave plate configured to adjust the polarizing direction.

According to one or more embodiments of the invention, a linearly polarized light of the wavelength $\mu_2$ (for example, $\lambda_2$=1503 nm) having a polarizing direction that is a direction inclined at 45 degrees to the X-axis direction and the Z-axis direction is emitted upward in the Y-axis direction from the second light emitter 11B. The "wavelength $\lambda_2$" corresponds to the "second wavelength" according to one or more embodiments of the invention. Hereinafter the light of the wavelength $\lambda_2$ emitted from the second light emitter 11B is called "second light".

Like the first light isolator 12A, the second light isolator 12B is an optical element configured to transmit only a light traveling in one direction (upward in the Y-axis direction according to one or more embodiments of the invention) but block a light traveling in a reverse direction (downward in the Y-axis direction according to one or more embodiments of the invention). This configuration allows for transmission of only the second light emitted from the second light emitter 11B and thereby prevents damage and destabilization of the second light emitter 11B by return light.

Like the first non-polarizing beam splitter 13A, the second non-polarizing beam splitter 13B is a cube-shaped known optical member configured by joining right angle prisms together to be integrated, and its joint surface 13Bh is coated with, for example, a metal film. The "second non-polarizing beam splitter 13B" is configured as the "second light guiding unit" or "second light guide" according to one or more embodiments of the invention.

The second non-polarizing beam splitter 13B is arranged such that one of two surfaces adjoining to each other across the joint surface 13Bh is perpendicular to the Y-axis direction and the other of the two surfaces is perpendicular to the Z-axis direction. In other words, the joint surface 13Bh of the second non-polarizing beam splitter 13B is arranged to be inclined at 45 degrees to the Y-axis direction and the Z-axis direction. For example, the second non-polarizing beam splitter 13B is arranged to transmit part (half) of the second light that enters upward in the Y-axis direction from the second light emitter 11B via the second light isolator 12B, upward in the Y-axis direction and reflect the remaining part (remaining half) of the second light rightward in the Z-axis direction.

The following describes the configuration of the interference optical system 3 in detail. The interference optical system 3 includes, for example, a polarizing beam splitter (PBS) 20, quarter wave plates 21 and 22, a reference surface 23, and a placement structure 24.

The polarizing beam splitter 20 is a cube-shaped known optical member configured by joining right angle prisms together to be integrated, and its joint surface (boundary surface) 20h is coated with, for example, a dielectric multilayer film.

The polarizing beam splitter 20 is configured to split a linearly polarized incident light into two polarized light components (P-polarized light component and S-polarized light component) having polarizing directions perpendicular to each other. According to one or more embodiments of the invention, the polarizing beam splitter 20 is configured to transmit the P-polarized light component and reflect the S-polarized light component. According to one or more embodiments of the invention, the polarizing beam splitter 20 is configured as the "splitting unit" or "splitter" to split a predetermined incident light into two lights and is also configured as the "combining unit" to recombine the two lights.

The polarizing beam splitter 20 is arranged such that one of two surfaces adjoining to each other across the joint surface 20h is perpendicular to the Y-axis direction and the other of the two surfaces is perpendicular to the Z-axis direction. In other words, the joint surface 20h of the polarizing beam splitter 20 is arranged to be inclined at 45 degrees to the Y-axis direction and the Z-axis direction.

For example, a first surface (upper side face in the Y-axis direction) 20a of the polarizing beam splitter 20, which the first light reflected downward in the Y-axis direction from the first non-polarizing beam splitter 13A enters, and a third surface (lower side face in the Y-axis direction) 20c opposed to the first surface 20a are arranged to be perpendicular to the Y-axis direction. The "first surface 20a of the polarizing beam splitter 20" corresponds to the "first input-output element" according to one or more embodiments of the invention.

A second surface (left side face in the Z-axis direction) 20b of the polarizing beam splitter 20, which is a surface adjoining to the first surface 20a across the joint surface 20h and which the second light reflected rightward in the Z-axis direction from the second non-polarizing beam splitter 13B enters, and a fourth surface (right side face in the Z-axis direction) 20d opposed to the second surface 20b are arranged to be perpendicular to the Z-axis direction. The "second surface 20b of the polarizing beam splitter 20" corresponds to the "second input-output element" according to one or more embodiments of the invention.

The quarter wave plate 21 is arranged to be opposed in the Y-axis direction to the third surface 20c of the polarizing beam splitter 20, and the reference surface 23 is arranged to be opposed in the Y-axis direction to the quarter wave plate 21.

The quarter wave plate 21 corresponds to the "first quarter wave plate" according to one or more embodiments of the invention and serves to convert a linearly polarized light into a circularly polarized light and to convert a circularly polarized light into a linearly polarized light. Accordingly, the linearly polarized light (reference light) emitted from the third surface 20c of the polarizing beam splitter 20 is converted into the circularly polarized light by the quarter wave plate 21 and is radiated to the reference surface 23. The reference light reflected by the reference surface 23 is reconverted from the circularly polarized light into the linearly polarized light by the quarter wave plate 21 and enters the third surface 20c of the polarizing beam splitter 20.

The quarter wave plate 22 is arranged, on the other hand, to be opposed in the Z-axis direction to the fourth surface 20d of the polarizing beam splitter 20, and the placement structure 24 is arranged to be opposed in the Z-axis direction to the quarter wave plate 22.

The quarter wave plate 22 corresponds to the "second quarter wave plate" according to one or more embodiments of the invention and serves to convert a linearly polarized light into a circularly polarized light and to convert a circularly polarized light into a linearly polarized light. Accordingly, the linearly polarized light (measurement light) emitted from the fourth surface 20d of the polarizing beam splitter 20 is converted into the circularly polarized light by the quarter wave plate 22 and is radiated to a work W as a measurement object placed on the placement structure 24. The measurement light reflected by the work W is reconverted from the circularly polarized light into the linearly polarized light by the quarter wave plate 22 and enters the fourth surface 20d of the polarizing beam splitter 20.

The following describes the configuration of the two imaging systems 4A and 4B (first imaging system 4A and second imaging system 4B) in detail. The first imaging system 4A includes, for example, a quarter wave plate 31A, a first polarizer 32A and a first camera 33A configured as the first imaging unit.

The quarter wave plate 31A is configured to respectively convert the linearly polarized lights (reference light component and measurement light component of the first light) transmitted leftward in the Z-axis direction through the second non-polarizing beam splitter 13B, into circularly polarized lights.

The first polarizer 32A is configured to selectively transmit the respective components of the first light converted into the circularly polarized lights by the quarter wave plate 31A. This configuration causes interference of the reference light component and the measurement light component of the first light having different rotating directions, with regard to a specific phase. The "first polarizer 32A" is configured as the "first phase shift unit" and the "interfering unit" according to one or more embodiments of the invention.

The first polarizer 32A according to one or more embodiments of the invention is configured to be rotatable about the Z-axis direction as the axial center and is controlled to change its transmission axis direction by 45 degrees each. For example, the transmission axis direction is changed to "0 degree", "45 degrees", "90 degrees" and "135 degrees" relative to the Y-axis direction.

This configuration causes interference of the reference light component and the measurement light component of the first light transmitted through the first polarizer 32A in four different phases. This accordingly generates interfering lights having phases that are different from one another by 90 degrees. For example, this generates an interfering light having a phase of "0 degree", an interfering light having a phase of "90 degrees", an interfering light having a phase of "180 degrees" and an interfering light having a phase of "270 degrees".

The first camera 33A has a known configuration including a lens, an imaging element and the like. According to one or more embodiments of the invention, a CCD area sensor is employed as the imaging element of the first camera 33A. The imaging element is, however, not limited to the embodiments described above. For example, a CMOS area sensor may be employed as the imaging element.

Image data taken by the first camera 33A are converted into digital signals inside of the first camera 33A and are input in the form of digital signals into the control device 5 (image data storage device 54).

For example, an interference fringe image having the phase of "0 degree", an interference fringe image having the phase of "90 degrees", an interference fringe image having the phase of "180 degrees" and an interference fringe image having the phase of "270 degrees" with regard to the first light are taken by the first camera 33A.

Like the first imaging system 4A, the second imaging system 4B includes, for example, a quarter wave plate 31B, a second polarizer 32B and a second camera 33B configured as the second imaging unit.

The quarter wave plate 31B is configured to respectively convert the linearly polarized lights (reference light component and measurement light component of the second light) transmitted upward in the Y-axis direction through the first non-polarizing beam splitter 13A, into circularly polarized lights.

Like the first polarizer 32A, the second polarizer 32B is configured to selectively transmit the respective components of the second light converted into the circularly polarized lights by the quarter wave plate 31B. This configuration causes interference of the reference light component and the measurement light component of the second light having different rotating directions, with regard to a specific phase. The "second polarizer 32B" is configured as the "second phase shift unit" and the "interfering unit" according to one or more embodiments of the invention.

The second polarizer 32B according to one or more embodiments of the invention is configured to be rotatable about the Y-axis direction as the axial center and is controlled to change its transmission axis direction by 45 degrees each. For example, the transmission axis direction is changed to "0 degree", "45 degrees", "90 degrees" and "135 degrees" relative to the X-axis direction.

This configuration causes interference of the reference light component and the measurement light component of the second light transmitted through the second polarizer 32B in four different phases. This accordingly generates interfering lights having phases that are different from one another by 90 degrees. For example, this generates an interfering light having a phase of "0 degree", an interfering light having a phase of "90 degrees", an interfering light having a phase of "180 degrees" and an interfering light having a phase of "270 degrees".

Like the first camera 33A, the second camera 33B has a known configuration including a lens, an imaging element and the like. According to one or more embodiments of the invention, like the first camera 33A, a CCD area sensor is employed as the imaging element of the second camera 33B. The imaging element is, however, not limited to the embodiments described above. For example, a CMOS area sensor may be employed as the imaging element.

Like the first camera 33A, image data taken by the second camera 33B are converted into digital signals inside of the second camera 33B and are input in the form of digital signals into the control device 5 (image data storage device 54).

For example, an interference fringe image having the phase of "0 degree", an interference fringe image having the phase of "90 degrees", an interference fringe image having the phase of "180 degrees" and an interference fringe image having the phase of "270 degrees" with regard to the second light are taken by the second camera 33B.

The following describes the electrical configuration of the control device 5. As shown in FIG. 2, the control device 5 includes CPU and input/output interfaces 51 configured to control the entire three-dimensional measurement device 1, an input device 52 configured by a keyboard and a mouse or by a touch panel as the "input unit", a display device 53 configured as the "display unit" including a display screen such as a liquid crystal screen, an image data storage device 54 configured to successively store the image data taken by the cameras 33A and 33B and the like, a calculation result storage device 55 configured to store results of various calculations, and a set data storage device 56 configured to store various information in advance. These devices 52 to 56 are electrically connected with the CPU and input/output interfaces 51.

The following describes the functions of the three-dimensional measurement device 1. Radiation of the first light and radiation of the second light are performed simultaneously according to one or more embodiments as described later. The optical path of the first light and the optical path of the second light partly overlap each other. For the better understanding, the optical path of the first light and the optical path of the second light are illustrated in different drawings and are described individually.

Figure 3:
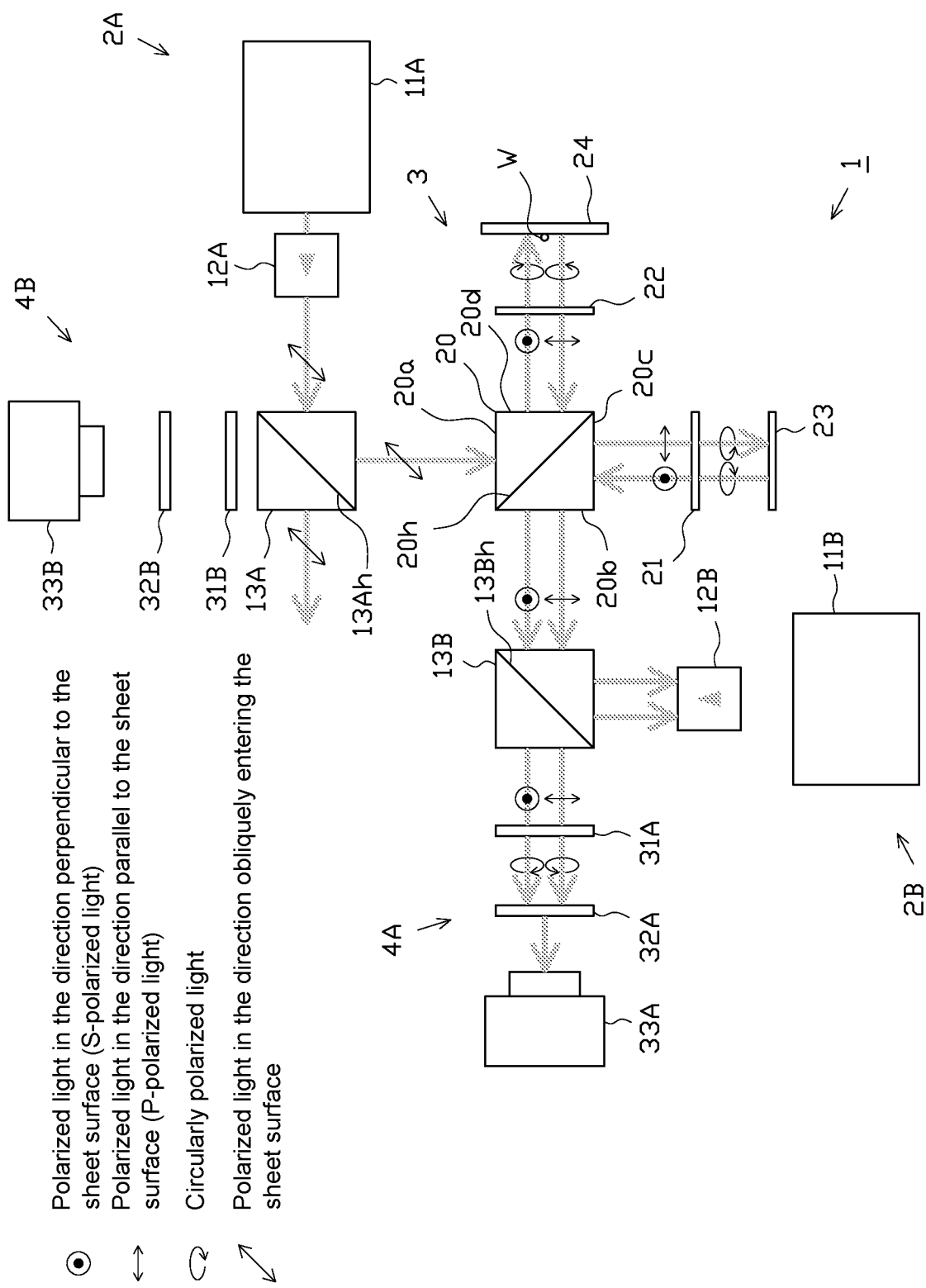
FIG. 3 is an optical path diagram illustrating an optical path of a first light according to one or more embodiments of the invention.

The optical path of the first light is described first with reference to FIG. 3. As shown in FIG. 3, the first light of the wavelength $\lambda_1$ (linearly polarized light having the polarizing direction that is inclined at 45 degrees to the X-axis direction and the Y-axis direction) is emitted leftward in the Z-axis direction from the first light emitter 11A.

The first light emitted from the first light emitter 11A passes through the first light isolator 12A and enters the first non-polarizing beam splitter 13A. Part of the first light entering the first non-polarizing beam splitter 13A is transmitted leftward in the Z-axis direction, while the remaining part is reflected downward in the Y-axis direction.

The first light reflected downward in the Y-axis direction (linearly polarized light having the polarizing direction that is inclined at 45 degrees to the X-axis direction and the Z-axis direction) enters the first surface 20a of the polarizing beam splitter 20. The first light transmitted leftward in the Z-axis direction, on the other hand, does not enter any optical system or the like but is left as waste light.

This waste light may be used for measurement of the wavelength or for measurement of the light power as appropriate. This stabilizes the light source and thereby improves the measurement accuracy (the same applies hereinafter).

With regard to the first light entering the first surface 20a of the polarizing beam splitter 20 downward in the Y-axis direction, its P-polarized light component is transmitted downward in the Y-axis direction and is emitted from the third surface 20c as the reference light, while its S-polarized light component is reflected rightward in the Z-axis direction and is emitted from the fourth surface 20d as the measurement light.

The reference light (P-polarized light) of the first light emitted from the third surface 20c of the polarizing beam splitter 20 passes through the quarter wave plate 21 to be converted into clockwise circularly polarized light and is then reflected by the reference surface 23. In this process, the rotating direction relative to the traveling direction of light is maintained. The reference light of the first light then passes through the quarter wave plate 21 again to be converted from the clockwise circularly polarized light into S-polarized light and reenters the third surface 20c of the polarizing beam splitter 20.

The measurement light (S-polarized light) of the first light emitted from the fourth surface 20d of the polarizing beam splitter 20 passes through the quarter wave plate 22 to be converted into counterclockwise circularly polarized light and is then reflected by the work W. In this process, the rotating direction relative to the traveling direction of light is maintained. The measurement light of the first light then passes through the quarter wave plate 22 again to be converted from the counterclockwise circularly polarized light into P-polarized light and then reenters the fourth surface 20d of the polarizing beam splitter 20.

The reference light (S-polarized light) of the first light reentering the third surface 20c of the polarizing beam splitter 20 is reflected leftward in the Z-axis direction by the joint surface 20h, while the measurement light (P-polarized light) of the first light reentering the fourth surface 20d is transmitted leftward in the Z-axis direction through the joint surface 20h. The combined light generated by recombining the reference light and the measurement light of the first light with each other is then emitted as the output light from the second surface 20b of the polarizing beam splitter 20.

The combined light (reference light and measurement light) of the first light emitted from the second surface 20b of the polarizing beam splitter 20 enters the second non-polarizing beam splitter 13B. Part of the combined light of the first light entering the second non-polarizing beam splitter 13B leftward in the Z-axis direction is transmitted leftward in the Z-axis direction, while the remaining part is reflected downward in the Y-axis direction. The combined light (reference light and measurement light) transmitted leftward in the Z-axis direction enters the first imaging system 4A. The combined light reflected downward in the Y-axis direction is, on the other hand, blocked by the second light isolator 12B to be left as waste light.

With regard to the combined light (reference light and measurement light) of the first light entering the first imaging system 4A, the quarter wave plate 31A converts the reference light component (S-polarized light component) into counterclockwise circularly polarized light, while converting the measurement light component (P-polarized light component) into clockwise circularly polarized light. The counterclockwise circularly polarized light and the clockwise circularly polarized light have different rotating directions and accordingly do not interfere with each other.

The combined light of the first light subsequently passes through the first polarizer 32A, so that the reference light component and the measurement light component interfere with each other in a phase corresponding to the angle of the first polarizer 32A. The image of the interfering light of the first light is then taken by the first camera 33A.

Figure 4:
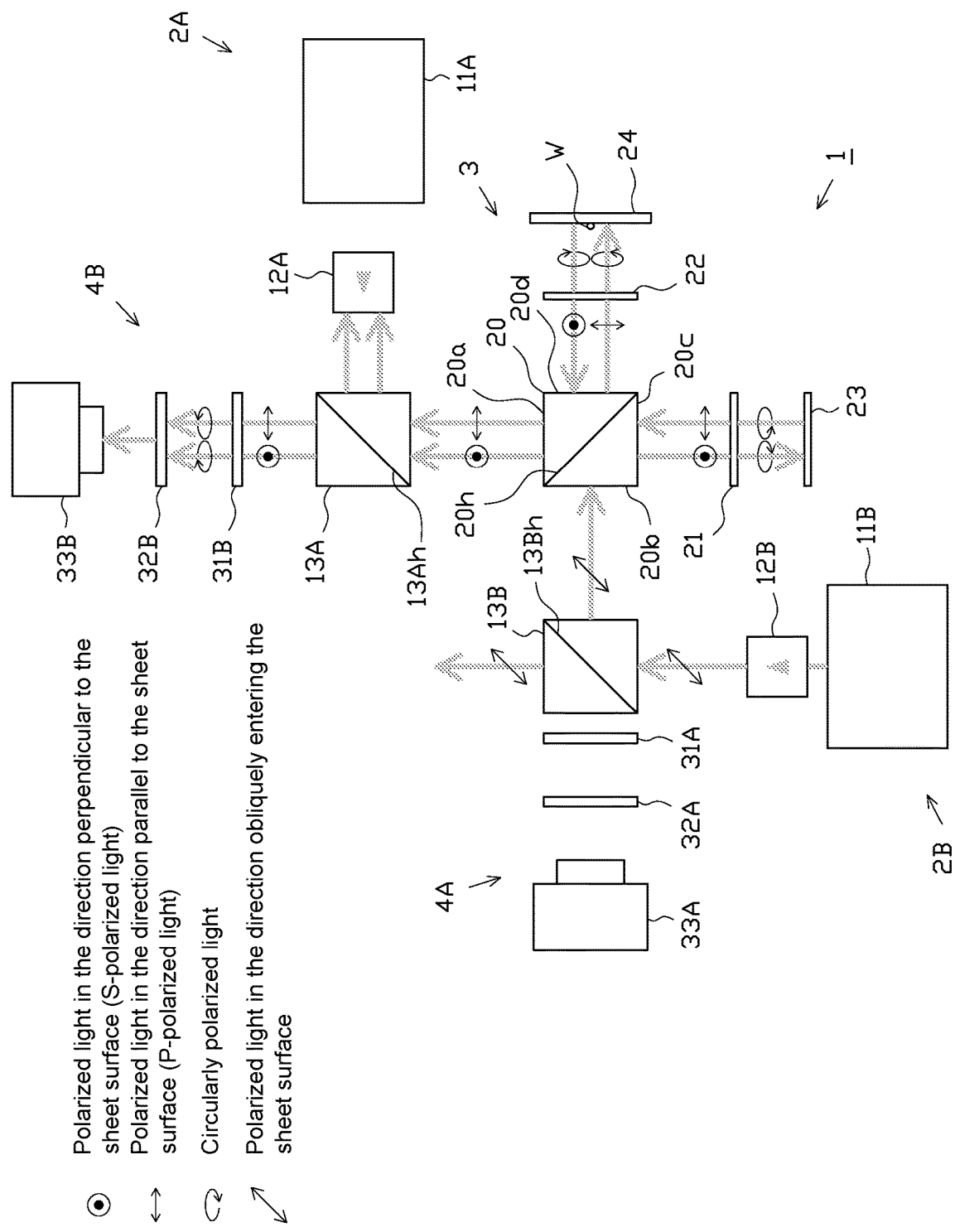
FIG. 4 is an optical path diagram illustrating an optical path of a second light according to one or more embodiments of the invention.

The optical path of the second light is then described with reference to FIG. 4. As shown in FIG. 4, the second light of the wavelength $\lambda_2$ (linearly polarized light having the polarizing direction that is inclined at 45 degrees to the X-axis direction and the Z-axis direction) is emitted upward in the Y-axis direction from the second light emitter 11B.

The second light emitted from the second light emitter 11B passes through the second light isolator 12B and enters the second non-polarizing beam splitter 13B. Part of the second light entering the second non-polarizing beam splitter 13B is transmitted upward in the Y-axis direction, while the remaining part is reflected rightward in the Z-axis direction.

The second light reflected rightward in the Z-axis direction (linearly polarized light having the polarizing direction that is inclined at 45 degrees relative to the X-axis direction and the Y-axis direction) enters the second surface 20b of the polarizing beam splitter 20. The second light transmitted upward in the Y-axis direction, on the other hand, does not enter any optical system or the like but is left as waste light.

With regard to the second light entering the second surface 20b of the polarizing beam splitter 20 rightward in the Z-axis direction, its S-polarized light component is reflected downward in the Y-axis direction and is emitted from the third surface 20c as the reference light, while its P-polarized light component is transmitted rightward in the Z-axis direction and is emitted from the fourth surface 20d as the measurement light.

The reference light (S-polarized light) of the second light emitted from the third surface 20c of the polarizing beam splitter 20 passes through the quarter wave plate 21 to be converted into counterclockwise circularly polarized light and is then reflected by the reference surface 23. In this process, the rotating direction relative to the traveling direction of light is maintained. The reference light of the second light then passes through the quarter wave plate 21 again to be converted from the counterclockwise circularly polarized light into P-polarized light and reenters the third surface 20c of the polarizing beam splitter 20.

The measurement light (P-polarized light) of the second light emitted from the fourth surface 20d of the polarizing beam splitter 20 passes through the quarter wave plate 22 to be converted into clockwise circularly polarized light and is then reflected by the work W. In this process, the rotating direction relative to the traveling direction of light is maintained. The measurement light of the second light then passes through the quarter wave plate 22 again to be converted from the clockwise circularly polarized light into S-polarized light and then reenters the fourth surface 20d of the polarizing beam splitter 20.

The reference light (P-polarized light) of the second light reentering the third surface 20c of the polarizing beam splitter 20 is transmitted upward in the Y-axis direction through the joint surface 20h, while the measurement light (S-polarized light) of the second light reentering the fourth surface 20d is reflected upward in the Y-axis direction by the joint surface 20h. The combined light generated by recombining the reference light and the measurement light of the second light with each other is then emitted as the output light from the first surface 20a of the polarizing beam splitter 20.

The combined light (reference light and measurement light) of the second light emitted from the first surface 20a of the polarizing beam splitter 20 enters the first non-polarizing beam splitter 13A. Part of the combined light of the second light entering the first non-polarizing beam splitter 13A upward in the Y-axis direction is transmitted upward in the Y-axis direction, while the remaining part is reflected rightward in the Z-axis direction. The combined light (reference light and measurement light) transmitted upward in the Y-axis direction enters the second imaging system 4B. The combined light reflected rightward in the Z-axis direction is, on the other hand, blocked by the first light isolator 12A to be left as waste light.

With regard to the combined light (reference light and measurement light) of the second light entering the second imaging system 4B, the quarter wave plate 31B converts the reference light component (P-polarized light component) into clockwise circularly polarized light, while converting the measurement light component (S-polarized light component) into counterclockwise circularly polarized light. The counterclockwise circularly polarized light and the clockwise circularly polarized light have different rotating directions and accordingly do not interfere with each other.

The combined light of the second light subsequently passes through the second polarizer 32B, so that the reference light component and the measurement light component interfere with each other in a phase corresponding to the angle of the second polarizer 32B. The image of the interfering light of the second light is then taken by the second camera 33B.

The following describes a procedure of shape measurement process performed by the control device 5 in detail. After placing the work W on the placement structure 24, the control device 5 sets the transmission axis direction of the first polarizer 32A of the first imaging system 4A at a predetermined reference position (for example, "0 degree"), while setting the transmission axis direction of the second polarizer 32B of the second imaging system 4B at a predetermined reference position (for example, "0 degree").

The control device 5 subsequently radiates the first light from the first projection optical system 2A and simultaneously radiates the second light from the second projection optical system 2B. As a result, the combined light (reference light and measurement light) of the first light is emitted from the second surface 20b of the polarizing beam splitter 20 of the interference optical system 3, and simultaneously the combined light (reference light and measurement light) of the second light is emitted from the first surface 20a of the polarizing beam splitter 20.

The image of the combined light of the first light emitted from the second surface 20b of the polarizing beam splitter 20 is taken by the first imaging system 4A, and simultaneously the image of the combined light of the second light emitted from the first surface 20a of the polarizing beam splitter 20 is taken by the second imaging system 4B.

The transmission axis direction of the first polarizer 32A and the transmission axis direction of the second polarizer 32B are both set to "0 degree", so that an interference fringe image of the first light in a phase of "0 degree" is taken by the first camera 33A, and an interference fringe image of the second light in a phase of "0 degree" is taken by the second camera 33B.

Image data taken by the respective cameras 33A and 33B are then output to the control device 5. The control device 5 stores the input image data into the image data storage device 54.

The control device 5 subsequently performs a switching process of the first polarizer 32A of the first imaging system 4A and the second polarizer 32B of the second imaging system 4B. For example, the first polarizer 32A and the second polarizer 32B are respectively rotated and shifted to a position having the transmission axis direction set at "45 degrees".

On completion of the switching process, the control device 5 performs a second imaging process in a similar manner to the series of first imaging process described above. For example, the control device 5 radiates the first light from the first projection optical system 2A and simultaneously radiates the second light from the second projection optical system 2B. The control device 5 subsequently causes the image of the combined light of the first light emitted from the second surface 20b of the polarizing beam splitter 20 to be taken by the first imaging system 4A and simultaneously causes the image of the combined light of the second light emitted from the first surface 20a of the polarizing beam splitter 20 to be taken by the second imaging system 4B. The control device 5 accordingly obtains an interference fringe image of the first light in a phase of "90 degree" and an interference fringe image of the second light in a phase of "90 degree".

After that, two more imaging processes similar to the first imaging process and the second imaging process described above are performed. For example, a third imaging process is performed with setting the transmission axis directions of the first polarizer 32A and the second polarizer 32B at "90 degrees", so as to obtain an interference fringe image of the first light in a phase of "180 degree" and an interference fringe image of the second light in a phase of "180 degree".

A fourth imaging process is then performed with setting the transmission axis directions of the first polarizer 32A and the second polarizer 32B at "135 degrees", so as to obtain an interference fringe image of the first light in a phase of "270 degree" and an interference fringe image of the second light in a phase of "270 degree".

All the image data required for three-dimensional measurement (total of eight different interference fringe image data including four different interference fringe image data with regard to the first light and four different interference fringe image data with regard to the second light) are obtained by performing the four imaging processes as described above.

The control device 5 subsequently measures the surface shape of the work W by a phase shift method, based on the four different interference fringe image data with regard to the first light and the four different interference fringe image data with regard to the second light stored in the image data storage device 54. For example, the control device 5 calculates height information at respective positions on the surface of the work W.

The principle of height measurement by a standard phase shift method is described first. Interference fringe intensities of the four different interference fringe image data of the first light or the second light at an identical coordinate position (x,y), i.e., luminances $I_1(x,y)$, $I_2(x,y)$, $I_3(x,y)$ and $I_4(x,y)$, are expressed by relational expressions of [Math. 1] given below:

$I_1(x,y)=B(x,y)+A(x,y)\cos[\Delta\phi(x,y)]$ $I_2(x,y)=B(x,y)+A(x,y)\cos[\Delta\phi(x,y)+90°]$ $I_3(x,y)=B(x,y)+A(x,y)\cos[\Delta\phi(x,y)+180°]$ $I_4(x,y)=B(x,y)+A(x,y)\cos[\Delta\phi(x,y)+270°]$ [Math. 1]

Herein $\Delta\varphi(x,y)$ denotes a phase difference based on the optical path difference between the measurement light and the reference light at the coordinates (x,y). A(x,y) denotes an amplitude of the interfering light, and B(x,y) denotes a bias. The reference light is, however, uniform. From this point of view, $\Delta\varphi(x,y)$ denotes a "phase of the measurement light", and A(x,y) denotes an "amplitude of the measurement light".

Accordingly the phase $\Delta\varphi(x,y)$ of the measurement light is determined by a relational expression of [Math. 2] given below, based on the relational expressions of [Math. 1] given above:

$$\Delta\phi(x,y) = \arctan\frac{I_4(x,y) - I_2(x,y)}{I_1(x,y) - I_3(x,y)}$$ [Math. 2]

The amplitude A(x,y) of the measurement light is determined by a relational expression of [Math. 3] given below, based on the relational expressions of [Math. 1] given above:

$A(x,y)=½ \times \sqrt{\{I_1(x,y)-I_3(x,y)\}^2+\{I_4(x,y)-(x,y)\}^2}$ [Math. 3]

A complex amplitude Eo(x,y) on an imaging element surface is then calculated from the above phase $\Delta\varphi(x,y)$ and amplitude A(x,y) according to a relational expression of [Math. 4] given below, where i denotes an imaginary unit.

$E_0(x,y)=A(x,y)e^{i\phi(x,y)}$ [Math. 4]

A complex amplitude Eo($\xi,\eta$) at coordinates ($\xi,\eta$) on a surface of the work W is subsequently calculated, based on the complex amplitude Eo(x,y).

The above complex amplitude Eo(x,y) is subjected to Fresnel transform as shown by [Math. 5] given below, where $\lambda$ denotes a wavelength:

$$E_0(x, y) =$$ [Math. 5]

$$\frac{i}{\lambda}\int_{-\infty}^{\infty}\int_{-\infty}^{\infty} E_0(\xi, \eta) \frac{\exp\left(-i\frac{2\pi}{\lambda}\sqrt{d^2 + (\xi - x)^2 + (\eta - y)^2}\right)}{\sqrt{d^2 + (\xi - x)^2 + (\eta - y)^2}}$$

$$d\xi d\eta = \mathcal{F}^{-1}\{\mathcal{F}(E_0(\xi, \eta)) \cdot \mathcal{F}(g(\xi, \eta, x, y))\}$$

$$g(\xi, \eta, x, y) = \frac{i}{\lambda}\frac{\exp\left(-i\frac{2\pi}{\lambda}\sqrt{d^2 + (\xi - x)^2 + (\eta - y)^2}\right)}{\sqrt{d^2 + (\xi - x)^2 + (\eta - y)^2}}$$

$\mathcal{F}$: Fourier Transform $\mathcal{F}^{-1}$: Inverse Fourier Transform

[Math. 6] given below is obtained by solving this expression with respect to Eo($\xi,\eta$):

$$E_0(\xi, \eta) = \mathcal{F}^{-1}\left\{\frac{\mathcal{F}(E_0(x, y))}{\mathcal{F}(g(\xi, \eta, x, y))}\right\}$$ [Math. 6]

A phase $\varphi(\xi,\eta)$ of the measurement light and an amplitude A($\xi,\eta$) of the measurement light are then calculated from the obtained complex amplitude Eo($\xi,\eta$) according to a relational expression of [Math. 7] given below:

$E_0(\xi,\eta)=A(\xi,\eta)e^{i\phi(\xi,\eta)}$ [Math. 7]

The phase $\varphi(\xi,\eta)$ of the measurement light is determined according to a relational expression of [Math. 8] given below:

$$\phi(\xi, \eta) = \arctan\frac{\text{Im}[E_0(\xi, \eta)]}{\text{Re}[E_0(\xi, \eta)]}$$ [Math. 8]

The amplitude A($\xi,\eta$) of the measurement light is determined according to a relational expression of [Math. 9] given below]

$A(\xi,\eta)=\sqrt{(\text{Re}[E_0(\xi,\eta)])^2+(\text{Im}[E_0(\xi,\eta)])^2}$ [Math. 9]

Height information z($\xi,\eta$) representing a concavo-convex shape on the surface of the work W three-dimensionally is then calculated by a phase-height conversion process.

The height information z($\xi,\eta$) is calculated according to a relational expression of [Math. 10] given below:

$$Z(\xi, \eta) = \frac{1}{2}\phi(\xi, \eta)\frac{\lambda}{2\pi}$$ [Math. 10]

The principle of a two-wavelength phase shift method is subsequently described. The measurement range is expanded by using two different lights having different wavelengths.

Measurement using two different lights having two different wavelengths (wavelengths $\lambda_1$ and $\lambda_2$) is equivalent to measurement using a light of a combined wavelength $\lambda_0$, and the measurement range is expanded to $\lambda_0/2$. The combined wavelength $\lambda_0$ is expressed by Equation (M1) given below:

$$\lambda_0 = (\lambda_1 \times \lambda_2)/(\lambda_2 - \lambda_1) \tag{M1}$$

where $\lambda_2 > \lambda_1$.

For example, when $\lambda_1 = 1500$ nm and $\lambda_2 = 1503$ nm, $\lambda_0 = 751.500$ μm according to Equation (M1) given above, and the measurement range is $\lambda_0/2 = 375.750$ μm.

In the two-wavelength phase shift method, a phase $\varphi_1(\xi, \eta)$ of the measurement light of the first light at coordinates $(\xi, \eta)$ on the surface of the work W is calculated (as shown by [Math. 8] given above), based on the luminances $I_1(x,y)$, $I_2(x,y)$, $I_3(x,y)$ and $I_4(x,y)$ of the four different interference fringe image data of the first light having the wavelength $\lambda_1$ (as shown by [Math. 1] given above). The phase $\varphi_1(\xi, \eta)$ calculated here corresponds to the "first measurement value" according to one or more embodiments of the invention, and the "first measurement value acquirer" is configured by the processing function of calculating this phase.

In measurement with regard to the first light, height information $z(\xi, \eta)$ at coordinates $(\xi, \eta)$ is expressed by Equation (M2) given below:

$$z(\xi, \eta) = d_1(\xi, \eta)/2 \tag{M2}$$
$$= [\lambda_1 \times \varphi_1(\xi, \eta)/4\pi] + [m_1(\xi, \eta) \times \lambda_1/2]$$

where $d_1(\xi, \eta)$ denotes an optical path difference between the measurement light and the reference light of the first light, and $m_1(\xi, \eta)$ denotes a fringe order of the first light.

The phase $\varphi_1(\xi, \eta)$ is accordingly expressed by Equation (M2') given below:

$$\varphi_1(\xi, \eta) = (4\pi/\lambda_1) \times z(\xi, \eta) - 2\pi m_1(\xi, \eta) \tag{M2'}$$

Similarly a phase $\varphi_2(\xi, \eta)$ of the measurement light of the second light at coordinates $(\xi, \eta)$ on the surface of the work W is calculated (as shown by [Math. 8] given above), based on the luminances $I_1(x,y)$, $I_2(x,y)$, $I_3(x,y)$ and $I_4(x,y)$ of the four different interference fringe image data of the second light having the wavelength $\lambda_2$ (as shown by [Math. 1] given above). The phase $\varphi_2(\xi, \eta)$ calculated here corresponds to the "second measurement value" according to one or more embodiments of the invention, and the "second measurement value acquirer" is configured by the processing function of calculating this phase.

In measurement with regard to the second light, height information $z(\xi, \eta)$ at coordinates $(\xi, \eta)$ is expressed by Equation (M3) given below:

$$z(\xi, \eta) = d_2(\xi, \eta)/2 \tag{M3}$$
$$= [\lambda_2 \times \varphi_2(\xi, \eta)/4\pi] + [m_2(\xi, \eta) \times \lambda_2/2]$$

where $d_1(\xi, \eta)$ denotes an optical path difference between the measurement light and the reference light of the second light, and $m_2(\xi, \eta)$ denotes a fringe order of the second light.

The phase $\varphi_2(\xi, \eta)$ is accordingly expressed by Equation (M3') given below:

$$\varphi_2(\xi, \eta) = (4\pi/\lambda_2) \times z(\xi, \eta) - 2\pi m_2(\xi, \eta) \tag{M3'}$$

Subsequently the fringe order $m_1(\xi, \eta)$ of the first light having the wavelength $\lambda_1$ or the fringe order $m_2(\xi, \eta)$ of the second light having the wavelength $\lambda_2$ is determined. The fringe orders $m_1$ and $m_2$ may be determined, based on an optical path difference $\Delta d$ and a wavelength difference $\Delta \lambda$ of the two different lights (having the wavelengths $\lambda_1$ and $\lambda_2$). The optical path difference $\Delta d$ and the wavelength difference $\Delta \lambda$ are respectively expressed by Equations (M4) and (M5) given below:

$$\Delta d = (\lambda_1 \times \varphi_1 - \lambda_2 \times \varphi_2)/2\pi \tag{M4}$$

$$\Delta \lambda = \lambda_2 - \lambda_1 \tag{M5}$$

where $\lambda_2 > \lambda_1$.

In the measurement range of the combined wavelength $\lambda_0$ of the two wavelengths, the relationship between the fringe orders $m_1$ and $m_2$ is classified into the following three cases. Different computation expressions are employed to determine the fringe orders $m_1(\xi, \eta)$ and $m_2(\xi, \eta)$ in the respective cases. The following describes a technique of determining the fringe order $m_1(\xi, \eta)$. A similar technique may be employed to determine the fringe order $m_2(\xi, \eta)$.

For example, in the case of "$\varphi_1 - \varphi_2 < -\pi$", "$m_1 - m_2 = -1$". In this case, $m_1$ is expressed by Equation (M6) given below:

$$m_1 = (\Delta d/\Delta \lambda) - (\lambda_2/\Delta \lambda) \tag{M6}$$
$$= (\lambda_1 \times \varphi_1 - \lambda_2 \times \varphi_2)/2\pi(\lambda_2 - \lambda_1) - \lambda_2/(\lambda_2 - \lambda_1)$$

In the case of "$-\pi < \varphi_1 - \varphi_2 < \pi$", "$m_1 - m_2 = 0$". In this case, $m_1$ is expressed by Equation (M7) given below:

$$m_1 = \Delta d/\Delta \lambda \tag{M7}$$
$$= (\lambda_1 \times \varphi_1 - \lambda_2 \times \varphi_2)/2\pi(\lambda_2 - \lambda_1)$$

In the case of "$\varphi_1 - \varphi_2 > \pi$", "$m_1 - m_2 = +1$". In this case, $m_1$ is expressed by Equation (M8) given below:

$$m_1 = (\Delta d/\Delta \lambda) + (\lambda_2/\Delta \lambda) \tag{M8}$$
$$= (\lambda_1 \times \varphi_1 - \lambda_2 \times \varphi_2)/2\pi(\lambda_2 - \lambda_1) + \lambda_2/(\lambda_2 - \lambda_1)$$

The height information $z(\xi, \eta)$ is obtained according to Equation (M2) or (M3) given above, based on the fringe order $m_1(\xi, \eta)$ or $m_2(\xi, \eta)$ thus obtained. The "height information acquirer" is configured by this processing function. The measurement results (height information) of the work W thus determined are stored in the calculation result storage device 55 of the control device 5.

As described above in detail, one or more embodiments of the invention cause the first light having the wavelength $\lambda_1$ to enter the first surface 20a of the polarizing beam splitter 20 and cause the second light having the wavelength $\lambda_2$ to enter the second surface 20b of the polarizing beam splitter 20. This respectively splits the reference light and the measurement light of the first light and the reference light and the measurement light of the second light into different polarized light components (P-polarized light and S-polarized light). The first light and the second light entering the polarizing beam splitter 20 accordingly do not interfere with each other but are separately emitted from the polarizing beam splitter 20. In other words, there is no need to separate the light emitted from the polarizing beam splitter 20 into the first light and the second light by means of a predetermined separator.

As a result, two different lights having near wavelengths may be used as the first light and the second light. This further expands the measurement range in three-dimensional measurement. Additionally, this configuration enables imaging of the output light with regard to the first light to be performed simultaneously with imaging of the output light with regard to the second light. This accordingly shortens the total imaging time and enhances the measurement efficiency.

Moreover, one or more embodiments of the invention use two different lights for one interference optical system 3 including one reference surface 23 as the standard, so that the two different lights have an identical optical path interval which provides the optical path difference between the reference light and the measurement light. Compared with a configuration using two interference optical systems (interferometer modules), this configuration enhances the measurement accuracy and does not require a difficult task to make the optical path lengths of the two interference optical systems exactly equal to each other.

The following describes one or more embodiments of the invention with reference to the drawings. The like components to those of the aforementioned embodiments are expressed by the like reference signs, and their detailed description is omitted. The following embodiments differ from the aforementioned embodiments by the configuration involved in the first imaging system 4A and the second imaging system 4B.

According to one or more embodiments of the invention, the first imaging system 4A includes a spectral optical system 125 as the spectroscopic unit or spectroscope configured to split the combined light (reference light component and measurement light component) of the first light transmitted through the quarter wave plate 31A into four lights, and a filter unit 126 as the filtering unit configured to allow for selective transmission of predetermined components of the four lights emitted from the spectral optical system 125, in place of the first polarizer 32A. The first imaging system 4A is configured to take images of the four lights transmitted through the filter unit 126 simultaneously by the first camera 33A.

Like the first imaging system 4A, the second imaging system 4B includes a spectral optical system 125 as the spectroscopic unit configured to split the combined light (reference light component and measurement light component) of the second light transmitted through the quarter wave plate 31B into four lights, and a filter unit 126 as the filtering unit configured to allow for selective transmission of predetermined components of the four lights emitted from the spectral optical system 125, in place of the second polarizer 32B. The second imaging system 4B is configured to take images of the four lights transmitted through the filter unit 126 simultaneously by the second camera 33B.

The spectral optical system 125 and the filter unit 126 used in the first imaging system 4A and those used in the second imaging system 4B according to one or more embodiments of the invention have identical configurations. The following accordingly describes the first imaging system 4A as an example with reference to FIG. 5.

According to one or more embodiments of the invention, the optical axis direction of the first camera 33A is set parallel to the incident direction (traveling direction) of a combined light L0 of the first light entering the first imaging system 4A. In other words, according to one or more embodiments of the invention, the optical axis direction of the first camera 33A is set along the Z-axis direction that is the incident direction of the combined light L0 of the first light.

The spectral optical system 125 is configured as one optical member integrated by combining four non-polarizing-type optical members (prisms). For example, the spectral optical system 125 is configured by arranging a first prism 131, a second prism 132, a third prism 133 and a fourth prism 134 sequentially from the side near to the interference optical system 3 along the traveling direction of the combined light L0 (Z-axis direction).

Each of the above prisms 131 to 134 is made of an optical material (for example, glass or acrylic resin) having a predetermined refractive index higher than the refractive index of the air. The optical path length of light that travels in each of the prisms 131 to 134 is thus optically longer than the optical path length of light that ravels in the air. For example, all the four prisms 131 to 134 may be made of an identical material, or at least one of the prisms 131 to 134 may be made of a different material. The material of each of the prisms 131 to 134 may be selected arbitrarily as long as the material satisfies the functions of the spectral optical system 125 described later.

The first prism 131 is a quadrangular prism that has a parallelogram shape in the front view (Z-Y plane) and that is extended along the X-axis direction. Hereinafter the "first prism 131" is called "first rhombic prism 131".

The first rhombic prism 131 is arranged such that, out of its rectangular four surfaces along the X-axis direction, a surface 131*a* located on the right side in the Z-axis direction that is the interference optical system 3-side (hereinafter called "incident surface 131*a*) and a surface 131*b* located on the left side in the Z-axis direction (hereinafter called "emission surface 131*b*") are respectively orthogonal to the Z-axis direction and such that a surface 131*c* located on the lower side in the Y-axis direction and a surface 131*d* located on the upper side in the Y-axis direction are respectively inclined at 45 degrees to both the Z-axis direction and the Y-axis direction.

Out of the two inclined surfaces 131*c* and 131*d*, a non-polarizing half mirror 141 is provided on the surface 131*c* located on the lower side in the Y-axis direction, and a non-polarizing total reflection mirror 142 is provided on the surface 131*d* located on the upper side in the Y-axis direction. Hereinafter the surface 131*c* provided with the half mirror 141 is called "splitting surface 131*c*", and the surface 131*d* provided with the total reflection mirror 142 is called "reflecting surface 131*d*".

Figure 5:
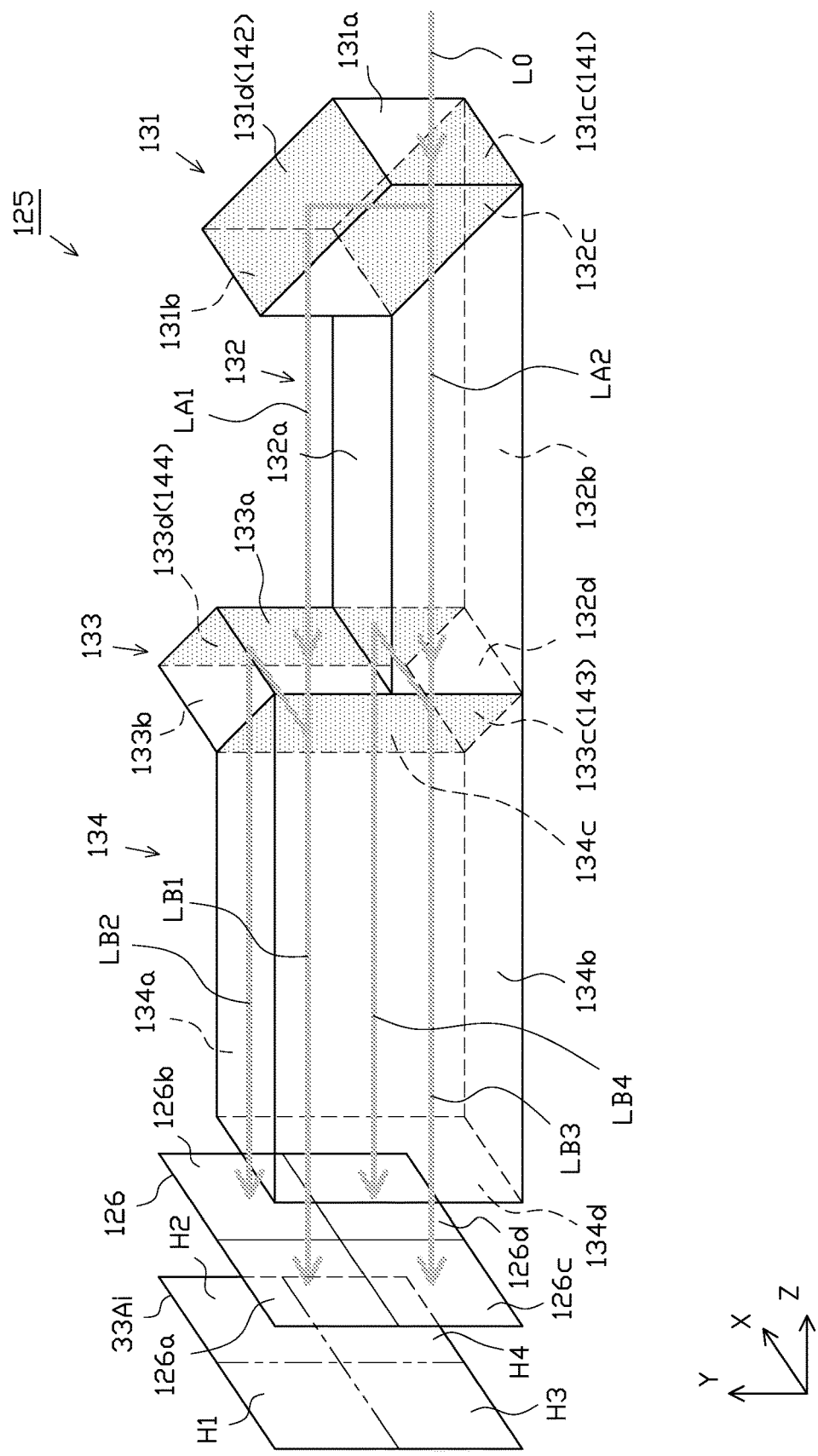
FIG. 5 is a schematic configuration diagram illustrating a spectral optical system and the like according to one or more embodiments of the invention.

As a matter of convenience, the splitting surface 131*c* (half mirror 141) and the reflecting surface 131*d* (total reflection mirror 142) are shown in dotted patterns in FIG. 5. The "half mirror 141" is configured as the "first splitting unit" or "first splitter" according to one or more embodiments of the invention, and the "total reflection mirror 142" is configured as the "first reflector". Accordingly the "first rhombic prism 131" is configured as the "first light splitter" according to one or more embodiments of the invention.

The second prism 132 is a quadrangular prism that has a trapezoidal shape in the front view (Z-Y plane) and that is extended along the X-axis direction. Hereinafter the "second prism 132" is called "first trapezoidal prism 132".

The first trapezoidal prism 132 is arranged such that, out of its four rectangular surfaces along the X-axis direction, a surface 132a located on the upper side in the Y-axis direction and a surface 132b located on the lower side in the Y-axis direction are respectively orthogonal to the Y-axis direction, such that a surface 132c located on the right side in the Z-axis direction is inclined at 45 degrees to both the Z-axis direction and the Y-axis direction, and such that a surface 132d located on the left side in the Z-axis direction is orthogonal to the Z-axis direction.

The surface 132c located on the right side in the Z-axis direction is placed in close contact with the splitting surface 131c (half mirror 141) of the first rhombic prism 131. Hereinafter the surface 132c located on the right side in the Z-axis direction is called "incident surface 132c", and the surface 132d located on the left side in the Z-axis direction is called "emission surface 132d". The "first trapezoidal prism 132" is configured as the "first optical path adjuster" according to one or more embodiments of the invention.

The third prism 133 is a quadrangular prism that has a parallelogram shape in the front view (X-Z plane) and that is extended along the Y-axis direction. Hereinafter the "third prism 133" is called "second rhombic prism 133".

The second rhombic prism 133 is arranged such that, out of its four rectangular surfaces along the Y-axis direction, a surface 133a located on the right side in the Z-axis direction and a surface 133b located on the left side in the Z-axis direction are respectively orthogonal to the Z-axis direction and such that a surface 133c located on the front side in the X-axis direction and a surface 133d located on the back side in the X-axis direction are respectively inclined at 45 degrees to both the Z-axis direction and the X-axis direction.

Out of the two inclined surfaces 133c and 133d, a non-polarizing half mirror 143 is provided on the surface 133c located on the front side in the X-axis direction, and a non-polarizing total reflection mirror 144 is provided on the surface 133d located on the back side in the X-axis direction. Hereinafter the surface 133c provided with the half mirror 143 is called "splitting surface 133c", and the surface 133d provided with the total reflection mirror 144 is called "reflecting surface 133d".

As a matter of convenience, the splitting surface 133c (half mirror 143) and the reflecting surface 133d (total reflection mirror 144) are shown in dotted patterns in FIG. 5. The "half mirror 143" is configured as the "second splitting unit" and the "third splitting unit" or the "second splitter" and the "third splitter" according to one or more embodiments of the invention, and the "total reflection mirror 144" is configured as the "second reflector" and the "third reflector". Accordingly the "second rhombic prism 133" is configured as the "second light splitter" and the "third light splitter" according to one or more embodiments of the invention.

A lower half in the Y-axis direction of the surface 133a of the second rhombic prism 133 located on the right side in the Z-axis direction is placed in close contact with the emission surface 132d of the first trapezoidal prism 132, and an upper half in the Y-axis direction is opposed to the emission surface 131b of the first rhombic prism 131. Hereinafter the surface 133a located on the right side in the Z-axis direction is called "incident surface 133a", and the surface 133b located on the left side in the Z-axis direction is called "emission surface 133b".

The fourth prism 134 is a quadrangular prism that has a trapezoidal shape in the front view (X-Z plane) and that is extended along the Y-axis direction. Hereinafter the "fourth prism 134" is called "second trapezoidal prism 134".

The second trapezoidal prism 134 is arranged such that, out of its four rectangular surfaces along the Y-axis direction, a surface 134a located on the back side in the X-axis direction and a surface 134b located on the front side in the X-axis direction are respectively orthogonal to the X-axis direction, such that a surface 134c located on the right side in the Z-axis direction is inclined at 45 degrees to both the Z-axis direction and the X-axis direction, and such that a surface 134d located on the left side in the Z-axis direction is orthogonal to the Z-axis direction.

The surface 134c located on the right side in the Z-axis direction is placed in close contact with the splitting surface 133c (half mirror 143) of the second rhombic prism 133. Hereinafter the surface 134c located on the right side in the Z-axis direction is called "incident surface 134c", and the surface 134d located on the left side in the Z-axis direction is called "emission surface 134d". The "second trapezoidal prism 134" is configured as the "second optical path adjuster" and the "third optical path adjuster" according to one or more embodiments of the invention.

The emission surface 133b of the second rhombic prism 133 and the emission surface 134d of the second trapezoidal prism 134 are arranged to be respectively opposed to the filter unit 126.

The functions of the spectral optical system 125 are described in detail below with reference to FIG. 5. A combined light L0 transmitted through a quarter wave plate 31A enters the incident surface 131a of the first rhombic prism 131.

The combined light L0 entering the incident surface 131a is split in two different directions by the splitting surface 131c (half mirror 141). For example, the combined light L0 is split into a split light LA1 that is reflected upward in the Y-axis direction and a spit light LA2 that is transmitted through the half mirror 141 along the Z-axis direction.

The split light LA1 reflected by the half mirror 141 travels along the Y-axis direction in the first rhombic prism 131, is reflected leftward in the Z-axis direction by the reflecting surface 131d (total reflection mirror 142) and is emitted from the emission surface 131b. The split light LA1 emitted from the emission surface 131b travels in the air along the Z-axis direction and enters the incident surface 133a of the second rhombic prism 133.

The split light LA2 transmitted through the half mirror 141, on the other hand, enters the incident surface 132c of the first trapezoidal prism 132, travels along the Z-axis direction in the first trapezoidal prism 132 and is emitted from the emission surface 132d. The split light LA2 emitted from the emission surface 132d enters the incident surface 133a of the second rhombic prism 133.

According to one or more embodiments of the invention, the refractive indexes and the lengths (length in the Z-axis direction or length in the Y-axis direction) of the first rhombic prism 131 and the first trapezoidal prism 132 are set arbitrarily, such that the optical path lengths of both the split lights LA1 and LA2 from the splitting surface 131c of the first rhombic prism 131 to the incident surface 133a of the second rhombic prism 133 are optically identical with each other.

Each of the split lights LA1 and LA2 entering the incident surface 133a of the second rhombic prism 133 is split in two different directions by the splitting surface 133c (half mirror 143). For example, one split light LA1 is split into a split light LB1 that is transmitted through the half mirror 143 along the Z-axis direction and a split light LB2 that is reflected backward in the X-axis direction. The other split light LA2 is split into a split light LB3 that is transmitted through the half mirror 143 along the Z-axis direction and a split light LB4 that is reflected backward in the X-axis direction.

The split lights LB2 and LB4 reflected by the half mirror 143 respectively travel along the X-axis direction in the second rhombic prism 133, are reflected leftward in the Z-axis direction by the reflecting surface 133d (total reflection mirror 144) and are emitted from the emission surface 133b. The split lights LB2 and LB4 emitted from the emission surface 133b respectively travel in the air along the Z-axis direction and enter the filter unit 126.

The split lights LB1 and LB3 transmitted through the half mirror 143, on the other hand, enter the incident surface 134c of the second trapezoidal prism 134, travel along the Z-axis direction in the second trapezoidal prism 134 and are emitted from the emission surface 134d. The split lights LB1 and LB3 emitted from the emission surface 134d respectively enter the filter unit 126.

According to one or more embodiments of the invention, the refractive indexes and the lengths (length in the Z-axis direction or length in the X-axis direction) of the second rhombic prism 133 and the second trapezoidal prism 134 are set arbitrarily, such that the optical path lengths of the four split lights LB1 to LB4 from the splitting surface 133c of the second rhombic prism 133 to the filter unit 126 are optically identical with each other.

Figure 6:
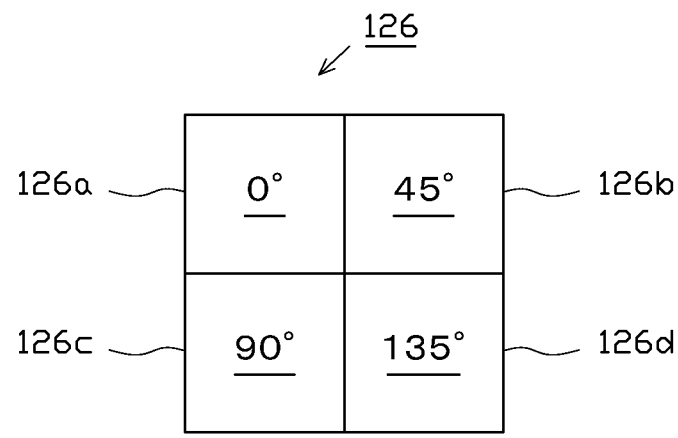
FIG. 6 is a schematic configuration diagram illustrating a filter unit according to one or more embodiments of the invention.

The filter unit 126 includes four polarizers 126a, 126b, 126c and 126d that are formed in identical rectangular shapes in the plan view of the X-Y plane and that are arranged in two by two matrix along the X-Y plane (as shown in FIG. 6). FIG. 6 is a plan view illustrating the schematic configuration of the filter unit 126.

The four polarizers 126a to 126d are polarizers respectively having transmission axis directions relative to the Y-axis direction that differ by 45 degrees each. For example, the filter unit 126 includes the first polarizer 126a having the transmission axis direction of 0 degree, the second polarizer 126b having the transmission axis direction of 45 degrees, the third polarizer 126c having the transmission axis direction of 90 degrees, and the fourth polarizer 126d having the transmission axis direction of 135 degrees.

The respective polarizers 126a to 126d are arranged such that the four split lights LB1 to LB4 emitted from the spectral optical system 125 enter the respective polarizers 126a to 126d. For example, the split light LB1 enters the first polarizer 126a, the split light LB2 enters the second polarizer 126b, the split light LB3 enters the third polarizer 126c, and the split light LB4 enters the fourth polarizer 126d.

The four split lights LB1 to LB4 transmitted through the filter unit 126 are accordingly provided as interfering lights having phases that differ by 90 degrees each. For example, the split light LB1 transmitted through the first polarizer 126a is provided as interfering light having the phase of "0 degree"; the split light LB2 transmitted through the second polarizer 126b is provided as interfering light having the phase of "90 degrees"; the split light LB3 transmitted through the third polarizer 126c is provided as interfering light having the phase of "180 degrees"; and the split light LB4 transmitted through the fourth polarizer 126d is provided as interfering light having the phase of "270 degrees". Accordingly the filter unit 126 is configured as the interfering unit according to one or more embodiments of the invention.

Figure 7:
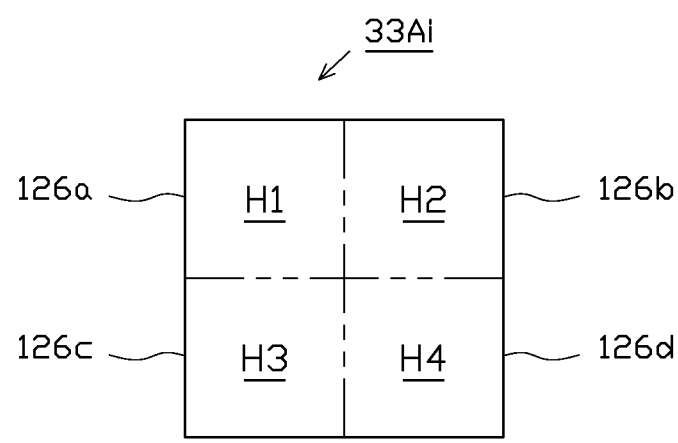
FIG. 7 is a schematic configuration diagram illustrating imaging areas of an imaging element according to one or more embodiments of the invention.

An imaging region of an imaging element 33Ai of the first camera 33A according to one or more embodiments of the invention is divided into four imaging areas H1, H2, H3 and H4 corresponding to the filter unit 126 (polarizers 126a to 126d). For example, the imaging region is divided into four imaging areas H1, H2, H3 and H4 that are in identical rectangular shapes in the plan view of the X-Y plane and are arranged in two by two matrix along the X-Y plane (as shown in FIG. 7). FIG. 7 is a plan view illustrating the schematic configuration of the imaging region of the imaging element 33Ai.

Accordingly, an image of the split light LB1 transmitted through the first polarizer 126a is taken in the first imaging area H1; an image of the split light LB2 transmitted through the second polarizer 126b is taken in the second imaging area H2; an image of the split light LB3 transmitted through the third polarizer 126c is taken in the third imaging area H3; and an image of the split light LB4 transmitted through the fourth polarizer 126d is taken in the fourth imaging area H4.

For example, an interference fringe image having the phase of "0 degree" is taken in the first imaging area H1; an interference fringe image having the phase of "90 degrees" is taken in the second imaging area H2; an interference fringe image having the phase of "180 degrees" is taken in the third imaging area H3; and an interference fringe image having the phase of "270 degrees" is taken in the fourth imaging area H4.

Additionally, the image data storage device 54 according to one or more embodiments of the invention includes a first image memory configured to store interference fringe image data taken in the first imaging area H1 of the imaging element 33Ai of the first camera 33A, a second image memory configured to store interference fringe image data taken in the second imaging area H2, a third image memory configured to store interference fringe image data taken in the third imaging area H3 and a fourth image memory configured to store interference fringe image data taken in the fourth imaging area H4.

The following describes the details of a procedure of shape measurement process performed according to one or more embodiments of the invention. When the combined light L0 that is output light with regard to the first light enters from the interference optical system 3 into the first imaging system 4A, the combined light L0 travels through the quarter wave plate 31A and is split into the four split lights LB1 to LB4 by the spectral optical system 125.

The images of these four split lights LB1, LB2, LB3 and LB4 are simultaneously taken by the first camera 33A (imaging element 33Ai) respectively via the first polarizer 126a, the second polarizer 126b, the third polarizer 126c and the fourth polarizer 126d.

The first camera 33A outputs the four interference fringe images (four split lights LB1 to LB4) simultaneously taken in the imaging areas H1 to H4 of the imaging element 33Ai as one image data to the control device 5.

The control device 5 divides the input image data into four interference fringe image data (into ranges corresponding to the imaging areas H1 to H4 of the imaging element 33Ai) and respectively stores the four interference fringe image data into the first to fourth image memories included in the image data storage device 54.

The control device 5 subsequently measures the surface shape of the work W by the phase shift method like the embodiments described above, based on the four interference fringe image data of the first light stored in the first to the fourth image memories with regard to the first camera 33A and the four interference fringe image data of the second light stored in first to fourth image memories with regard to the second camera 33B. This accordingly calculates height information at the respective positions on the surface of the work W.

As described above in detail, in addition to the aforementioned functions and advantageous effects, one or more embodiments of the invention split the combined light L0 entering from the interference optical system 3 into the four lights LB1 to LB4 arrayed in the matrix and simultaneously take the images of these four lights LB1 to LB4 via the filter unit 126 (four polarizers 126a to 126d) with a single imaging element. The configuration of the embodiments subsequently measures the shape of the work W by the phase shift method, based on the respective four interference fringe images taken by the respective cameras 33A and 33B. As a result, this configuration enhances the measurement accuracy, shortens the measurement time and suppresses size expansion of the device.

Additionally, according to one or more embodiments of the invention, the imaging areas H1 to H4 set by dividing the imaging region of the imaging element into a matrix of four equal areas are respectively allocated to the four lights LB1 to LB4. This configuration allows for effective use of the imaging region of the imaging element, compared with, for example, a three-light splitting technique. This accordingly further enhances the measurement accuracy. For example, when an imaging region of a standard imaging element having an aspect ratio of 4 to 3 and is divided into four equal areas, the respective divisional areas have the same aspect ratio of 4 to 3. This makes a wider range in each divisional area usable and thereby further enhances the measurement accuracy.

Using diffraction grating as the spectroscopic unit is likely to reduce the resolution. One or more embodiments of the invention, however, employ the spectral optical system 125 configured to split one light L0 into two parallel lights LA1 and LA2 and further split each of the two lights LA1 and LA2 into two parallel lights, so as to provide four parallel lights LB1, LB2, LB3 and LB4. This configuration suppresses reduction of the resolution.

Furthermore, in the spectral optical system 125 according to one or more embodiments of the invention, the optical path adjuster configured to adjust the optical path length of one light that travels straight and passes through the rhombic prisms 131 and 133 and the optical path length of the other light that is bent like a crank and passes through the rhombic prisms 131 and 133 (make these optical path lengths optically identical with each other) is implemented by such a relatively simple configuration that the trapezoidal prisms 132 and 134 are placed on the optical path of one light that travels straight and passes through the rhombic prisms 131 and 133. This achieves simplified configuration.

According to one or more embodiments of the invention, the filter unit 126 is comprised of the first polarizer 126a having the transmission angle direction of 0 degree, the second polarizer 126b having the transmission angle direction of 45 degrees, the third polarizer 126c having the transmission angle direction of 90 degrees and the fourth polarizer 126d having the transmission angle direction of 135 degrees. This configuration enables the four interference fringe images having the phases that differ by 90 degrees each to be obtained by one single imaging using one imaging element. As a result, this configuration ensures measurement of the higher accuracy, compared with a configuration of measuring the shape by the phase shift method based on three interference fringe images.

The following describes further embodiments of the invention with reference to the drawings. The following embodiments differ from the aforementioned embodiments by the configuration involved in the interference optical system. The like components to those of the aforementioned embodiments are expressed by the like reference signs, and their detailed description is omitted.

Figure 8:
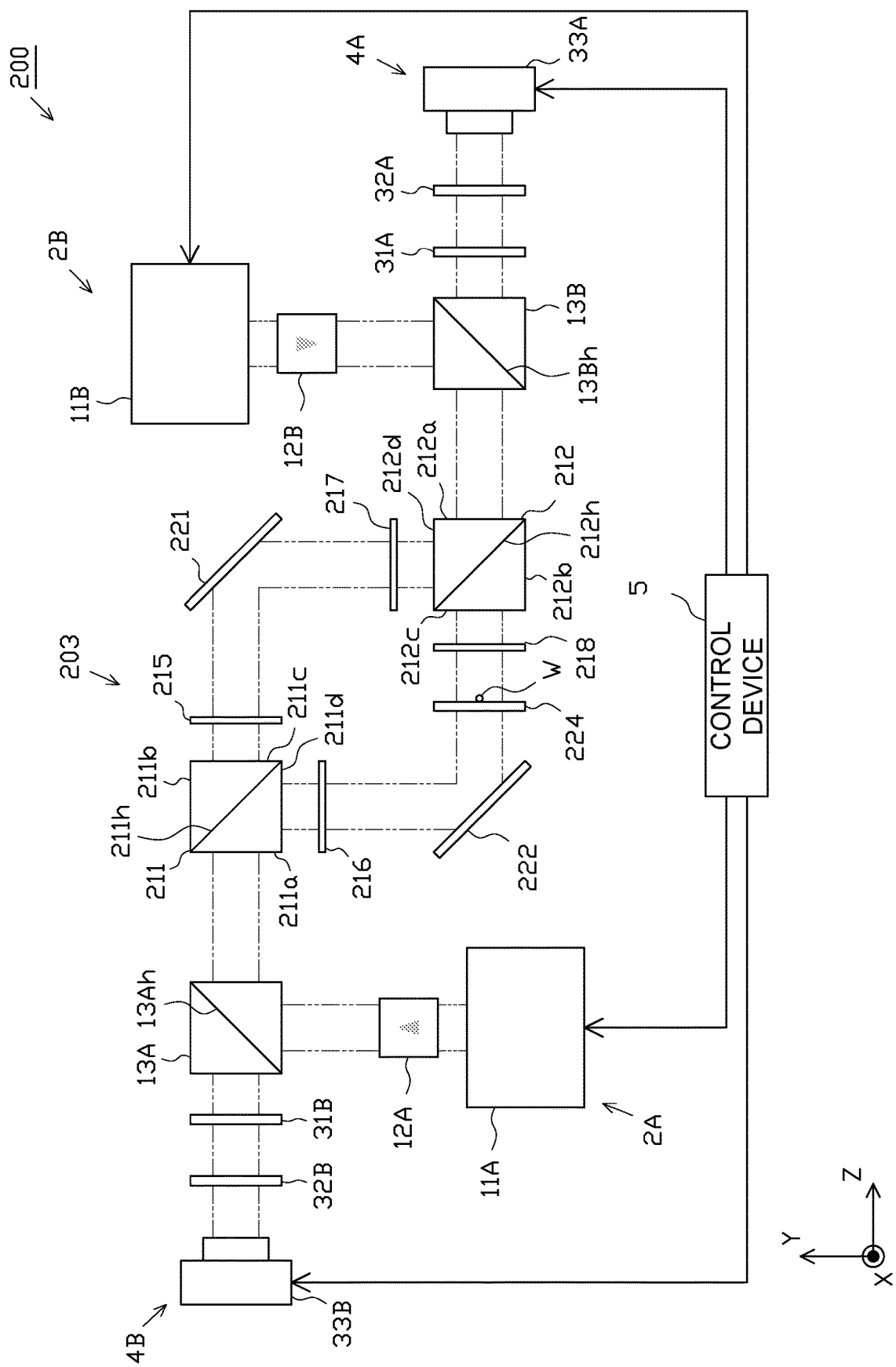
FIG. 8 is a schematic configuration diagram illustrating a three-dimensional measurement device according to one or more embodiments of the invention.

FIG. 8 is a diagram illustrating the schematic configuration of a three-dimensional measurement device 200 according to one or more embodiments of the invention. Hereinafter, as a matter of convenience, a front-back direction of the sheet surface of FIG. 1 is called "X-axis direction", a top-bottom direction of the sheet surface is called "Y-axis direction" and a left-right direction of the sheet surface is called "Z-axis direction".

The three-dimensional measurement device 200 is configured based on the principle of the Mach-Zehnder interferometer and includes two projection optical systems 2A and 2B (first projection optical system 2A and second projection optical system 2B) configured to emit lights of specific wavelengths, an interference optical system 203 configured to receive the lights respectively emitted from the projection optical systems 2A and 2B, two imaging systems 4A and 4B (first imaging system 4A and second imaging system 4B) configured to take images of the lights emitted from the interference optical system 203, and a control device 5 configured to perform various controls, image processing, calculations and the like involved in the projection optical systems 2A and 2B, the interference optical system 203, the imaging systems 4A and 4B and the like. The "control device 5" is configured as the "image processor" according to one or more embodiments of the invention, and the "interference optical system 203" is configured as the "predetermined optical system" according to one or more embodiments of the invention.

The configuration of the two projection optical systems 2A and 2B (first projection optical system 2A and second projection optical system 2B) is described first in detail. The first projection optical system 2A includes, for example, a first light emitter 11A, a first light isolator 12A and a first non-polarizing beam splitter 13A. The "first light emitter 11A" is configured as the "first irradiator" according to one or more embodiments of the invention, and the "first non-polarizing beam splitter 13A" is configured as the "first light guiding unit" or "first light guide" according to one or more embodiments of the invention.

According to one or more embodiments of the invention, a linearly polarized light of a wavelength $\lambda_1$ (for example, $\lambda_1$=1500 nm) having a polarizing direction that is a direction inclined at 45 degrees to the X-axis direction and the Z-axis direction is emitted upward in the Y-axis direction from the first light emitter 11A. The "wavelength $\lambda_1$" corresponds to the "first wavelength" according to one or more embodiments of the invention. Hereinafter the light of the wavelength $\lambda_1$ emitted from the first light emitter 11A is called "first light".

The first light isolator 12A is an optical element configured to transmit only a light traveling in one direction (upward in the Y-axis direction according to one or more embodiments of the invention) but block a light traveling in a reverse direction (downward in the Y-axis direction according to one or more embodiments of the invention). This configuration allows for transmission of only the first light emitted from the first light emitter 11A and thereby prevents damage and destabilization of the first light emitter 11A by return light.

According to one or more embodiments of the invention, a linearly polarized light having a polarizing direction that is a direction parallel to the sheet surface of FIG. 8 (Y-axis direction or Z-axis direction) is called P-polarized light (P-polarized light component). A linearly polarized light having a polarizing direction that is the X-axis direction perpendicular to the sheet surface of FIG. 8 is called S-polarized light (S-polarized light component). The "P-polarized light" corresponds to the "first polarized light having the first polarizing direction". The "S-polarized light" corresponds to the "second polarized light having the second polarizing direction".

The first non-polarizing beam splitter 13A is arranged such that one of two surfaces adjoining to each other across a joint surface 13Ah is perpendicular to the Y-axis direction and the other of the two surfaces is perpendicular to the Z-axis direction. In other words, the joint surface 13Ah of the first non-polarizing beam splitter 13A is arranged to be inclined at 45 degrees to the Y-axis direction and the Z-axis direction. For example, the first non-polarizing beam splitter 13A is arranged to transmit part (half) of the first light that enters upward in the Y-axis direction from the first light emitter 11A via the first light isolator 12A, upward in the Y-axis direction and reflect the remaining part (remaining half) of the first light rightward in the Z-axis direction.

The second projection optical system 2B includes, for example, a second light emitter 11B, a second light isolator 12B and a second non-polarizing beam splitter 13B. The "second light emitter 11B" is configured as the "second irradiator" according to one or more embodiments of the invention. The "second non-polarizing beam splitter 13B" is configured as the "second light guiding unit" or "second light guide" according to one or more embodiments of the invention.

According to one or more embodiments of the invention, a linearly polarized light of a wavelength $\lambda_2$ (for example, $\lambda_2$=1503 nm) having a polarizing direction that is a direction inclined at 45 degrees to the X-axis direction and the Z-axis direction is emitted downward in the Y-axis direction from the second light emitter 11B. The "wavelength $\lambda_2$" corresponds to the "second wavelength" according to one or more embodiments of the invention. Hereinafter the light of the wavelength $\lambda_2$ emitted from the second light emitter 11B is called "second light".

The second light isolator 12B is an optical element configured to transmit only a light traveling in one direction (downward in the Y-axis direction according to one or more embodiments of the invention) but block a light traveling in a reverse direction (upward in the Y-axis direction according to one or more embodiments of the invention). This configuration allows for transmission of only the second light emitted from the second light emitter 11B and thereby prevents damage and destabilization of the second light emitter 11B by return light.

The second non-polarizing beam splitter 13B is arranged such that one of two surfaces adjoining to each other across a joint surface 13Bh is perpendicular to the Y-axis direction and the other of the two surfaces is perpendicular to the Z-axis direction. In other words, the joint surface 13Bh of the second non-polarizing beam splitter 13B is arranged to be inclined at 45 degrees to the Y-axis direction and the Z-axis direction. For example, the second non-polarizing beam splitter 13B is arranged to transmit part (half) of the second light that enters downward in the Y-axis direction from the second light emitter 11B via the second light isolator 12B, downward in the Y-axis direction and reflect the remaining part (remaining half) of the second light leftward in the Z-axis direction.

The following describes the configuration of the interference optical system 203 in detail. The interference optical system 203 includes, for example, two polarizing beam splitters 211 and 212 (first polarizing beam splitter 211 and second polarizing beam splitter 212), four quarter wave plates 215, 216, 217 and 218 (first quarter wave plate 215, second quarter wave plate 216, third quarter wave plate 217 and fourth quarter wave plate 218), two total reflection mirrors 221 and 222 (first total reflection mirror 221 and second total reflection mirror 222) and a placement structure 224.

The polarizing beam splitters 211 and 212 are cube-shaped known optical members, each being configured by joining right angle prisms together to be integrated, and their joint surfaces (boundary surfaces) 211h and 212h are coated with, for example, a dielectric multilayer film.

Each of the polarizing beam splitters 211 and 212 is configured to split a linearly polarized incident light into two polarized light components (P-polarized light component and S-polarized light component) having polarizing directions perpendicular to each other. According to one or more embodiments of the invention, the polarizing beam splitters 211 and 212 are configured to transmit the P-polarized light component and reflect the S-polarized light component. According to one or more embodiments of the invention, the polarizing beam splitters 211 and 212 are configured as the "splitting unit" to split a predetermined incident light into two lights and are also configured as the "combining unit" to recombine two predetermined incident lights.

The first polarizing beam splitter 211 is arranged such that one of two surfaces adjoining to each other across the joint surface 211h is perpendicular to the Y-axis direction and the other of the two surfaces is perpendicular to the Z-axis direction. In other words, the joint surface 211h of the first polarizing beam splitter 211 is arranged to be inclined at 45 degrees to the Y-axis direction and the Z-axis direction.

For example, a first surface (left side face in the Z-axis direction) 211a of the first polarizing beam splitter 211, which the first light reflected rightward in the Z-axis direction from the first non-polarizing beam splitter 13A enters, and a third surface (right side face in the Z-axis direction) 211c opposed to the first surface 211a are arranged to be perpendicular to the Z-axis direction. The "first polarizing beam splitter 211 (first surface 211a)" corresponds to the "first input-output element" according to one or more embodiments of the invention.

A second surface (upper side face in the Y-axis direction) 211b of the first polarizing beam splitter 211 that is a surface adjoining to the first surface 211a across the joint surface 211h and a fourth surface (lower side face in the Y-axis direction) 211d opposed to the second surface 211b are, on the other hand, arranged to be perpendicular to the Y-axis direction.

The second polarizing beam splitter 212 is arranged such that one of two surfaces adjoining to each other across the joint surface 212h is perpendicular to the Y-axis direction and the other of the two surfaces is perpendicular to the Z-axis direction. In other words, the joint surface 212h of the second polarizing beam splitter 212 is arranged to be inclined at 45 degrees to the Y-axis direction and the Z-axis direction.

For example, a first surface (right side face in the Z-axis direction) 212a of the second polarizing beam splitter 212, which the second light reflected leftward in the Z-axis direction from the second non-polarizing beam splitter 13B enters, and a third surface (left side face in the Z-axis direction) 212c opposed to the first surface 212a are arranged to be perpendicular to the Z-axis direction. The "second polarizing beam splitter 212 (first surface 212a)" corresponds to the "second input-output element" according to one or more embodiments of the invention.

A second surface (lower side face in the Y-axis direction) 212b of the second polarizing beam splitter 212 that is a surface adjoining to the first surface 212a across the joint surface 212h and a fourth surface (upper side face in the Y-axis direction) 212d opposed to the second surface 212b are, on the other hand, arranged to be perpendicular to the Y-axis direction.

The quarter wave plates 215, 216, 217 and 218 are optical members, each serving to convert a linearly polarized light into a circularly polarized light and to convert a circularly polarized light into a linearly polarized light.

The first quarter wave plate 215 is arranged to be opposed in the Z-axis direction to the third surface 211c of the first polarizing beam splitter 211. The first quarter wave plate 215 converts the linearly polarized light emitted from the third surface 211c of the first polarizing beam splitter 211 into a circularly polarized light and emits the circularly polarized light rightward in the Z-axis direction. The first quarter wave plate 215 also converts the circularly polarized light entering leftward in the Z-axis direction into a linearly polarized light and emits the linearly polarized light leftward in the Z-axis direction toward the third surface 211c of the first polarizing beam splitter 211.

The second quarter wave plate 216 is arranged to be opposed in the Y-axis direction to the fourth surface 211d of the first polarizing beam splitter 211. The second quarter wave plate 216 converts the linearly polarized light emitted from the fourth surface 211d of the first polarizing beam splitter 211 into a circularly polarized light and emits the circularly polarized light downward in the Y-axis direction. The second quarter wave plate 216 also converts the circularly polarized light entering upward in the Y-axis direction into a linearly polarized light and emits the linearly polarized light upward in the Y-axis direction toward the fourth surface 211d of the first polarizing beam splitter 211.

The third quarter wave plate 217 is arranged to be opposed in the Y-axis direction to the fourth surface 212d of the second polarizing beam splitter 212. The third quarter wave plate 217 converts the linearly polarized light emitted from the fourth surface 212d of the second polarizing beam splitter 212 into a circularly polarized light and emits the circularly polarized light upward in the Y-axis direction. The third quarter wave plate 217 also converts the circularly polarized light entering downward in the Y-axis direction into a linearly polarized light and emits the linearly polarized light downward in the Y-axis direction toward the fourth surface 212d of the second polarizing beam splitter 212.

The fourth quarter wave plate 218 is arranged to be opposed in the Z-axis direction to the third surface 212c of the second polarizing beam splitter 212. The fourth quarter wave plate 218 converts the linearly polarized light emitted from the third surface 212c of the second polarizing beam splitter 212 into a circularly polarized light and emits the circularly polarized light leftward in the Z-axis direction. The fourth quarter wave plate 218 also converts the circularly polarized light entering rightward in the Z-axis direction into a linearly polarized light and emits the linearly polarized light rightward in the Z-axis direction toward the third surface 212c of the second polarizing beam splitter 212.

The total reflection mirrors 221 and 222 are optical members, each serving to totally reflect the incident light. The first total reflection mirror 221 configured as the reference surface according to one or more embodiments of the invention is arranged to be inclined at 45 degrees to the Y-axis direction and the Z-axis direction at the position of an intersection of an axis line that passes through the first polarizing beam splitter 211 and the first quarter wave plate 215 and that is extended in the Z-axis direction and an axis line that passes through the second polarizing beam splitter 212 and the third quarter wave plate 217 and that is extended in the Y-axis direction.

The first total reflection mirror 221 enables the light emitted rightward in the Z-axis direction from the third surface 211c of the first polarizing beam splitter 211 (via the first quarter wave plate 215) to be reflected downward in the Y-axis direction and enter the fourth surface 212d of the second polarizing beam splitter 212 (via the third quarter wave plate 217). The first total reflection mirror 221 enables, on the contrary, the light emitted upward in the Y-axis direction from the fourth surface 212d of the second polarizing beam splitter 212 (via the third quarter wave plate 217) to be reflected leftward in the Z-axis direction and enter the third surface 211c of the first polarizing beam splitter 211 (via the first quarter wave plate 215).

The second total reflection mirror 222 is, on the other hand, arranged to be inclined at 45 degrees to the Y-axis direction and the Z-axis direction at the position of an intersection of an axis line that that passes through the first polarizing beam splitter 211 and the second quarter wave plate 216 and that is extended in the Y-axis direction and an axis line that passes through the second polarizing beam splitter 212 and the fourth quarter wave plate 218 and that is extended in the Z-axis direction.

The second total reflection mirror 222 enables the light emitted downward in the Y-axis direction from the fourth surface 211d of the first polarizing beam splitter 211 (via the second quarter wave plate 216) to be reflected rightward in the Z-axis direction and enter the third surface 212c of the second polarizing beam splitter 212 (via the fourth quarter wave plate 218). The second total reflection mirror 222 enables, on the contrary, the light emitted leftward in the Z-axis direction from the third surface 212c of the second polarizing beam splitter 212 (via the fourth quarter wave plate 218) to be reflected upward in the Y-axis direction and enter the fourth surface 211d of the first polarizing beam splitter 211 (via the second quarter wave plate 216).

The placement structure 224 is used to place a work W as a measurement object thereon. According to one or more embodiments of the invention, a translucent object such as film is assumed as the work W. The placement structure 224 is placed between the fourth quarter wave plate 218 and the second total reflection mirror 222 on an axis line that passes through the second polarizing beam splitter 212 and the second total reflection mirror 222 and that is extended in the Z-axis direction.

The following describes the configuration of the two imaging systems 4A and 4B (first imaging system 4A and second imaging system 4B) in detail. The first imaging system 4A includes, for example, a quarter wave plate 31A, a first polarizer 32A and a first camera 33A configured as the first imaging unit.

The quarter wave plate 31A is configured to respectively convert the linearly polarized lights (reference light component and measurement light component of the first light described later) transmitted rightward in the Z-axis direction through the second non-polarizing beam splitter 13B, into circularly polarized lights.

The first polarizer 32A is configured to selectively transmit the respective components of the first light converted into the circularly polarized lights by the quarter wave plate 31A. This configuration causes interference of the reference light component and the measurement light component of the first light having different rotating directions, with regard to a specific phase. The "first polarizer 32A" is configured as the "first phase shift unit" and the "interfering unit" according to one or more embodiments of the invention.

The first polarizer 32A according to one or more embodiments of the invention is configured to be rotatable about the Z-axis direction as the axial center and is controlled to change its transmission axis direction by 45 degrees each. For example, the transmission axis direction is changed to "0 degree", "45 degrees", "90 degrees" and "135 degrees" relative to the Y-axis direction.

This configuration causes interference of the reference light component and the measurement light component of the first light transmitted through the first polarizer 32A in four different phases. This accordingly generates interfering lights having phases that are different from one another by 90 degrees. For example, this generates an interfering light having a phase of "0 degree", an interfering light having a phase of "90 degrees", an interfering light having a phase of "180 degrees" and an interfering light having a phase of "270 degrees".

As a result, an interference fringe image having the phase of "0 degree", an interference fringe image having the phase of "90 degrees", an interference fringe image having the phase of "180 degrees" and an interference fringe image having the phase of "270 degrees" with regard to the first light are taken by the first camera 33A. Image data taken by the first camera 33A are converted into digital signals inside of the first camera 33A and are input in the form of digital signals into the control device 5 (image data storage device 54).

The second imaging system 4B includes, for example, a quarter wave plate 31B, a second polarizer 32B and a second camera 33B configured as the second imaging unit.

The quarter wave plate 31B is configured to respectively convert the linearly polarized lights (reference light component and measurement light component of the second light described later) transmitted leftward in the Z-axis direction through the first non-polarizing beam splitter 13A, into circularly polarized lights.

The second polarizer 32B is configured to selectively transmit the respective components of the second light converted into the circularly polarized lights by the quarter wave plate 31B. This configuration causes interference of the reference light component and the measurement light component of the second light having different rotating directions, with regard to a specific phase. The "second polarizer 32B" is configured as the "second phase shift unit" and the "interfering unit" according to one or more embodiments of the invention.

The second polarizer 32B according to one or more embodiments of the invention is configured to be rotatable about the Z-axis direction as the axial center and is controlled to change its transmission axis direction by 45 degrees each. For example, the transmission axis direction is changed to "0 degree", "45 degrees", "90 degrees" and "135 degrees" relative to the Y-axis direction.

This configuration causes interference of the reference light component and the measurement light component of the second light transmitted through the second polarizer 32B in four different phases. This accordingly generates interfering lights having phases that are different from one another by 90 degrees. For example, this generates an interfering light having a phase of "0 degree", an interfering light having a phase of "90 degrees", an interfering light having a phase of "180 degrees" and an interfering light having a phase of "270 degrees".

As a result, an interference fringe image having the phase of "0 degree", an interference fringe image having the phase of "90 degrees", an interference fringe image having the phase of "180 degrees" and an interference fringe image having the phase of "270 degrees" with regard to the second light are taken by the second camera 33B Image data taken by the second camera 33B are converted into digital signals inside of the second camera 33B and are input in the form of digital signals into the control device 5 (image data storage device 54).

The following describes the functions of the three-dimensional measurement device 200. Radiation of the first light and radiation of the second light are performed simultaneously according to the embodiments as described later. The optical path of the first light and the optical path of the second light partly overlap each other. For the better understanding, the optical path of the first light and the optical path of the second light are illustrated in different drawings and are described individually.

Figure 9:
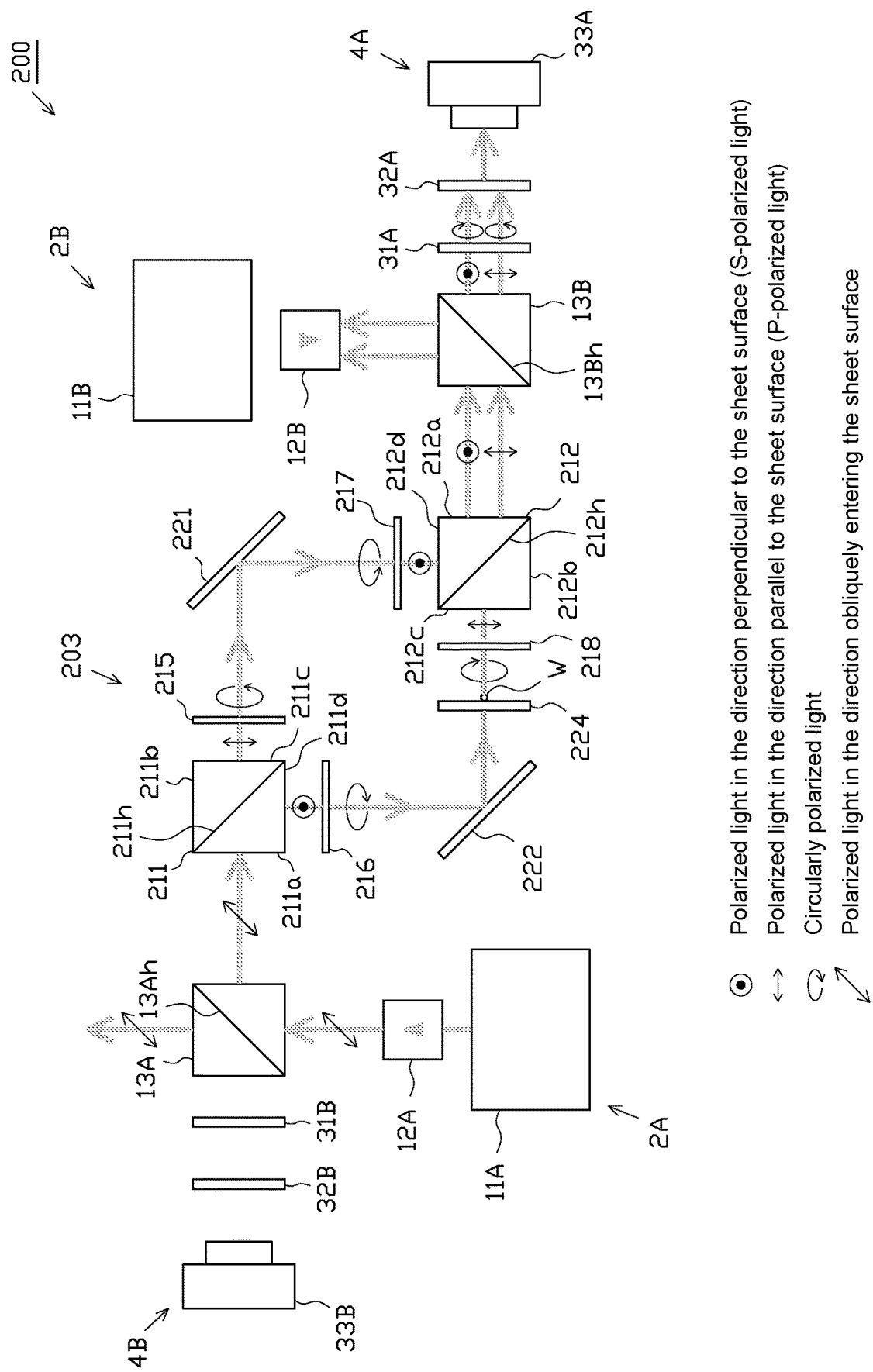
FIG. 9 is an optical path diagram illustrating an optical path of a first light according to one or more embodiments of the invention.

The optical path of the first light is described first with reference to FIG. 9. As shown in FIG. 9, the first light of the wavelength $\lambda_1$ (linearly polarized light having the polarizing direction that is inclined at 45 degrees to the X-axis direction and the Z-axis direction) is emitted upward in the Y-axis direction from the first light emitter 11A.

The first light emitted from the first light emitter 11A passes through the first light isolator 12A and enters the first non-polarizing beam splitter 13A. Part of the first light entering the first non-polarizing beam splitter 13A is transmitted upward in the Y-axis direction, while the remaining part is reflected rightward in the Z-axis direction.

The first light reflected rightward in the Z-axis direction (linearly polarized light having the polarizing direction that is inclined at 45 degrees to the X-axis direction and the Y-axis direction) enters the first surface 211a of the first polarizing beam splitter 211. The first light transmitted upward in the Y-axis direction, on the other hand, does not enter any optical system or the like but is left as waste light.

With regard to the first light entering the first surface 211a of the first polarizing beam splitter 211 rightward in the Z-axis direction, its P-polarized light component is transmitted rightward in the Z-axis direction and is emitted from the third surface 211c as the reference light, while its S-polarized light component is reflected downward in the Y-axis direction and is emitted from the fourth surface 211d as the measurement light.

The reference light (P-polarized light) of the first light emitted from the third surface 211c of the first polarizing beam splitter 211 passes through the first quarter wave plate 215 to be converted into clockwise circularly polarized light and is then reflected downward in the Y-axis direction by the first total reflection mirror 221. In this process, the rotating direction relative to the traveling direction of light is maintained.

The reference light of the first light subsequently passes through the third quarter wave plate 217 to be converted from the clockwise circularly polarized light into S-polarized light and then enters the fourth surface 212d of the second polarizing beam splitter 212.

The measurement light (S-polarized light) of the first light emitted from the fourth surface 211d of the first polarizing beam splitter 211 passes through the second quarter wave plate 216 to be converted into counterclockwise circularly polarized light and is then reflected rightward in the Z-axis direction by the second total reflection mirror 222. In this process, the rotating direction relative to the traveling direction of light is maintained.

The measurement light of the first light is then transmitted through the work W placed on the placement structure 224, subsequently passes through the fourth quarter wave plate 218 to be converted from the counterclockwise circularly polarized light into P-polarized light and then enters the third surface 212c of the second polarizing beam splitter 212.

The reference light (S-polarized light) of the first light entering the fourth surface 212d of the second polarizing beam splitter 212 is reflected rightward in the Z-axis direction by the joint surface 212h, while the measurement light (P-polarized light) of the first light entering the third surface 212c of the second polarizing beam splitter 212 is transmitted rightward in the Z-axis direction through the joint surface 212h. The combined light generated by combining the reference light and the measurement light of the first light with each other is then emitted as the output light from the first surface 212a of the second polarizing beam splitter 212.

The combined light (reference light and measurement light) of the first light emitted from the first surface 212a of the second polarizing beam splitter 212 enters the second non-polarizing beam splitter 13B. Part of the combined light of the first light entering the second non-polarizing beam splitter 13B rightward in the Z-axis direction is transmitted rightward in the Z-axis direction, while the remaining part is reflected upward in the Y-axis direction. The combined light (reference light and measurement light) transmitted rightward in the Z-axis direction enters the first imaging system 4A. The combined light reflected upward in the Y-axis direction is, on the other hand, blocked by the second light isolator 12B to be left as waste light.

With regard to the combined light (reference light and measurement light) of the first light entering the first imaging system 4A, the quarter wave plate 31A converts the reference light component (S-polarized light component) into counterclockwise circularly polarized light, while converting the measurement light component (P-polarized light component) into clockwise circularly polarized light. The counterclockwise circularly polarized light and the clockwise circularly polarized light have different rotating directions and accordingly do not interfere with each other.

The combined light of the first light subsequently passes through the first polarizer 32A, so that the reference light component and the measurement light component interfere with each other in a phase corresponding to the angle of the first polarizer 32A. The image of the interfering light of the first light is then taken by the first camera 33A.

Figure 10:
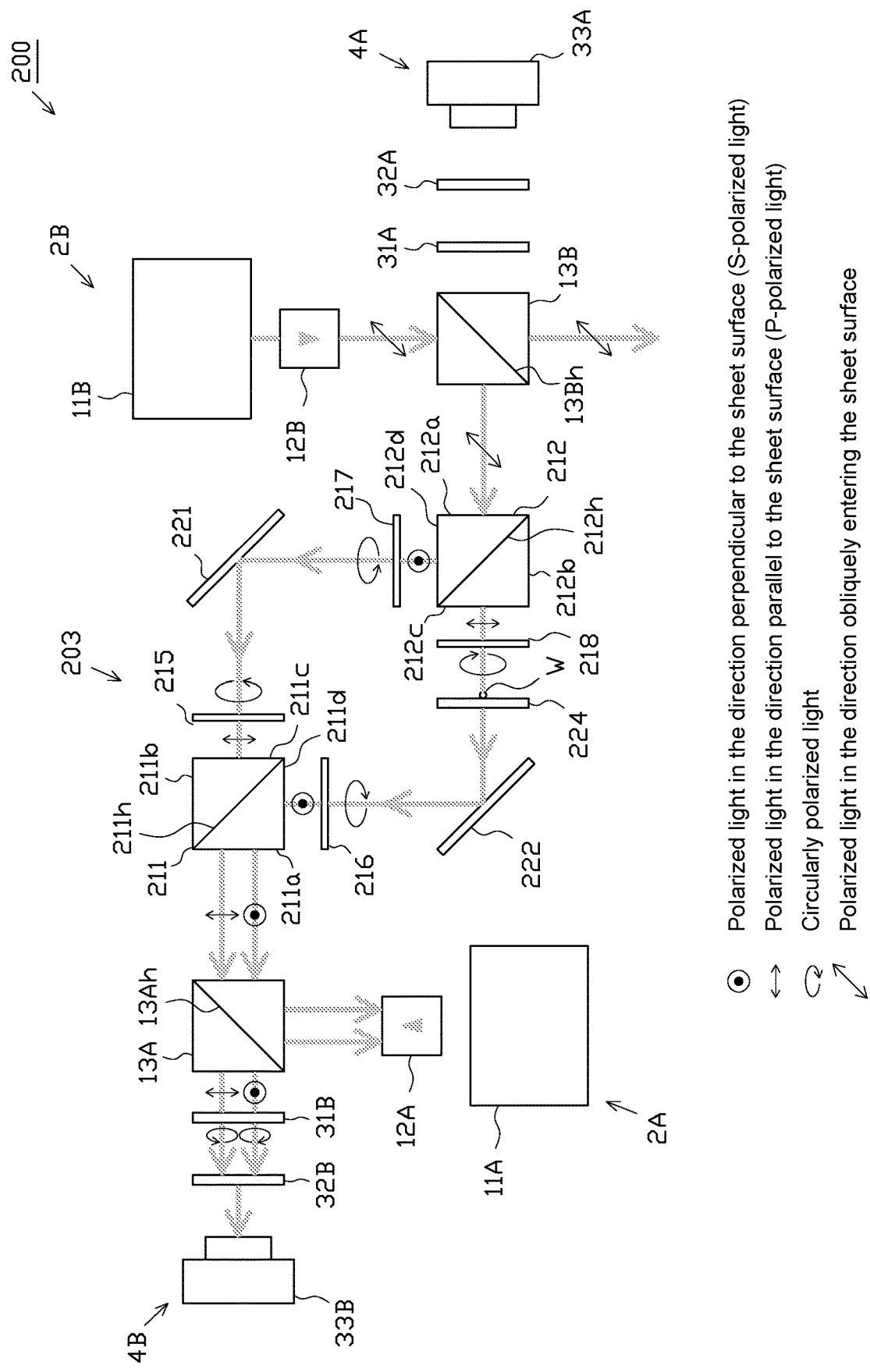
FIG. 10 is an optical path diagram illustrating an optical path of a second light according to one or more embodiments of the invention.

The optical path of the second light is then described with reference to FIG. 10. As shown in FIG. 10, the second light of the wavelength $\lambda_2$ (linearly polarized light having the polarizing direction that is inclined at 45 degrees to the X-axis direction and the Z-axis direction) is emitted downward in the Y-axis direction from the second light emitter 11B.

The second light emitted from the second light emitter 11B passes through the second light isolator 12B and enters the second non-polarizing beam splitter 13B. Part of the second light entering the second non-polarizing beam splitter 13B is transmitted downward in the Y-axis direction, while the remaining part is reflected leftward in the Z-axis direction.

The second light reflected leftward in the Z-axis direction (linearly polarized light having the polarizing direction that is inclined at 45 degrees relative to the X-axis direction and the Y-axis direction) enters the first surface 212a of the second polarizing beam splitter 212. The second light transmitted downward in the Y-axis direction, on the other hand, does not enter any optical system or the like but is left as waste light.

With regard to the second light entering the first surface 212a of the second polarizing beam splitter 212 leftward in the Z-axis direction, its S-polarized light component is reflected upward in the Y-axis direction and is emitted from the fourth surface 212d as the reference light, while its P-polarized light component is transmitted leftward in the Z-axis direction and is emitted from the third surface 212c as the measurement light.

The reference light (S-polarized light) of the second light emitted from the fourth surface 212d of the second polarizing beam splitter 212 passes through the third quarter wave plate 217 to be converted into counterclockwise circularly polarized light and is then reflected leftward in the Z-axis direction by the first total reflection mirror 221. In this process, the rotating direction relative to the traveling direction of light is maintained.

The reference light of the second light subsequently passes through the first quarter wave plate 215 to be converted from the counterclockwise circularly polarized light into P-polarized light and then enters the third surface 211c of the first polarizing beam splitter 211.

The measurement light (P-polarized light) of the second light emitted from the third surface 212c of the second polarizing beam splitter 212 passes through the fourth quarter wave plate 218 to be converted into clockwise circularly polarized light and is then transmitted through the work W placed on the placement structure 224. The measurement light of the second light is then reflected upward in the Y-axis direction by the second total reflection mirror 222. In this process, the rotating direction relative to the traveling direction of light is maintained.

The measurement light of the first light reflected by the second total reflection mirror 222 subsequently passes through the second quarter wave plate 216 to be converted from the clockwise circularly polarized light into S-polarized light and then enters the fourth surface 211d of the first polarizing beam splitter 211.

The reference light (P-polarized light) of the second light entering the third surface 211c of the first polarizing beam splitter 211 is transmitted leftward in the Z-axis direction through the joint surface 211h, while the measurement light (S-polarized light) of the second light entering the fourth surface 211d of the first polarizing beam splitter 211 is reflected leftward in the Z-axis direction by the joint surface 211h. The combined light generated by combining the reference light and the measurement light of the second light with each other is then emitted as the output light from the first surface 211a of the first polarizing beam splitter 211.

The combined light (reference light and measurement light) of the second light emitted from the first surface 211a of the first polarizing beam splitter 211 enters the first non-polarizing beam splitter 13A. Part of the combined light of the second light entering the first non-polarizing beam splitter 13A leftward in the Z-axis direction is transmitted leftward in the Z-axis direction, while the remaining part is reflected downward in the Y-axis direction. The combined light (reference light and measurement light) transmitted leftward in the Z-axis direction enters the second imaging system 4B. The combined light reflected downward in the Y-axis direction is, on the other hand, blocked by the first light isolator 12A to be left as waste light.

With regard to the combined light (reference light and measurement light) of the second light entering the second imaging system 4B, the quarter wave plate 31B converts the reference light component (P-polarized light component) into clockwise circularly polarized light, while converting the measurement light component (S-polarized light component) into counterclockwise circularly polarized light. The counterclockwise circularly polarized light and the clockwise circularly polarized light have different rotating directions and accordingly do not interfere with each other.

The combined light of the second light subsequently passes through the second polarizer 32B, so that the reference light component and the measurement light component interfere with each other in a phase corresponding to the angle of the second polarizer 32B. The image of the interfering light of the second light is then taken by the second camera 33B.

The following describes a procedure of shape measurement process performed by the control device 5 in detail. After placing the work W on the placement structure 224, the control device 5 sets the transmission axis direction of the first polarizer 32A of the first imaging system 4A at a predetermined reference position (for example, "0 degree"), while setting the transmission axis direction of the second polarizer 32B of the second imaging system 4B at a predetermined reference position (for example, "0 degree").

The control device 5 subsequently radiates the first light from the first projection optical system 2A and simultaneously radiates the second light from the second projection optical system 2B. As a result, the combined light (reference light and measurement light) of the first light is emitted from the first surface 212a of the second polarizing beam splitter 212 of the interference optical system 203, and simultaneously the combined light (reference light and measurement light) of the second light is emitted from the first surface 211a of the first polarizing beam splitter 211.

The image of the combined light of the first light emitted from the first surface 212a of the second polarizing beam splitter 212 is taken by the first imaging system 4A, and simultaneously the image of the combined light of the second light emitted from the first surface 211a of the first polarizing beam splitter 211 is taken by the second imaging system 4B.

The transmission axis direction of the first polarizer 32A and the transmission axis direction of the second polarizer 32B are both set to "0 degree", so that an interference fringe image of the first light in a phase of "0 degree" is taken by the first camera 33A, and an interference fringe image of the second light in a phase of "0 degree" is taken by the second camera 33B.

Image data taken by the respective cameras 33A and 33B are then output to the control device 5. The control device 5 stores the input image data into the image data storage device 54.

The control device 5 subsequently performs a switching process of the first polarizer 32A of the first imaging system 4A and the second polarizer 32B of the second imaging system 4B. For example, the first polarizer 32A and the second polarizer 32B are respectively rotated and shifted to a position having the transmission axis direction set at "45 degrees".

On completion of the switching process, the control device 5 performs a second imaging process in a similar manner to the series of first imaging process described above. For example, the control device 5 radiates the first light from the first projection optical system 2A and simultaneously radiates the second light from the second projection optical system 2B. The control device 5 subsequently causes the image of the combined light of the first light emitted from the first surface 212a of the second polarizing beam splitter 212 to be taken by the first imaging system 4A and simultaneously causes the image of the combined light of the second light emitted from the first surface 211a of the first polarizing beam splitter 211 to be taken by the second imaging system 4B. The control device 5 accordingly obtains an interference fringe image of the first light in a phase of "90 degree" and an interference fringe image of the second light in a phase of "90 degree".

After that, two more imaging processes similar to the first imaging process and the second imaging process described above are performed. For example, a third imaging process is performed with setting the transmission axis directions of the first polarizer 32A and the second polarizer 32B at "90 degrees", so as to obtain an interference fringe image of the first light in a phase of "180 degree" and an interference fringe image of the second light in a phase of "180 degree".

A fourth imaging process is then performed with setting the transmission axis directions of the first polarizer 32A and the second polarizer 32B at "135 degrees", so as to obtain an interference fringe image of the first light in a phase of "270 degree" and an interference fringe image of the second light in a phase of "270 degree".

All the image data required for three-dimensional measurement (total of eight different interference fringe image data including four different interference fringe image data with regard to the first light and four different interference fringe image data with regard to the second light) are obtained by performing the four imaging processes as described above.

The control device 5 subsequently measures the surface shape of the work W by a phase shift method, based on the four different interference fringe image data with regard to the first light and the four different interference fringe image data with regard to the second light stored in the image data storage device 54. For example, the control device 5 calculates height information at respective positions on the surface of the work W.

As described above in detail, one or more embodiments of the invention having the relatively simple configuration based on the principle of the Mach-Zehnder interferometer have the similar functions and advantageous effects to those of the aforementioned embodiments.

The following describes further embodiments of the invention with reference to the drawings. The like components to those of the aforementioned embodiments are expressed by the like reference signs, and their detailed description is omitted.

Figure 11:
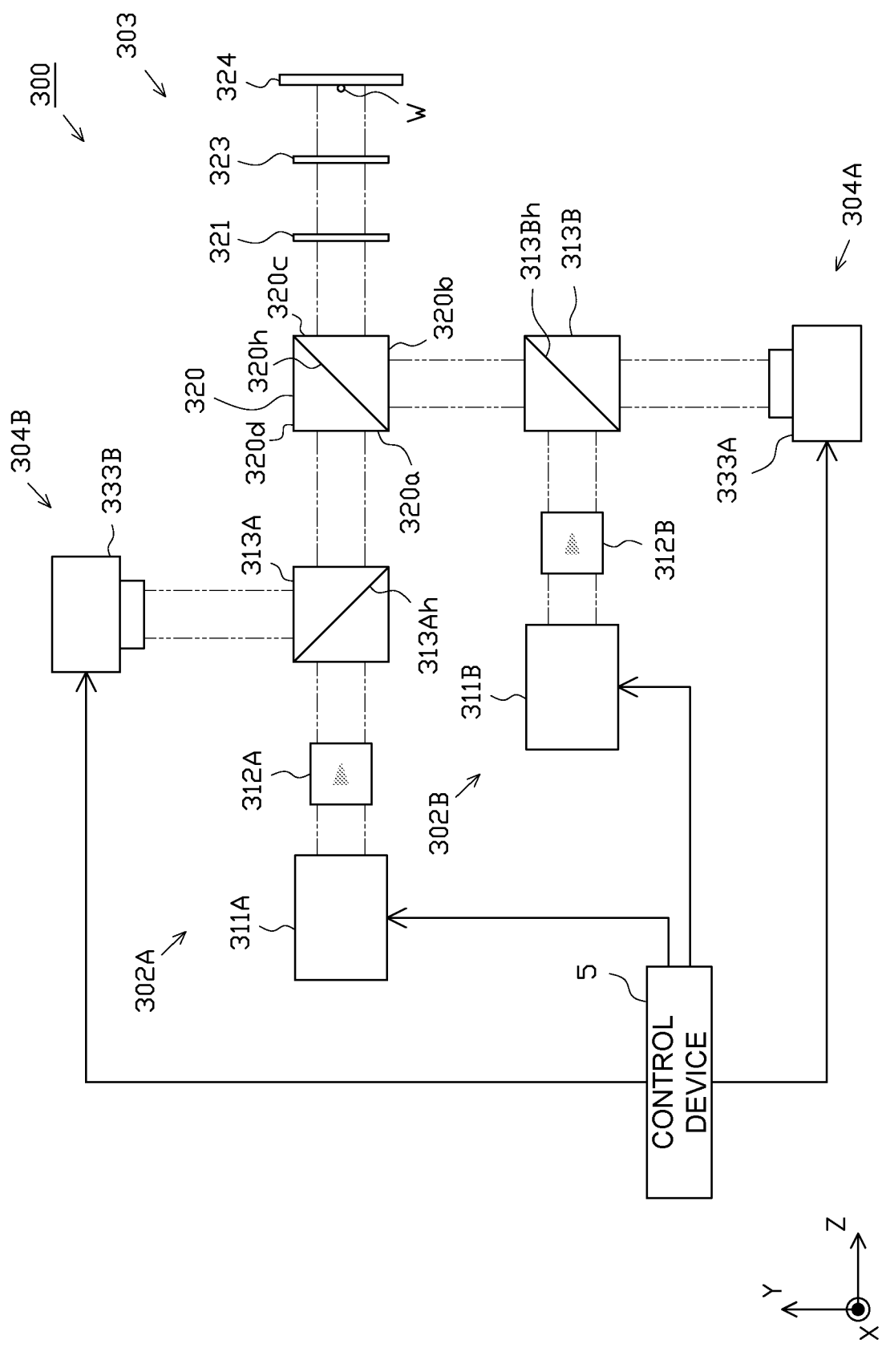
FIG. 11 is a schematic configuration diagram illustrating a three-dimensional measurement device according to one or more embodiments of the invention.

FIG. 11 is a diagram illustrating the schematic configuration of a three-dimensional measurement device 300 according to one or more embodiments of the invention. Hereinafter, as a matter of convenience, a front-back direction of the sheet surface of FIG. 1 is called "X-axis direction", a top-bottom direction of the sheet surface is called "Y-axis direction" and a left-right direction of the sheet surface is called "Z-axis direction".

The three-dimensional measurement device 300 is configured based on the principle of the Fizeau interferometer and includes two projection optical systems 302A and 302B (first projection optical system 302A and second projection optical system 302B) configured to emit lights of specific wavelengths, an interference optical system 303 configured to receive the lights respectively emitted from the projection optical systems 302A and 302B, two imaging systems 304A and 304B (first imaging system 304A and second imaging system 304B) configured to take images of the lights emitted from the interference optical system 303, and a control device 5 configured to perform various controls, image processing, calculations and the like involved in the projection optical systems 302A and 302B, the interference optical system 303, the imaging systems 304A and 304B and the like. The "control device 5" is configured as the "image processor" according to one or more embodiments of the invention, and the "interference optical system 303" is configured as the "predetermined optical system" according to one or more embodiments of the invention.

The configuration of the two projection optical systems 302A and 302B (first projection optical system 302A and second projection optical system 302B) is described first in detail. The first projection optical system 302A includes, for example, a first light emitter 311A, a first light isolator 312A and a first non-polarizing beam splitter 313A. The "first light emitter 311A" is configured as the "first irradiator" according to one or more embodiments of the invention.

Although not being illustrated, the first light emitter 311A includes, for example, a laser light source configured to output a linearly polarized light of a specific wavelength $\lambda_1$, a beam expander configured to expand the linearly polarized light output from the laser light source and emit the expanded light as parallel light, a polarizer configured to adjust the intensity and a half wave plate configured to adjust the polarizing direction.

According to one or more embodiments of the invention, a linearly polarized light of the wavelength $\lambda_1$ (for example, $\lambda_1$=1500 nm) having a polarizing direction that is the Y-axis direction is emitted rightward in the Z-axis direction from the first light emitter 311A. The "wavelength $\lambda_1$" corresponds to the "first wavelength" according to one or more embodiments of the invention. Hereinafter the light of the wavelength $\lambda_1$ emitted from the first light emitter 311A is called "first light".

The first light isolator 312A is an optical element configured to transmit only a light traveling in one direction (rightward in the Z-axis direction according to one or more embodiments of the invention) but block a light traveling in a reverse direction (leftward in the Z-axis direction according to one or more embodiments of the invention). This configuration allows for transmission of only the first light emitted from the first light emitter 311A and thereby prevents damage and destabilization of the first light emitter 311A by return light.

The first non-polarizing beam splitter 313A is a cube-shaped known optical member configured by joining right angle prisms together to be integrated, and its joint surface 313Ah is coated with, for example, a metal film. The "first non-polarizing beam splitter 313A" is configured as the "first light guiding unit" or "first light guide" according to one or more embodiments of the invention.

According to one or more embodiments of the invention, a linearly polarized light having a polarizing direction that is a direction parallel to the sheet surface of FIG. 11 (Y-axis direction or Z-axis direction) is called P-polarized light (P-polarized light component). A linearly polarized light having a polarizing direction that is the X-axis direction perpendicular to the sheet surface of FIG. 11 is called S-polarized light (S-polarized light component). The "P-polarized light" corresponds to the "first polarized light having the first polarizing direction". The "S-polarized light" corresponds to the "second polarized light having the second polarizing direction".

The first non-polarizing beam splitter 313A is arranged such that one of two surfaces adjoining to each other across the joint surface 313Ah is perpendicular to the Y-axis direction and the other of the two surfaces is perpendicular to the Z-axis direction. In other words, the joint surface 313Ah of the first non-polarizing beam splitter 313A is arranged to be inclined at 45 degrees to the Y-axis direction and the Z-axis direction. For example, the first non-polarizing beam splitter 313A is arranged to transmit part (half) of the first light that enters rightward in the Z-axis direction from the first light emitter 311A via the first light isolator 312A, rightward in the Z-axis direction and reflect the remaining part (remaining half) of the first light downward in the Y-axis direction.

The second projection optical system 302B includes, for example, a second light emitter 311B, a second light isolator 312B and a second non-polarizing beam splitter 313B. The "second light emitter 311B" is configured as the "second irradiator" according to one or more embodiments of the invention.

Like the first light emitter 311A described above, the second light emitter 311B includes, for example, a laser light source configured to output a linearly polarized light of a specific wavelength $\lambda 2$, a beam expander configured to expand the linearly polarized light output from the laser light source and emit the expanded light as parallel light, a polarizer configured to adjust the intensity and a half wave plate configured to adjust the polarizing direction.

According to one or more embodiments of the invention, a linearly polarized light of the wavelength $\lambda_2$ (for example, $\lambda_2$=1503 nm) having a polarizing direction that is the X-axis direction is emitted rightward in the Z-axis direction from the second light emitter 311B. The "wavelength $\lambda_2$" corresponds to the "second wavelength" according to one or more embodiments of the invention. Hereinafter the light of the wavelength $\lambda_2$ emitted from the second light emitter 311B is called "second light".

The second light isolator 312B is an optical element configured to transmit only a light traveling in one direction (rightward in the Z-axis direction according to one or more embodiments of the invention) but block a light traveling in a reverse direction (leftward in the Z-axis direction according to one or more embodiments of the invention). This configuration allows for transmission of only the second light emitted from the second light emitter 311B and thereby prevents damage and destabilization of the second light emitter 311B by return light.

The second non-polarizing beam splitter 313B is a cube-shaped known optical member configured by joining right angle prisms together to be integrated, and its joint surface 313Bh is coated with, for example, a metal film. The "second non-polarizing beam splitter 313B" is configured as the "second light guiding unit" or "second light guide" according to one or more embodiments of the invention.

The second non-polarizing beam splitter 313B is arranged such that one of two surfaces adjoining to each other across the joint surface 313Bh is perpendicular to the Y-axis direction and the other of the two surfaces is perpendicular to the Z-axis direction. In other words, the joint surface 313Bh of the second non-polarizing beam splitter 313B is arranged to be inclined at 45 degrees to the Y-axis direction and the Z-axis direction. For example, the second non-polarizing beam splitter 313B is arranged to transmit part (half) of the second light that enters rightward in the Z-axis direction from the second light emitter 311B via the second light isolator 312B, rightward in the Z-axis direction and reflect the remaining part (remaining half) of the second light upward in the Y-axis direction.

The following describes the configuration of the interference optical system 303 in detail. The interference optical system 303 includes, for example, a polarizing beam splitter 320, a quarter wave plate 321, a half mirror 323 and a placement structure 324.

The polarizing beam splitter 320 is a cube-shaped known optical member configured by joining right angle prisms together to be integrated, and its joint surface (boundary surface) 320h is coated with, for example, a dielectric multilayer film.

According to one or more embodiments of the invention, the polarizing beam splitter 320 is configured to transmit the P-polarized light component and reflect the S-polarized light component.

The polarizing beam splitter 320 is arranged such that one of two surfaces adjoining to each other across the joint surface 320h is perpendicular to the Y-axis direction and the other of the two surfaces is perpendicular to the Z-axis direction. In other words, the joint surface 320h of the polarizing beam splitter 320 is arranged to be inclined at 45 degrees to the Y-axis direction and the Z-axis direction.

For example, a first surface (left side face in the Z-axis direction) 320a of the polarizing beam splitter 320, which the first light transmitted rightward in the Z-axis direction through the first non-polarizing beam splitter 313A enters, and a third surface (right side face in the Z-axis direction) 320c opposed to the first surface 320a are arranged to be perpendicular to the Z-axis direction. The "first surface 320a of the polarizing beam splitter 320" corresponds to the "first input-output element" according to one or more embodiments of the invention.

A second surface (lower side face in the Y-axis direction) 320b of the polarizing beam splitter 320, which is a surface adjoining to the first surface 320a across the joint surface 320h and which the second light reflected upward in the Y-axis direction from the second non-polarizing beam splitter 313B enters, and a fourth surface (upper side face in the Y-axis direction) 320d opposed to the second surface 320b are arranged to be perpendicular to the Y-axis direction. The "second surface 320b of the polarizing beam splitter 320" corresponds to the "second input-output element" according to one or more embodiments of the invention.

The quarter wave plate 321 is placed to be opposed in the Z-axis direction to the third surface 320c of the polarizing beam splitter 320. The half mirror 323 is placed on the right side in the Z-axis direction of the quarter wave plate 321 to be opposed in the Z-axis direction to the quarter wave plate 321. The placement structure 324 is placed on the right side in the Z-axis direction of the half mirror 323 to be opposed in the Z-axis direction to the half mirror 323. Strictly speaking, the half mirror 323 is arranged to be slightly inclined to the Z-axis direction, in order to generate periodical interference fringes (carrier).

The quarter wave plate 321 serves to convert a linearly polarized light into a circularly polarized light and to convert a circularly polarized light into a linearly polarized light. Accordingly, the linearly polarized light (P-polarized light or S-polarized light) emitted from the third surface 320c of the polarizing beam splitter 320 is converted into the circularly polarized light by the quarter wave plate 321 and is radiated to the half mirror 323.

The half mirror 323 is configured to split the incident light into a transmitted light and a reflected light at a ratio of 1:1. For example, the half mirror 323 causes part (half) of the circularly polarized light entering rightward in the Z-axis direction from the quarter wave plate 321 to be transmitted rightward in the Z-axis direction as measurement light and causes the remaining part (remaining half) of the circularly polarized light to be reflected leftward in the Z-axis direction as reference light. The circularly polarized light (measurement light) transmitted through the half mirror 323 is radiated to the work W as a measurement object placed on the placement structure 324. The "half mirror 323" is accordingly configured as the "reference surface" according to one or more embodiments of the invention. The "half mirror 323" is also configured as the "splitting unit" to split a predetermined incident light into two lights and is also configured as the "combining unit" to recombine the two lights.

The following describes the configuration of the two imaging systems 304A and 304B (first imaging system 304A and second imaging system 304B) in detail. The first imaging system 304A includes a first camera 333A configured as the first imaging unit, and the second imaging system 304B includes a second camera 333B configured as the second imaging unit.

Each of the cameras 333A and 333B has a known configuration including a lens, an imaging element and the like. According to one or more embodiments of the invention, a CCD area sensor is employed as the imaging elements of the cameras 333A and 333B. The imaging element is, however, not limited to the embodiments described above. For example, a CMOS area sensor may be employed as the imaging element.

Image data taken by the respective cameras 333A and 333B are converted into digital signals inside of the respective cameras 333A and 333B and are input in the form of digital signals into the control device 5 (image data storage device 54).

The following describes the functions of the three-dimensional measurement device 300. Radiation of the first light and radiation of the second light are performed simultaneously according to the embodiments as described later. The optical path of the first light and the optical path of the second light partly overlap each other. For the better understanding, the optical path of the first light and the optical path of the second light are illustrated in different drawings and are described individually.

Figure 12:
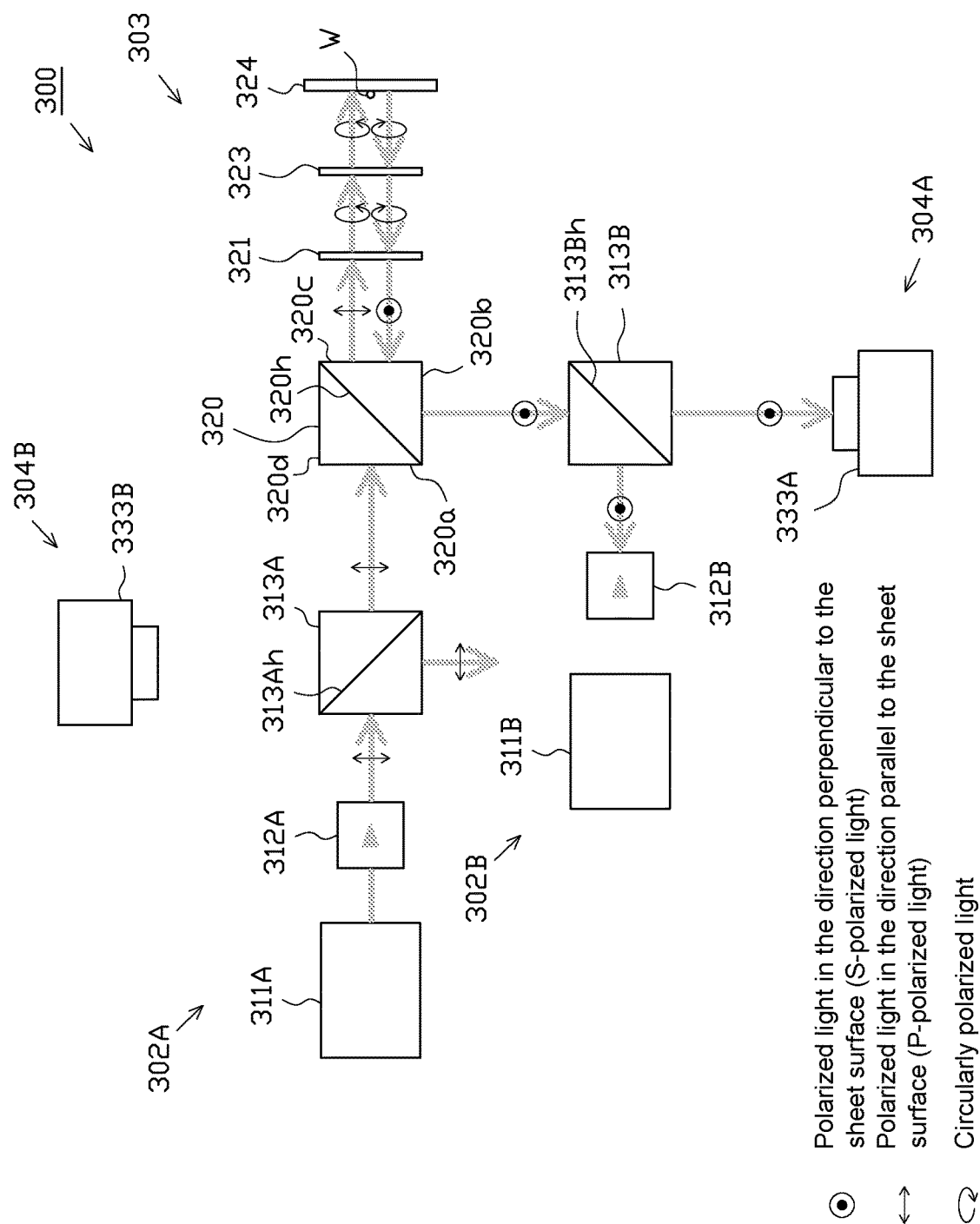
FIG. 12 is an optical path diagram illustrating an optical path of a first light according to one or more embodiments of the invention.

The optical path of the first light is described first with reference to FIG. 12. As shown in FIG. 12, the first light of the wavelength $\lambda_1$ (P-polarized light having the polarizing direction that is the Y-axis direction) is emitted rightward in the Z-axis direction from the first light emitter 311A.

The first light emitted from the first light emitter 311A passes through the first light isolator 312A and enters the first non-polarizing beam splitter 313A. Part of the first light entering the first non-polarizing beam splitter 313A is transmitted rightward in the Z-axis direction, while the remaining part is reflected downward in the Y-axis direction.

The first light transmitted rightward in the Z-axis direction enters the first surface 320a of the polarizing beam splitter 320. The first light reflected downward in the Y-axis direction, on the other hand, does not enter any optical system or the like but is left as waste light.

The first light (P-polarized light) entering the first surface 320a of the polarizing beam splitter 320 rightward in the Z-axis direction is transmitted rightward in the Z-axis direction through the joint surface 320h and is emitted from the third surface 320c.

The first light emitted from the third surface 320c of the polarizing beam splitter 320 passes through the quarter wave plate 321 to be converted from the P-polarized light having the polarizing direction that is the Y-axis direction into clockwise circularly polarized light and is radiated to the half mirror 323.

Part (half) of the first light radiated to the half mirror 323 is transmitted rightward in the Z-axis direction through the half mirror 323 as measurement light, while the remaining part is reflected leftward in the Z-axis direction as reference light. In this process, the rotating directions (clockwise) of the transmitted light (measurement light) and the reflected light (reference light) relative to the traveling direction of light are maintained.

The measurement light (clockwise circularly polarized light) of the first light transmitted rightward in the Z-axis direction through the half mirror 323 is radiated to the work W placed on the placement structure 324 to be reflected by the work W. In this process, the rotating direction (clockwise) relative to the traveling direction of light is also maintained.

The measurement light of the first light reflected by the work W again passes through the half mirror 323 leftward in the Z-axis direction and is combined with the reference light (clockwise circularly polarized light) of the first light reflected leftward in the Z-axis direction by the half mirror 323. Combining the measurement light and the reference light that are the circularly polarized lights having the same clockwise rotating direction causes interference between the measurement light and the reference light.

The interfering light of the first light then passes through the quarter wave plate 321 to be converted from the clockwise circularly polarized light into S-polarized light having the polarizing direction that is the X-axis direction and reenters the third surface 320c of the polarizing beam splitter 320.

The interfering light (S-polarized light) of the first light reentering the third surface 320c of the polarizing beam splitter 320 is reflected downward in the Y-axis direction by the joint surface 320h and is emitted from the second surface 320b of the polarizing beam splitter 320 as the output light.

The interfering light of the first light emitted from the second surface 320b of the polarizing beam splitter 320 enters the second non-polarizing beam splitter 313B. Part of the interfering light of the first light entering the second non-polarizing beam splitter 313B downward in the Y-axis direction is transmitted downward in the Y-axis direction, while the remaining part of the interfering light is reflected leftward in the Z-axis direction. The interfering light transmitted downward in the Y-axis direction enters the first imaging system 304A (first camera 333A) to be imaged. The interfering light reflected leftward in the Z-axis direction is, on the other hand, blocked by the second light isolator 312B to be left as waste light.

Figure 13:
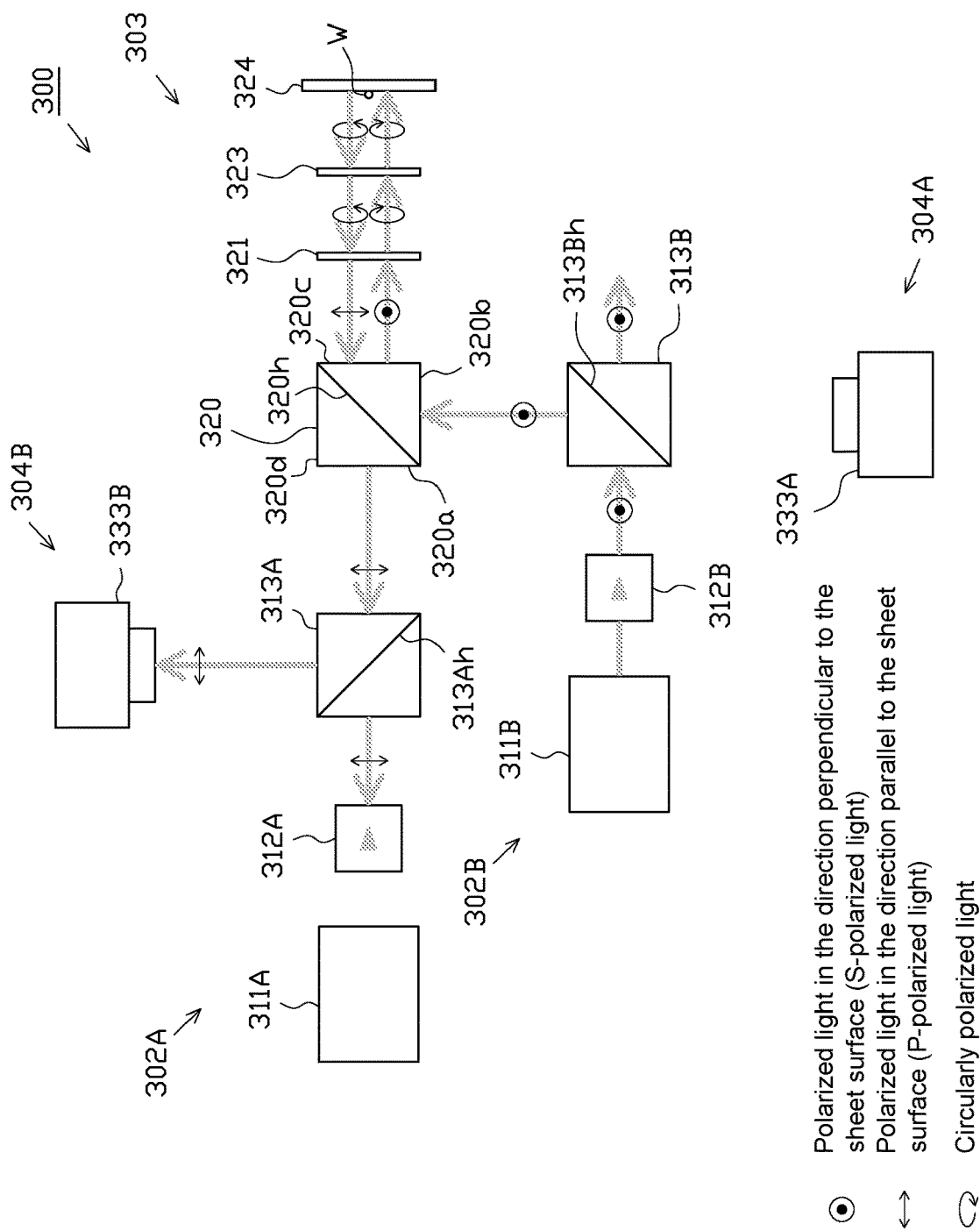
FIG. 13 is an optical path diagram illustrating an optical path of a second light according to one or more embodiments of the invention.

The optical path of the second light is then described with reference to FIG. 13. As shown in FIG. 13, the second light of the wavelength $\lambda_2$ (S-polarized light having the polarizing direction that is the X-axis direction) is emitted rightward in the Z-axis direction from the second light emitter 312A.

The second light emitted from the second light emitter 312A passes through the second light isolator 312B and enters the second non-polarizing beam splitter 313B. Part of the second light entering the second non-polarizing beam splitter 313B is transmitted rightward in the Z-axis direction, while the remaining part is reflected upward in the Y-axis direction.

The second light reflected upward in the Y-axis direction enters the second surface 320b of the polarizing beam splitter 320. The second light transmitted rightward in the Z-axis direction, on the other hand, does not enter any optical system or the like but is left as waste light.

The second light (S-polarized light) entering the second surface 320b of the polarizing beam splitter 320 upward in the Y-axis direction is reflected rightward in the Z-axis direction by the joint surface 320h and is emitted from the third surface 320c.

The second light emitted from the third surface 320c of the polarizing beam splitter 320 passes through the quarter wave plate 321 to be converted from the S-polarized light having the polarizing direction that is the X-axis direction into counterclockwise circularly polarized light and is radiated to the half mirror 323.

Part (half) of the second light radiated to the half mirror 323 is transmitted rightward in the Z-axis direction through the half mirror 323 as measurement light, while the remaining part is reflected leftward in the Z-axis direction as reference light. In this process, the rotating directions (counterclockwise) of the transmitted light (measurement light) and the reflected light (reference light) relative to the traveling direction of light are maintained.

The measurement light (counterclockwise circularly polarized light) of the second light transmitted rightward in the Z-axis direction through the half mirror 323 is radiated to the work W placed on the placement structure 324 to be reflected by the work W. In this process, the rotating direction (counterclockwise) relative to the traveling direction of light is also maintained.

The measurement light of the second light reflected by the work W again passes through the half mirror 323 leftward in the Z-axis direction and is combined with the reference light (counterclockwise circularly polarized light) of the second light reflected leftward in the Z-axis direction by the half mirror 323. Combining the measurement light and the reference light that are the circularly polarized lights having the same counterclockwise rotating direction causes interference between the measurement light and the reference light.

The interfering light of the second light then passes through the quarter wave plate 321 to be converted from the counterclockwise circularly polarized light into P-polarized light having the polarizing direction that is the Y-axis direction and reenters the third surface 320c of the polarizing beam splitter 320.

The interfering light (P-polarized light) of the second light reentering the third surface 320c of the polarizing beam splitter 320 is transmitted leftward in the Z-axis direction through the joint surface 320h and is emitted from the first surface 320a of the polarizing beam splitter 320 as the output light.

The interfering light of the second light emitted from the first surface 320a of the polarizing beam splitter 320 enters the first non-polarizing beam splitter 313A. Part of the interfering light of the second light entering the first non-polarizing beam splitter 313A leftward in the Z-axis direction is transmitted leftward in the Z-axis direction, while the remaining part of the interfering light is reflected upward in the Y-axis direction. The interfering light reflected upward in the Y-axis direction enters the second imaging system 304B (second camera 333B) to be imaged. The interfering light transmitted leftward in the Z-axis direction is, on the other hand, blocked by the first light isolator 312A to be left as waste light.

The following describes a procedure of shape measurement process performed by the control device 5 in detail. After placing the work W on the placement structure 324, the control device 5 radiates the first light from the first projection optical system 302A and simultaneously radiates the second light from the second projection optical system 302B. This results in emitting the interfering light of the first light from the second surface 320b of the polarizing beam splitter 320 of the interference optical system 303 and simultaneously emitting the interfering light of the second light from the first surface 320a of the polarizing beam splitter 320.

The image of the interfering light of the first light emitted from the second surface 320b of the polarizing beam splitter 320 is taken by the first imaging system 304A, and simultaneously the image of the interfering light of the second light emitted from the first surface 320a of the polarizing beam splitter 320 is taken by the second imaging system 304B.

Image data taken by the respective cameras 333A and 333B are respectively output the control device 5. The control device 5 stores the input image data into the image data storage device 54.

The control device 5 then measures the surface shape of the work W by a Fourier transform method, based on interference fringe image data with regard to the first light and interference fringe image data with regard to the second light stored in the image data storage device 54. For example, the control device 5 calculates height information at respective positions on the surface of the work W.

The following describes the principle of height measurement by a standard Fourier transform method. An interference fringe intensity of the interference fringe image data of the first light or the second light at an identical coordinate position (x,y), i.e., a luminance g(x,y), is expressed by a relational expression of [Math. 11] given below:

$$g(x,y)=a(x,y)+b(x,y)\cos[2\pi(f_{x0}x+f_{y0}y)+\phi(x,y)] \quad \text{[Math. 11]}$$

Here a(x,y) denotes an offset, b(x,y) denotes an amplitude, φ(x,y) denotes a phase, $f_{x0}$ denotes a carrier frequency in an x direction, and $f_{y0}$ denotes a carrier frequency in a y direction.

Two-dimensional space frequency spectra are obtained by two-dimensional Fourier transform of the luminance g(x,y). One of the left and right spectra is left, is shifted to the center and is then subjected to inverse Fourier transform.

The shifted spectrum is expressed by a relational expression of [Math. 12] given below, and the phase at each coordinate is determined by solving this relational expression with regard to the phase φ:

$$c(x,y)=\tfrac{1}{2}b(x,y)\exp[i\phi(x,y)] \quad \text{[Math. 12]}$$

Here c(x,y) denotes a spectrum.

When two different lights having different wavelengths are used, like the embodiments described above, a phase $\phi_1(\xi,\eta)$ of the first light at coordinates (ξ,η) on a surface of the work W is calculated, based on a luminance $g_1(x,y)$ of the interference fringe image data with regard to the first light of the wavelength $\lambda_1$.

Similarly, a phase $\phi_2(\xi,\eta)$ of the second light at the coordinates (ξ,η) on the surface of the work W is calculated, based on a luminance $g_2(x,y)$ of the interference fringe image data with regard to the second light of the wavelength $\lambda_2$.

Height information z(ξ,η) at the coordinates (ξ,η) on the surface of the work W is then calculated from the phase $\phi_1(\xi,\eta)$ of the first light and the phase $\phi_2(\xi,\eta)$ of the second light obtained as described above. The measurement results (height information) of the work W thus determined are stored in the calculation result storage device 55 of the control device 5.

As described above in detail, one or more embodiments of the invention having the relatively simple configuration based on the principle of the Fizeau interferometer have the similar functions and advantageous effects to those of the aforementioned embodiments.

Figure 14:
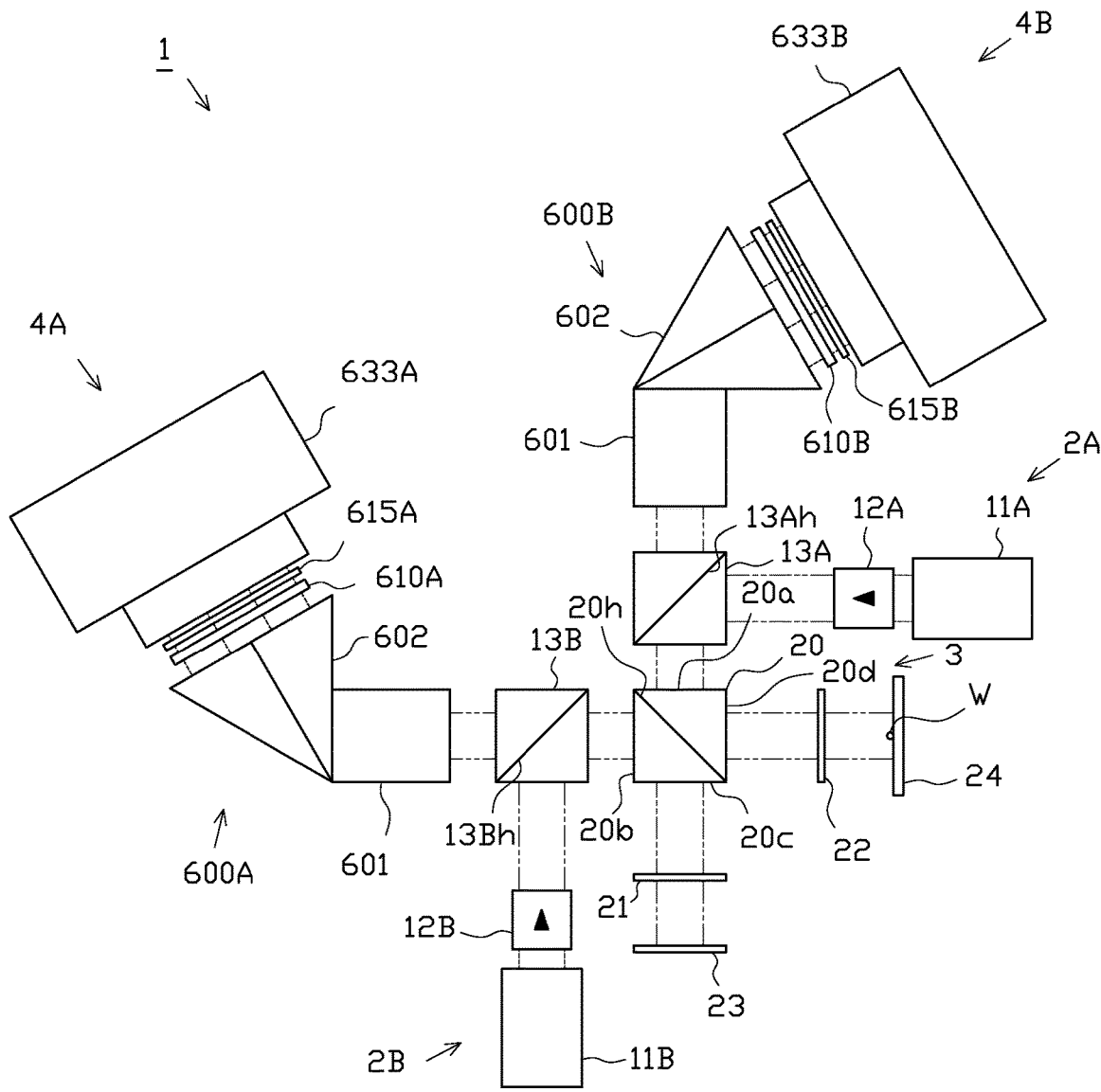
FIG. 14 is a schematic configuration diagram illustrating a three-dimensional measurement device according to one or more embodiments of the invention.

The following describes further embodiments of the invention with reference to the drawings. FIG. 14 is a diagram illustrating the schematic configuration of a three-dimensional measurement device according to one or more embodiments of the invention.

The following embodiments include spectral optical systems different from those of the aforementioned embodiments and have a different configuration involved in the first imaging system 4A and the second imaging system 4B from that of the aforementioned embodiments that employs the optical configuration of the Michelson interferometer. Different components from those of the aforementioned embodiments are described in detail. The like components are expressed by the like reference signs, and their detailed description is omitted.

The first imaging system 4A according to one or more embodiments of the invention includes a spectral optical system 600A configured as the first spectroscopic unit or first spectroscope to split the combined light (reference light component and measurement light component) of the first light transmitted through the second non-polarizing beam splitter 13B into four split lights, a quarter wave plate 610A configured to convert each of the four split lights split by the spectral optical system 600A into circularly polarized light, a filter unit 615A configured to selectively transmit predetermined components of the four split lights transmitted through the quarter wave plate 610A, and a camera 633A configured to simultaneously take images of the four split lights transmitted through the filter unit 615A.

The second imaging system 4B according to one or more embodiments of the invention includes a spectral optical system 600B configured as the second spectroscopic unit or second spectroscope to split the combined light (reference light component and measurement light component) of the second light transmitted through the first non-polarizing beam splitter 13A into four split lights, a quarter wave plate 610B configured to convert each of the four split lights split by the spectral optical system 600B into circularly polarized light, a filter unit 615B configured to selectively transmit predetermined components of the four split lights transmitted through the quarter wave plate 610B, and a camera 633B configured to simultaneously take images of the four split lights transmitted through the filter unit 615B.

The "quarter wave plate 610A" and the "quarter wave plate 610B" have similar configurations to those of the "quarter wave plate 31A" and the "quarter wave plate 31B" of the embodiments described above, and their detailed description is omitted. A modified configuration may include quarter wave plates provided individually corresponding to the four split lights.

The "filter unit 615A" and the "filter unit 615B" are configured as the filtering unit or filter and the interfering unit of one or more embodiments of the invention. The "filter unit 615A" and the "filter unit 615B" have similar configurations to that of the "filter unit 126" of the embodiments described above, and their detailed description is omitted. A modified configuration may include four polarizers (polarizers 126a, 126b, 126c and 126d) that have different transmission axis directions by 45 degrees each and that are provided individually corresponding to the four split lights.

The configuration involved in the "camera 633A", the "camera 633B", the control process with regard to these cameras, the image data storage device 54 and the like is similar to the configuration involved in the "first camera 33A (imaging element 33Ai)", the "second camera 33B" and the like of the embodiments described above, and their detailed description is omitted.

The following describes the configurations of the spectral optical system 600A and the spectral optical system 600B in detail with reference to FIGS. 15 to 18. According to one or more embodiments of the invention, the spectral optical system 600A and the spectral optical system 600B have identical configurations.

Figure 15:
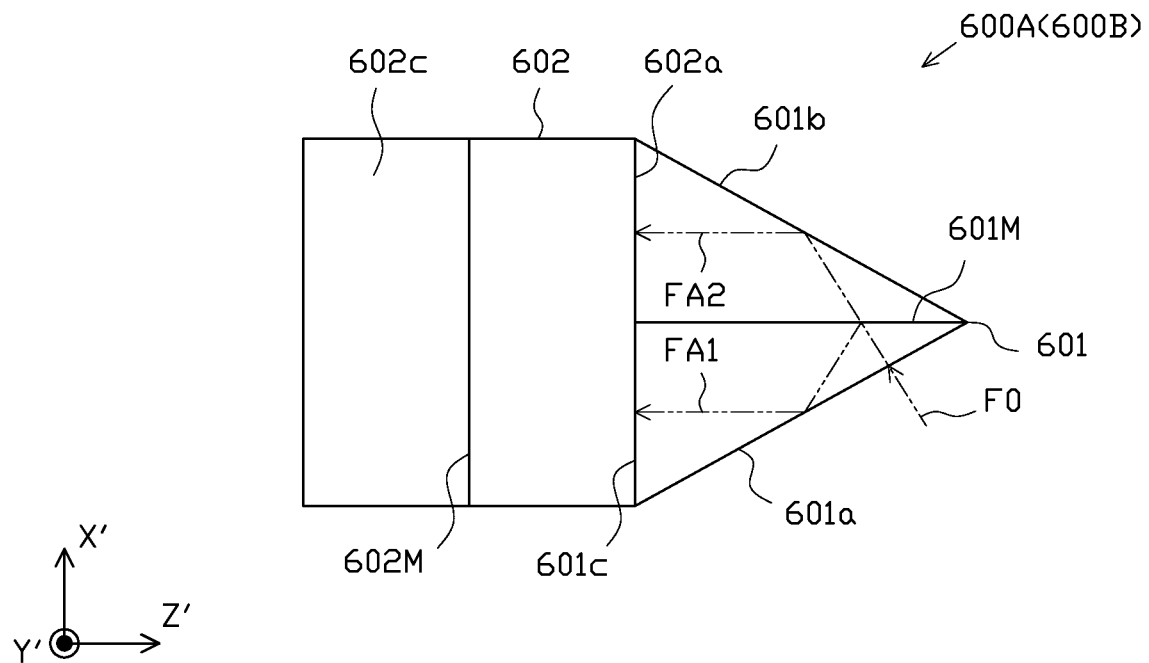
FIG. 15 is a plan view illustrating a spectral optical system according to one or more embodiments of the invention.

In the following description of the spectral optical system 600A (600B) with reference to FIGS. 15 to 18, as a matter of convenience, a top-bottom direction of the sheet surface of FIG. 15 is called "X'-axis direction", a front-back direction of the sheet surface of FIG. 15 is called "Y'-axis direction" and a left-right direction of the sheet surface of FIG. 15 is called "Z'-axis direction". The coordinate system (X', Y', Z') used for describing the spectral optical system 600A (600B) alone is, however, a different coordinate system from the coordinate system (X, Y, Z) used for describing the entire three-dimensional measurement device 1.

The spectral optical system 600A (600B) is one non-polarizing optical member configured by joining two non-polarizing optical members (prisms) together to be integrated.

For example, the spectral optical system 600A (600B) includes a first prism 601 configured to split the combined light of the first light (the combined light of the second light) transmitted through the second non-polarizing beam splitter 13A (through the first non-polarizing beam splitter 13A) into two split lights, and a second prism 602 configured to further split each of the two split lights split by the first prism 601 into two split lights and emit a total of four split lights.

The first prism 601 and the second prism 602 are respectively configured by known optical members called Koester prisms. According to one or more embodiments of the invention, the "Koester prism" denotes an "optical member of an equilateral triangular prism having an equilateral triangular sectional shape that is configured by joining a pair of optical members (triangular prisms) having a right triangular sectional shape with inner angles of 30 degrees, 60 degrees and 90 degrees, together to be integrated and that is provided with a non-polarizing half mirror on its joint surface". The Koester prism used for the respective prisms 601 and 602 is, however, not limited to the embodiments described above. Any optical member (Koester prism) that satisfies the functions of the spectral optical system 600A (600B) described later and that is different from that of the embodiments described above, for example, an optical member of non-equilateral triangular prism, may be employed for the respective prisms 601 and 602.

For example, the first prism 601 as the first optical member (first Koester prism) is an equilateral triangular prism that is in an equilateral triangular shape in the plan view (X'-Z' plane) and that is extended along the Y'-axis direction (as shown in FIG. 15). The X'-Z' plane" of one or more embodiments of the invention corresponds to the "first plane".

The first prism 601 has three rectangular surfaces along the Y'-axis direction (first surface 601a, second surface 601b and third surface 601c) and is provided with a half mirror 601M formed along a plane that goes through a line of intersection between the first surface 601a and the second surface 601b and is perpendicular to the third surface 601c. The "half mirror 601M" is configured as the "first splitting unit" or "first splitter" according to one or more embodiments of the invention.

The first prism 601 is arranged such that the third surface 601c is extended along an X'-Y' plane and is perpendicular to the Z'-axis direction and that the half mirror 601 is extended along a Y'-Z' plane and is perpendicular to the X'-axis direction. Accordingly the first surface 601a and the second surface 601b are respectively arranged to be inclined at 30 degrees or at 60 degrees to the X'-axis direction and the Z'-axis direction.

Figure 16:
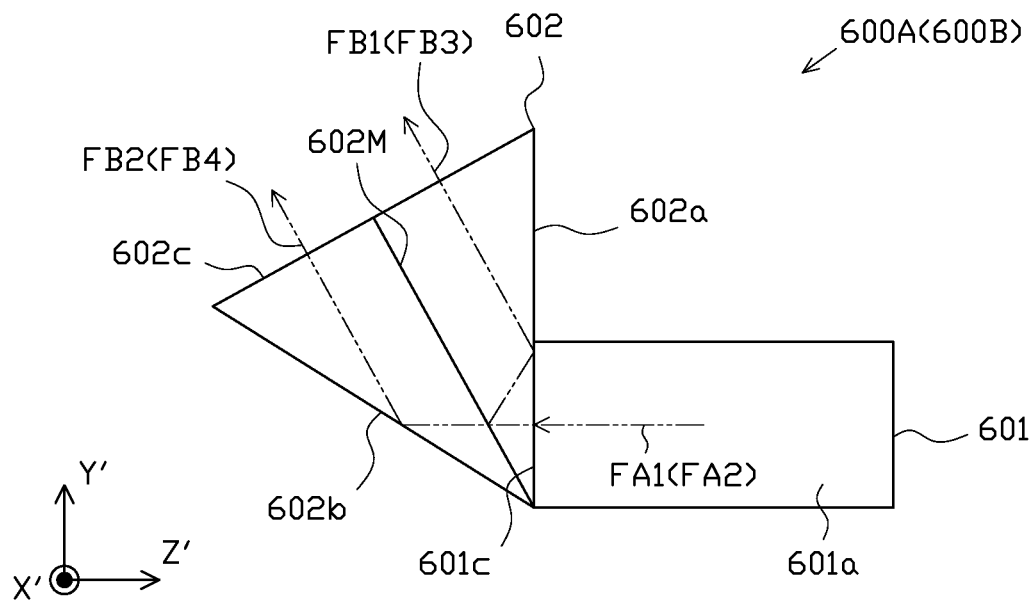
FIG. 16 is a front view illustrating the spectral optical system according to one or more embodiments of the invention.

The second prism 602 as the second optical member (second Koester prism) is, on the other hand, an equilateral triangular prism that is in an equilateral triangular shape in the plan view (Y'-Z' plane) and that is extended along the X'-axis direction (as shown in FIG. 16). The Y'-Z' plane" of one or more embodiments of the invention corresponds to the "second plane".

The second prism 602 has three rectangular surfaces along the X'-axis direction (first surface 602a, second surface 602b and third surface 602c) and is provided with a half mirror 602M formed along a plane that goes through a line of intersection between the first surface 602a and the second surface 602b and is perpendicular to the third surface 602c. The "half mirror 602M" is configured as the "second splitting unit" or "second splitter" according to one or more embodiments of the invention.

The second prism 602 is arranged such that the first surface 602a is extended along the X'-Y' plane and is perpendicular to the Z'-axis direction. Accordingly the second surface 602b, the third surface 602c and the half mirror 602M are respectively arranged to be inclined at 30 degrees or at 60 degrees to the Y'-axis direction and the Z'-axis direction.

The third surface 601c of the first prism 601 and the first surface 602a of the second prism 602 are joined with each other. For example, the first prism 601 and the second prism 602 are joined with each other in a direction such that the plane including the half mirror 601M (Y'-Z' plane) is perpendicular to the plane including the half mirror 602M.

Figure 17:
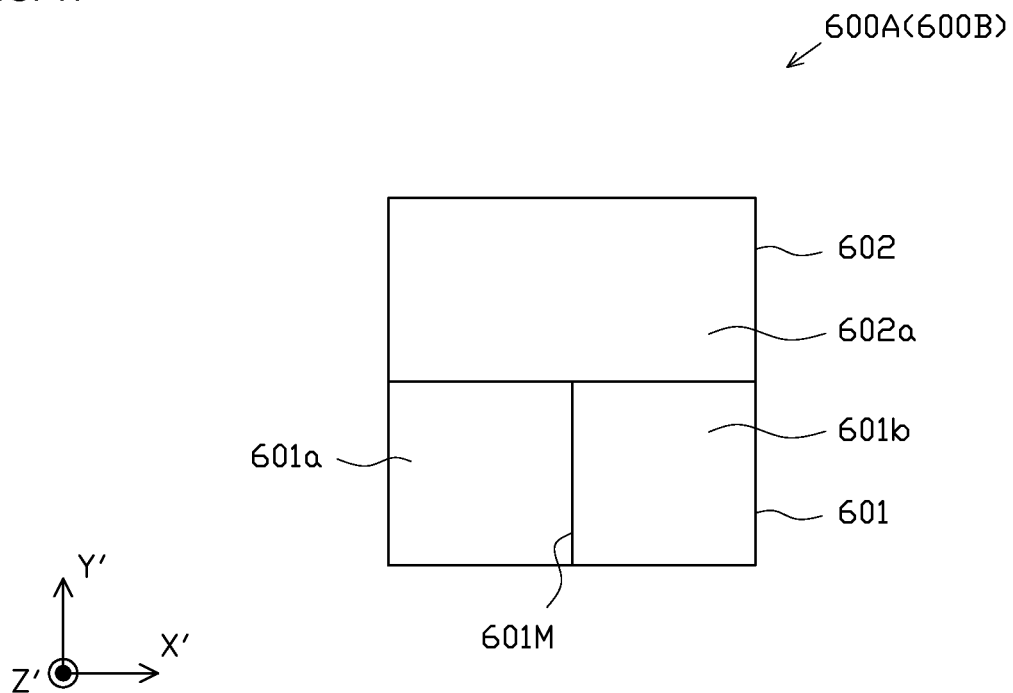
FIG. 17 is a right side view illustrating the spectral optical system according to one or more embodiments of the invention.
Figure 18:
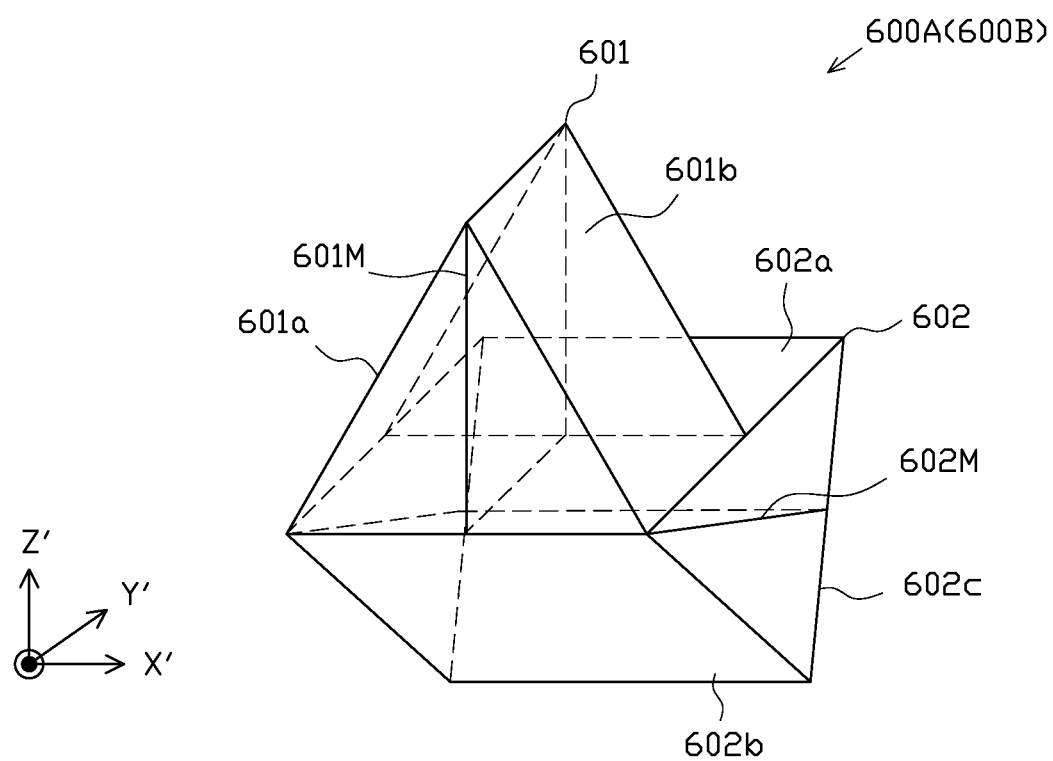
FIG. 18 is a perspective view illustrating the spectral optical system according to one or more embodiments of the invention.

The length in the X'-axis direction of the third surface 601c of the first prism 601 is equal to the length in the X'-axis direction of the first surface 602a of the second prism 602 (as shown in FIG. 15). The length in the Y'-axis direction of the third surface 601c of the first prism 601 is, on the other hand, half the length in the Y'-axis direction of the first surface 602a of the second prism 602 (as shown in FIGS. 16 and 17). The third surface 601c of the first prism 601 is joined along a line of intersection between the first surface 602a and the second surface 602b of the second prism 602 (as shown in, for example, FIG. 18).

Each of the prisms 601 and 602 is made of an optical material (for example, glass or acrylic resin) having a predetermined refractive index higher than the refractive index of the air. These prisms 601 and 602 may be made of an identical material or made of different materials. The material of each of the prisms 601 and 602 may be selected arbitrarily as long as the material satisfies the functions of the spectral optical system 600A (600B) described later.

The following describes the functions of the spectral optical system 600A and the spectral optical system 600B in detail with reference to the drawings. As described above, the spectral optical system 600A and the spectral optical system 600B respectively used in the first imaging system 4A and in the second imaging system 4B have identical configurations. Accordingly the following describes the spectral optical system 600A of the first imaging system 4A as an example, with omission of description on the spectral optical system 600B of the second imaging system 4B.

The spectral optical system 600A is arranged such that a combined light F0 of the first light transmitted through the second non-polarizing beam splitter 13B vertically enters the first surface 601a of the first prism 601 (as shown in FIGS. 14 and 15). For the simplicity of illustration, however, the first imaging system 4A is illustrated in FIG. 14 in such a manner that the front surface of the spectral optical system 600A faces the front side.

The combined light F0 entering the first prism 601 through the first surface 601a is split in two different directions by the half mirror 601M. For example, the combined light F0 is split into a split light FA1 that is reflected by the half mirror 601M toward the first surface 601a and a split light FA2 that is transmitted through the half mirror 601M toward the second surface 601b.

The split light FA1 reflected by the half mirror 601M is totally reflected at the first surface 601a toward the third surface 601c and is emitted vertically from the third surface 601c. The split light FA1 transmitted through the half mirror 601M is, on the other hand, totally reflected at the second surface 601b toward the third surface 601c and is emitted vertically from the third surface 601c. The two parallel split lights FA1 and FA2 are accordingly emitted from the third surface 601c of the first prism 601.

The respective split lights FA1 and FA2 emitted from the third surface 601c of the first prism 601 vertically enter the first surface 602a of the second prism 602 (as shown in FIG. 16).

Each of the split lights FA1 and FA2 entering the second prism 602 through the first surface 602a is split in two different directions by the half mirror 602M.

For example, one split light FA1 is split into a split light FB1 that is reflected by the half mirror 602M toward the first surface 602a and a split light FB2 that is transmitted through the half mirror 602M toward the second surface 602b.

The other split light FA2 is split into a split light FB3 that is reflected by the half mirror 602M toward the first surface 602a and a split light FB4 that is transmitted through the half mirror 602M toward the second surface 602b.

The respective split lights FB1 and FB3 reflected by the half mirror 602M are totally reflected at the first surface 602a toward the third surface 602c and are emitted vertically from the third surface 602c. The respective split lights FB2 and FB4 transmitted through the half mirror 602M are, on the other hand, totally reflected at the second surface 602b toward the third surface 602c and are emitted vertically from the third surface 602c. The four lights FB1 to FB4 arrayed in two by two matrix are accordingly emitted in parallel from the third surface 602c of the second prism 602.

The four split lights FB1 to FB4 emitted from the spectral optical system 600A (from the third surface 602c of the second prism 602) are respectively converted into circularly polarized lights by the quarter wave plate 610A and enter the respective polarizers 126a to 126d arranged in matrix in the filter unit 615A.

The four split lights FB1 to FB4 transmitted through the filter unit 615A form interfering lights having phases that differ by 90 degrees each. The images of these four split lights FB1 to FB4 are simultaneously taken by the imaging element 33Ai of the camera 633A. This results in obtaining four interference fringe images having phases that differ by 90 degrees each.

The embodiments described above in detail have similar functions and advantageous effects as described above.

Additionally, one or more embodiments of the invention employ the prisms 601 and 602 that are Koester prisms as the means for splitting one light into two parallel lights in the spectral optical systems 600A and 600B, so that the two split lights have optically identical optical path lengths. As a result, there is no need to provide the optical path adjuster to adjust the optical path lengths of the two split lights, unlike some embodiments described above. This configuration reduces the total number of components and achieves, for example, simplified configuration and downsizing of the device.

The light travels only in the optical members and is not exposed to the air until one light F0 entering the spectral optical system 600A or 600B is emitted as four split lights FB1 to FB4. This configuration reduces the effect of, for example, fluctuation of the air.

Figure 19:
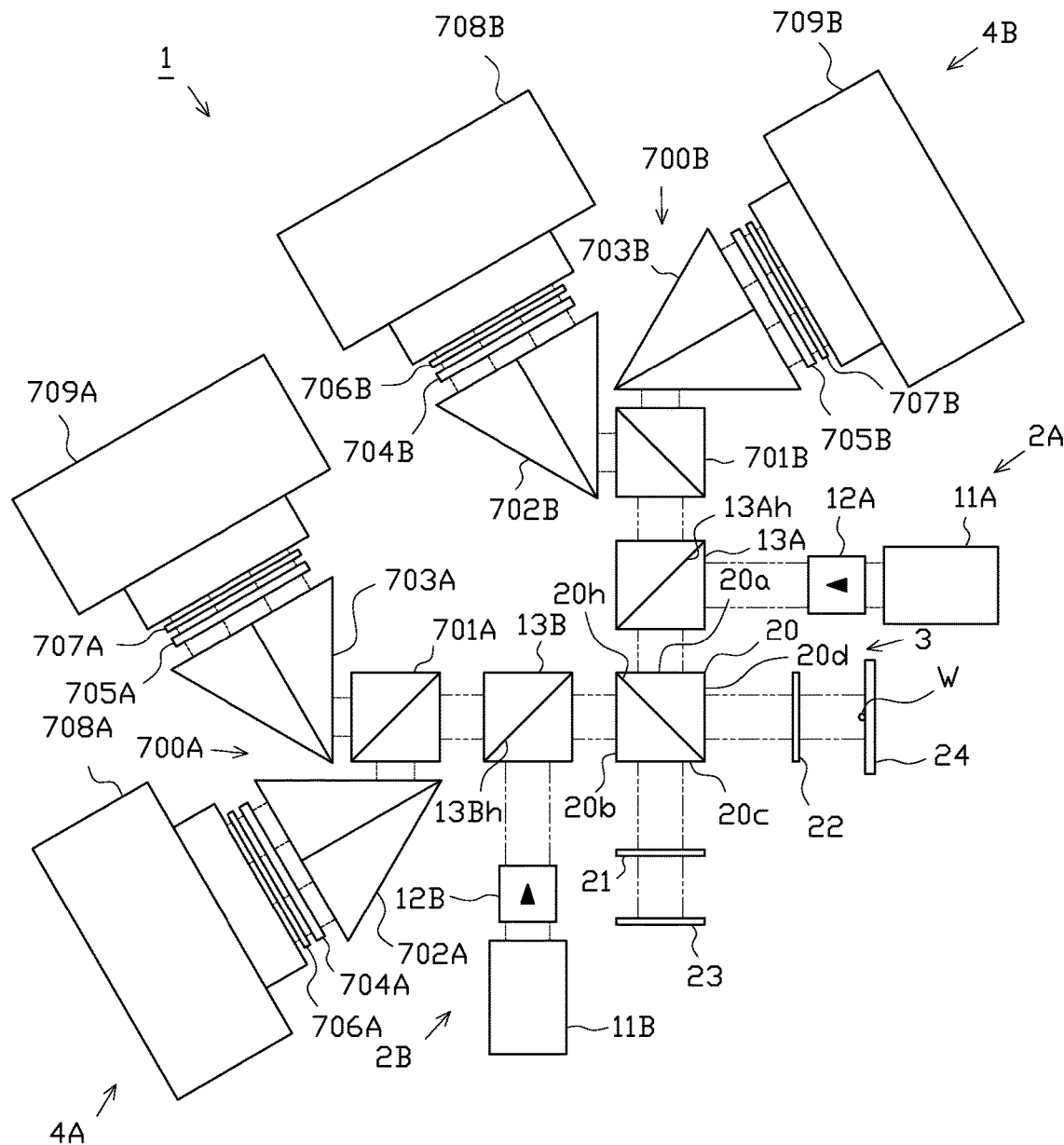
FIG. 19 is a schematic configuration diagram illustrating a three-dimensional measurement device according to one or more embodiments of the invention.

The following describes further embodiments of the invention with reference to the drawings. FIG. 19 is a diagram illustrating the schematic configuration of a three-dimensional measurement device according to one or more embodiments of the invention.

One or more embodiments of the invention include spectral optical systems different from those of some of the aforementioned embodiments and have a different configuration involved in the first imaging system 4A and the second imaging system 4B from that of the aforementioned embodiments that employ the optical configuration of the Michelson interferometer. Different components from those of the aforementioned embodiments are described in detail. The like components are expressed by the like reference signs, and their detailed description is omitted.

The first imaging system 4A according to one or more embodiments of the invention includes a spectral optical system 700A configured as the first spectroscopic unit or first spectroscope to split the combined light (reference light component and measurement light component) of the first light transmitted through the second non-polarizing beam splitter 13B into four split lights.

The spectral optical system 700A includes a non-polarizing beam splitter 701A configured to split the combined light of the first light transmitted through the second non-polarizing beam splitter 13B into two split lights, a first prism 702A configured to further split one of the two split lights split by the non-polarizing beam splitter 701A into two split lights, and a second prism 703A configured to further split the other of the two split lights split by the non-polarizing beam splitter 701A into two split lights.

The first imaging system 4A according to one or more embodiments of the invention also includes a quarter wave plate 704A configured to convert the respective two split lights split by the first prism 702A into circularly polarized lights, a quarter wave plate 705A configured to convert the respective two split lights split by the second prism 703A into circularly polarized lights, a filter unit 706A configured to selectively transmit predetermined components of the two split lights transmitted through the quarter wave plate 704A, a filter unit 707A configured to selectively transmit predetermined components of the two split lights transmitted through the quarter wave plate 705A, a camera 708A configured to take images of the two split lights transmitted through the filter unit 706A simultaneously and a camera 709A configured to take images of the two split lights transmitted through the filter unit 707A simultaneously.

The second imaging system 4B according to one or more embodiments of the invention, on the other hand, includes a spectral optical system 700B configured as the second spectroscopic unit or second spectroscope to split the combined light (reference light component and measurement light component) of the second light transmitted through the first non-polarizing beam splitter 13A into four split lights.

The spectral optical system 700B includes a non-polarizing beam splitter 701B configured to split the combined light of the second light transmitted through the first non-polarizing beam splitter 13A into two split lights, a first prism 702B configured to further split one of the two split lights split by the non-polarizing beam splitter 701B into two split lights, and a second prism 703B configured to further split the other of the two split lights split by the non-polarizing beam splitter 701B into two split lights.

The second imaging system 4B according to one or more embodiments of the invention also includes a quarter wave plate 704B configured to convert the respective two split lights split by the first prism 702B into circularly polarized lights, a quarter wave plate 705B configured to convert the respective two split lights split by the second prism 703B into circularly polarized lights, a filter unit 706B configured to selectively transmit predetermined components of the two split lights transmitted through the quarter wave plate 704B, a filter unit 707B configured to selectively transmit predetermined components of the two split lights transmitted through the quarter wave plate 705B, a camera 708B configured to take images of the two split lights transmitted through the filter unit 706B simultaneously and a camera 709B configured to take images of the two split lights transmitted through the filter unit 707B simultaneously.

The "non-polarizing beam splitter 701A" and the "non-polarizing beam splitter 701B" are cube-shaped known optical members, each being configured by joining right angle prisms together to be integrated, and a non-polarizing half mirror is provided on each joint surface.

The "first prism 702A" and the "second prism 703A" included in the first imaging system 4A and the "first prism 702B" and the "second prism 703B" included in the second imaging system 4B are known Koester prisms and have similar configurations to those of the "first prism 601" and the "second prism 602" according to the above embodiments, and their detailed description is omitted.

The "quarter wave plate 704A" and the "quarter wave plate 705A" included in the first imaging system 4A and the "quarter wave plate 704B" and the "quarter wave plate 705B" included in the second imaging system 4B have similar configurations to those of the "quarter wave plate 31A" and the "quarter wave plate 31B" according to the above embodiments, and their detailed description is omitted. Each of the "quarter wave plate 704A" and the like according to one or more embodiments of the invention is, however, configured corresponding to two split lights. A modified configuration may include quarter wave plates provided individually corresponding to the respective split lights.

The "filter unit 706A" and the "filter unit 707A" included in the first imaging system 4A and the "filter unit 706B" and the "filter unit 707B" included in the second imaging system 4B have similar configurations to that of the "filter unit 126" according to the above embodiments, and their detailed description is omitted. Each of the "filter unit 706A" and the like according to one or more embodiments of the invention is, however, configured corresponding to two split lights. For example, the first imaging system 4A may be configured such that the "filter unit 706A" includes "polarizers 126a and 126b" and that the filter unit 707A" includes "polarizers 126c and 126d" (the same applies to the second imaging system 4B). A modified configuration may include four polarizers (polarizers 126a, 126b, 126c and 126d) having transmission angle directions that differ by 45 degrees each, provided individually corresponding to the respective four split lights.

The configuration involved in the "camera 708A" and the camera "709A" included in the first imaging system 4A, the "camera 708B" and the "camera 709B" included in the second imaging system 4B, the control process with regard to these cameras, the image data storage device 54 and the like is similar to the configuration involved in the "first camera 33A", the "second camera 33B", and the like of the embodiments described above, and their detailed description is omitted. Each of the "camera 708A (imaging element)" and the like according to one or more embodiments of the invention is, however, configured corresponding to two split lights. For example, the imaging system 4A may be configured such that the imaging region of the "camera 708A (imaging element)" is divided into two imaging areas (H1 and H2) corresponding to the "filter unit 706A (polarizers 126a and 126b)" and that the imaging region of the "camera 709A (imaging element)" is divided into two imaging areas (H3 and H4) corresponding to the "filter unit 707A (polarizers 126c and 126d)" (the same applies to the second imaging system 4B). In this configuration, imaging elements may have the aspect ratio of 2 to 1.

The following describes the functions of the spectral optical system 700A and the spectral optical system 700B. As described above, the spectral optical system 700A and the spectral optical system 700B respectively used in the first imaging system 4A and in the second imaging system 4B have identical configurations. Accordingly the following describes the spectral optical system 700A of the first imaging system 4A as an example, with omission of description on the spectral optical system 700B of the second imaging system 4B.

The combined light of the first light transmitted through the second non-polarizing beam splitter 13B first enters the non-polarizing beam splitter 701A of the spectral optical system 700A and is split in two different directions by the half mirror. The split light reflected by the half mirror enters the first prism 702A. The split light transmitted through the half mirror, on the other hand, enters the second prism 703A.

The split light entering a first surface of the first prism 702A is further split in two different directions by the half mirror. For example, the split light is further split into a split light that is reflected by the half mirror toward the first surface and a split light that is transmitted through the half mirror toward a second surface.

The split light reflected by the half mirror is totally reflected at the first surface toward a third surface and is emitted vertically from the third surface. The split light transmitted through the half mirror is, on the other hand, totally reflected at the second surface toward the third surface and is emitted vertically from the third surface. The two parallel split lights are accordingly emitted from the third surface of the first prism 702A.

Similarly, the split light entering a first surface of the second prism 703A is further split in two different directions by the half mirror. For example, the split light is further split into a split light that is reflected by the half mirror toward the first surface and a split light that is transmitted through the half mirror toward a second surface.

The split light reflected by the half mirror is totally reflected at the first surface toward a third surface and is emitted vertically from the third surface. The split light transmitted through the half mirror is, on the other hand, totally reflected at the second surface toward the third surface and is emitted vertically from the third surface. The two parallel split lights are accordingly emitted from the third surface of the second prism 703A.

The two split lights emitted from the first prism 702A are respectively converted into circularly polarized lights by the quarter wave plate 704A and enter the filter unit 706A (for example, polarizers 126a and 126b).

The two split lights transmitted through the filter unit 706A form, for example, an interfering light having a phase of "0 degrees" and an interfering light having a phase of "90 degrees". The images of these two split lights are taken simultaneously in two imaging areas of the camera 708A. This obtains, for example, an interference fringe image having the phase of "0 degrees" and an interference fringe image having the phase of "90 degrees".

Similarly, the two split lights emitted from the second prism 703A are respectively converted into circularly polarized lights by the quarter wave plate 705A and enter the filter unit 707A (for example, polarizers 126c and 126d).

The two split lights transmitted through the filter unit 707A form, for example, an interfering light having a phase of "180 degrees" and an interfering light having a phase of "270 degrees". The images of these two split lights are taken simultaneously in two imaging areas of the camera 709A. This obtains, for example, an interference fringe image having the phase of "180 degrees" and an interference fringe image having the phase of "270 degrees".

As a result, four different interference fringe images having phases that differ by 90 degrees each are obtained by the first imaging system 4A (by the camera 708A and the camera 709A).

The embodiments described above in detail have similar functions and advantageous effects as described above.

The following describes further embodiments of the invention, which allow for measurement using four different lights having different wavelengths by combining a configuration that causes two different lights that are emitted from two light sources and have different wavelengths to enter an interference optical system in an overlapped manner, performs wavelength separation of a light emitted from the interference optical system by an optical separator and individually takes images of interfering lights with regard to the lights of the respective wavelengths, with some of the aforementioned embodiments that employ the optical configuration of the Michelson interferometer.

Figure 20:
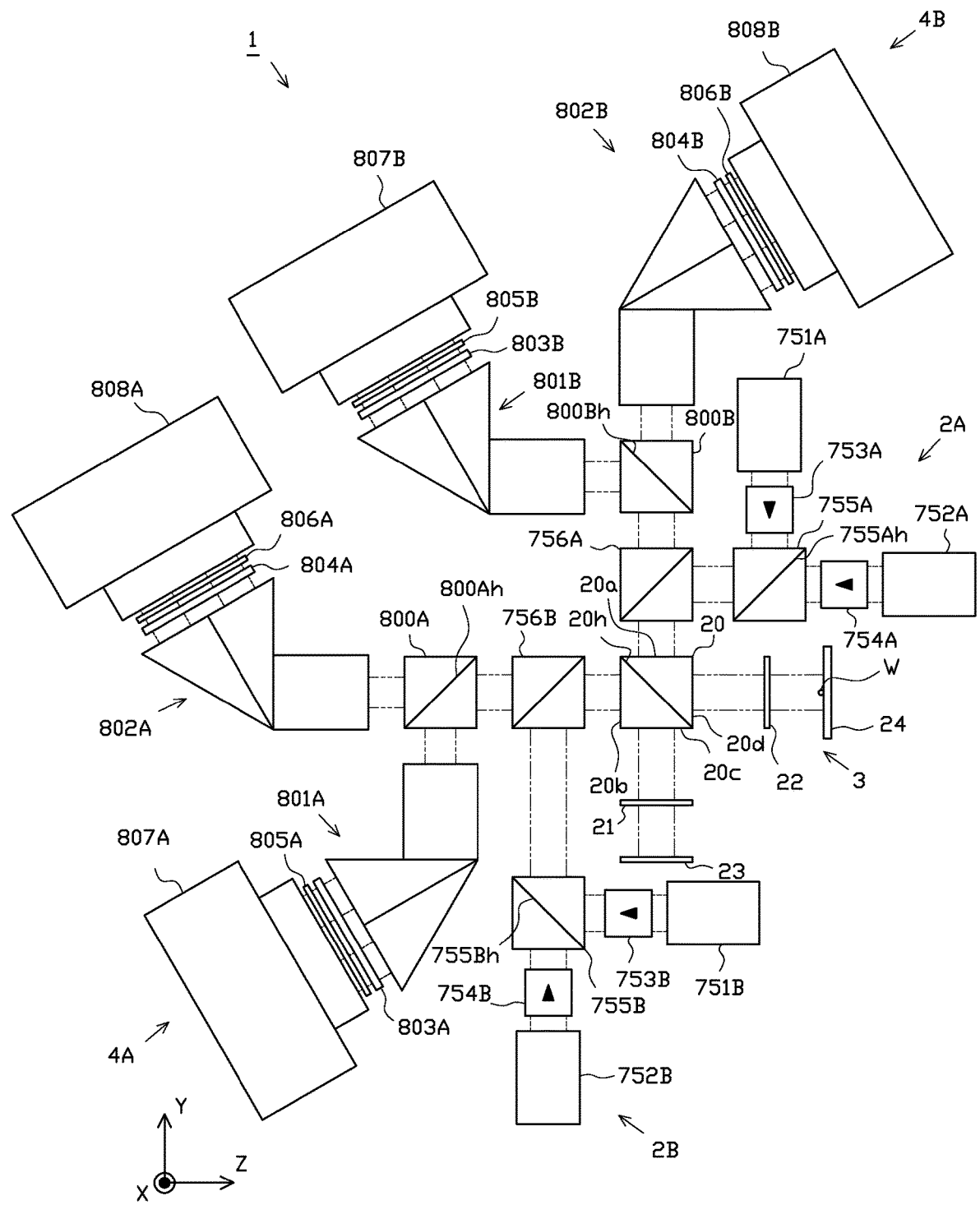
FIG. 20 is a schematic configuration diagram illustrating a three-dimensional measurement device according to one or more embodiments of the invention.

One or more embodiments of the invention are described in detail below with reference to the drawings. FIG. 20 is a diagram illustrating the schematic configuration of a three-dimensional measurement device according to one or more embodiments of the invention. Those embodiments have a different configuration involved in the first projection optical system 2A, the second projection optical system 2B, the first imaging system 4A and the second imaging system 4B from the configurations of the embodiments discussed above. Different components from those of the above respective embodiments are described in detail. The like components are expressed by the like reference signs, and their detailed description is omitted.

The first projection optical system 2A according to one or more embodiments of the invention includes, for example, two light emitters 751A and 752A, a light isolator 753A provided corresponding to the light emitter 751A, a light isolator 754A provided corresponding to the light emitter 752A, a dichroic mirror 755A and a non-polarizing beam splitter 756A.

The "light emitter 751A" and the "light emitter 752A" have similar configurations to that of the "first light emitter 11A", and their detailed description is omitted. The light emitters 751A and 752A are configured to emit lights of different wavelengths. For example, the light emitter 751A emits a linearly polarized light having a first wavelength (for example, 491 nm), and the light emitter 752A emits a linearly polarized light having a second wavelength (for example, 540 nm).

The "light isolator 753A" and the "light isolator 754A" have similar configurations to that of the "first light isolator 12A", and their detailed description is omitted.

According to one or more embodiments of the invention, the linearly polarized light having the first wavelength (hereinafter called "first wavelength light") emitted downward in the Y-axis direction from the light emitter 751A enters the dichroic mirror 755A via the light isolator 753A.

Similarly, the linearly polarized light having the second wavelength (hereinafter called "second wavelength light") emitted leftward in the Z-axis direction from the light emitter 752A enters the dichroic mirror 755A via the light isolator 754A.

The dichroic mirror 755A is a cube-shaped known optical member (dichroic prism) configured by joining right angle prisms together to be integrated, and a dielectric multilayer film is formed on its joint surface 755Ah.

The dichroic mirror 755A is arranged such that one of two surfaces adjoining to each other across the joint surface 755Ah is perpendicular to the Y-axis direction and the other of the two surfaces is perpendicular to the Z-axis direction. In other words, the joint surface 755Ah of the dichroic mirror 755A is arranged to be inclined at 45 degrees to the Y-axis direction and the Z-axis direction.

The dichroic mirror 755A according to one or more embodiments of the invention has a characteristic of reflecting at least the first wavelength light and transmitting the second wavelength light. In the arrangement configuration of one or more embodiments of the invention shown in FIG. 20, the first wavelength light and the second wavelength light entering the dichroic mirror 755A are combined with each other, and a combined light is emitted leftward in the Z-axis direction toward the non-polarizing beam splitter 756A.

Hereinafter the combined light by combining the first wavelength light emitted from the light emitter 751A with the second wavelength light emitted from the light emitter 752A is called "first light". Accordingly the "light emitters 751A and 752A", the "dichroic mirror 755A" and the like are configured as the "first irradiator" according to one or more embodiments of the invention.

The "non-polarizing beam splitter 756A" has a similar configuration to that of the "first non-polarizing beam splitter 13A", and its detailed description is omitted. According to one or more embodiments of the invention, the non-polarizing beam splitter 756A is arranged to transmit part (half) of the first light that enters leftward in the Z-axis direction from the dichroic mirror 755A, leftward in the Z-axis direction and reflect the remaining part (remaining half) of the first light downward in the Y-axis direction.

The second projection optical system 2B according to one or more embodiments of the invention includes, for example, two light emitters 751B and 752B, a light isolator 753B provided corresponding to the light emitter 751B, a light isolator 754B provided corresponding to the light emitter 752B, a dichroic mirror 755B and a non-polarizing beam splitter 756B.

The "light emitter 751B" and the "light emitter 752B" have similar configurations to that of the "second light emitter 11B", and their detailed description is omitted. The light emitters 751B and 752B are configured to emit lights of different wavelengths. For example, the light emitter 751B emits a linearly polarized light having a third wavelength (for example, 4881 nm), and the light emitter 752B emits a linearly polarized light having a fourth wavelength (for example, 532 nm).

The "light isolator 753B" and the "light isolator 754B" have similar configurations to that of the "second light isolator 12B", and their detailed description is omitted.

According to one or more embodiments of the invention, the linearly polarized light having the third wavelength (hereinafter called "third wavelength light") emitted leftward in the Z-axis direction from the light emitter 751B enters the dichroic mirror 755B via the light isolator 753B.

Similarly, the linearly polarized light having the fourth wavelength (hereinafter called "fourth wavelength light") emitted upward in the Y-axis direction from the light emitter 752B enters the dichroic mirror 755B via the light isolator 754B.

The dichroic mirror 755B is a cube-shaped known optical member (dichroic prism) configured by joining right angle prisms together to be integrated, and a dielectric multilayer film is formed on its joint surface 755Bh.

The dichroic mirror 755B is arranged such that one of two surfaces adjoining to each other across the joint surface 755Bh is perpendicular to the Y-axis direction and the other of the two surfaces is perpendicular to the Z-axis direction. In other words, the joint surface 755Bh of the dichroic mirror 755B is arranged to be inclined at 45 degrees to the Y-axis direction and the Z-axis direction.

The dichroic mirror 755B according to one or more embodiments of the invention has a characteristic of reflecting at least the third wavelength light and transmitting the fourth wavelength light. In the arrangement configuration of one or more embodiments of the invention shown in FIG. 20, the third wavelength light and the fourth wavelength light entering the dichroic mirror 755B are combined with each other, and a combined light is emitted upward in the Y-axis direction toward the non-polarizing beam splitter 756B.

Hereinafter the combined light by combining the third wavelength light emitted from the light emitter 751B with the fourth wavelength light emitted from the light emitter 752B is called "second light". Accordingly the "light emitters 751B and 752B", the "dichroic mirror 755B" and the like are configured as the "second irradiator" according to one or more embodiments of the invention.

The "non-polarizing beam splitter 756B" has a similar configuration to that of the "second non-polarizing beam splitter 13B", and its detailed description is omitted. According to one or more embodiments of the invention, the non-polarizing beam splitter 756B is arranged to transmit part (half) of the second light that enters upward in the Y-axis direction from the dichroic mirror 755B, upward in the Y-axis direction and reflect the remaining part (remaining half) of the second light rightward in the Z-axis direction.

The first imaging system 4A according to one or more embodiments of the invention includes a dichroic mirror 800A configured to separate a combined light of a reference light component and a measurement light component with regard to the first light (two-wavelength combined light) transmitted through the non-polarizing beam splitter 756B into a combined light (reference light component and measurement light component) with regard to the first wavelength light and a combined light (reference light component and measurement light component) with regard to the second wavelength light. The dichroic mirror 800A is described in detail below.

The dichroic mirror 800A is a cube-shaped known optical member (dichroic prism) configured by joining right angle prisms together to be integrated, and a dielectric multilayer film is formed on its joint surface 800Ah.

The dichroic mirror 800A is arranged such that one of two surfaces adjoining to each other across the joint surface 800Ah is perpendicular to the Y-axis direction and the other of the two surfaces is perpendicular to the Z-axis direction. In other words, the joint surface 800Ah of the dichroic mirror 800A is arranged to be inclined at 45 degrees to the Y-axis direction and the Z-axis direction.

The dichroic mirror 800A according to one or more embodiments of the invention has a similar characteristic to that of the dichroic mirror 755A described above. For example, the dichroic mirror 800A has a characteristic of reflecting at least the first wavelength light and transmitting the second wavelength light.

In the arrangement configuration of one or more embodiments of the invention shown in FIG. 20, the combined light with regard to the first light entering the dichroic mirror 800A is separated into a combined light with regard to the first wavelength light (for example, 491 nm) emitted downward in the Y-axis direction and a combined light with regard to the second wavelength light (for example, 540 nm) emitted leftward in the Z-axis direction.

The first imaging system 4A according to one or more embodiments of the invention additionally includes a spectral optical system 801A configured to split the combined light with regard to the first wavelength light emitted downward in the Y-axis direction from the dichroic mirror 800A into four split lights, a quarter wave plate 803A configured to convert the respective four split lights split by the spectral optical system 801A into circularly polarized lights, a filter unit 805A configured to selectively transmit predetermined components of the four split lights transmitted through the quarter wave plate 803A, and a camera 807A configured to simultaneously take images of the four split lights transmitted through the filter unit 805A.

Similarly the first imaging system 4A according to one or more embodiments of the invention includes a spectral optical system 802A configured to split the combined light with regard to the second wavelength light emitted leftward in the Z-axis direction from the dichroic mirror 800A into four split lights, a quarter wave plate 804A configured to convert the respective four split lights split by the spectral optical system 802A into circularly polarized lights, a filter unit 806A configured to selectively transmit predetermined components of the four split lights transmitted through the quarter wave plate 804A, and a camera 808A configured to simultaneously take images of the four split lights transmitted through the filter unit 806A.

The configurations of the "spectral optical system 801A", the "quarter wave plate 803A", the "filter unit 805A" and the "camera 807A" with regard to the first wavelength light and the configurations of the "spectral optical system 802A", the "quarter wave plate 804A", the "filter unit 806A" and the "camera 808A" with regard to the second wavelength light are respectively identical with the configurations of the "spectral optical system 600A", the "quarter wave plate 610A", the "filter unit 615A" and the "camera 633A" described in the above embodiments, and their detailed description is omitted.

The second imaging system 4B according to one or more embodiments of the invention includes a dichroic mirror 800B configured to separate a combined light of a reference light component and a measurement light component with regard to the second light (two-wavelength combined light)

transmitted through the non-polarizing beam splitter 756A into a combined light (reference light component and measurement light component) with regard to the third wavelength light and a combined light (reference light component and measurement light component) with regard to the fourth wavelength light. The dichroic mirror 800B is described in detail below.

The dichroic mirror 800B is a cube-shaped known optical member (dichroic prism) configured by joining right angle prisms together to be integrated, and a dielectric multilayer film is formed on its joint surface 800Bh.

The dichroic mirror 800B is arranged such that one of two surfaces adjoining to each other across the joint surface 800Bh is perpendicular to the Y-axis direction and the other of the two surfaces is perpendicular to the Z-axis direction. In other words, the joint surface 800Bh of the dichroic mirror 800B is arranged to be inclined at 45 degrees to the Y-axis direction and the Z-axis direction.

The dichroic mirror 800B according to one or more embodiments of the invention has a similar characteristic to that of the dichroic mirror 755B described above. For example, the dichroic mirror 800B has a characteristic of reflecting at least the third wavelength light and transmitting the fourth wavelength light.

In the arrangement configuration of one or more embodiments of the invention shown in FIG. 20, the combined light with regard to the second light entering the dichroic mirror 800B is separated into a combined light with regard to the third wavelength light (for example, 488 nm) emitted leftward in the Z-axis direction and a combined light with regard to the fourth wavelength light (for example, 532 nm) emitted upward in the Y-axis direction.

The second imaging system 4B according to one or more embodiments of the invention additionally includes a spectral optical system 801B configured to split the combined light with regard to the third wavelength light emitted leftward in the Z-axis direction from the dichroic mirror 800B into four split lights, a quarter wave plate 803B configured to convert the respective four split lights split by the spectral optical system 801B into circularly polarized lights, a filter unit 805B configured to selectively transmit predetermined components of the four split lights transmitted through the quarter wave plate 803B, and a camera 807B configured to simultaneously take images of the four split lights transmitted through the filter unit 805B.

Similarly the second imaging system 4B according to one or more embodiments of the invention includes a spectral optical system 802B configured to split the combined light with regard to the fourth wavelength light emitted upward in the Y-axis direction from the dichroic mirror 800B into four split lights, a quarter wave plate 804B configured to convert the respective four split lights split by the spectral optical system 802B into circularly polarized lights, a filter unit 806B configured to selectively transmit predetermined components of the four split lights transmitted through the quarter wave plate 804B, and a camera 808B configured to simultaneously take images of the four split lights transmitted through the filter unit 806B.

The configurations of the "spectral optical system 801B", the "quarter wave plate 803B", the "filter unit 805B" and the "camera 807B" with regard to the third wavelength light and the configurations of the "spectral optical system 802B", the "quarter wave plate 804B", the "filter unit 806B" and the "camera 808B" with regard to the fourth wavelength light are respectively identical with the configurations of the "spectral optical system 600B", the "quarter wave plate 610B", the "filter unit 615B" and the "camera 633B" described in the above embodiments, and their detailed description is omitted.

The above configuration obtains four different interference fringe images with regard to the first wavelength light having phases that differ by 90 degrees each, four different interference fringe images with regard to the second wavelength light having phases that differ by 90 degrees each, four different interference fringe images with regard to the third wavelength light having phases that differ by 90 degrees each and four different interference fringe images with regard to the fourth wavelength light having phases that differ by 90 degrees each.

The embodiments discussed above in detail have similar functions and advantageous effects as described above. Additionally, those embodiments use the four different lights having different wavelengths and thereby achieve further expansion of the measurement range and further improvement of the measurement efficiency.

This configuration also enables measurement using the first wavelength light and the third wavelength light (for example, blue color lights of 491 nm and 488 nm) and measurement using the second wavelength light and the fourth wavelength light (for example, green color lights of 540 nm and 532 nm) to be changed over according to the type of the work W.

As a result, this configuration enables the type of lights (wavelength) to be changed over according to the type of the work W, while achieving expansion of the measurement range using two different lights having wavelengths close to each other.

For example, a work W such as a wafer substrate for which the red color light is not suitable may be subjected to measurement using two lights, i.e., the first wavelength light and the third wavelength light (for example, blue color lights of 491 nm and 488 nm), whereas a work W such as copper for which the blue color light is not suitable may be subjected to measurement using two lights, i.e., the second wavelength light and the fourth wavelength light (for example, green color lights of 540 nm and 532 nm). The wavelengths of the respective lights are not limited to the embodiments described above, but lights of other wavelengths may be employed.

The present disclosure is not limited to the descriptions of the above embodiments but may also be implemented, for example, by configurations described below. The present disclosure may further be implemented by other applications and other modifications that are not described below.

(a) The above respective embodiments do not refer to concrete examples of the work W. The measurement object may be, for example, solder paste printed on a printed circuit board or a solder bump formed on a wafer substrate.

Figure 21:
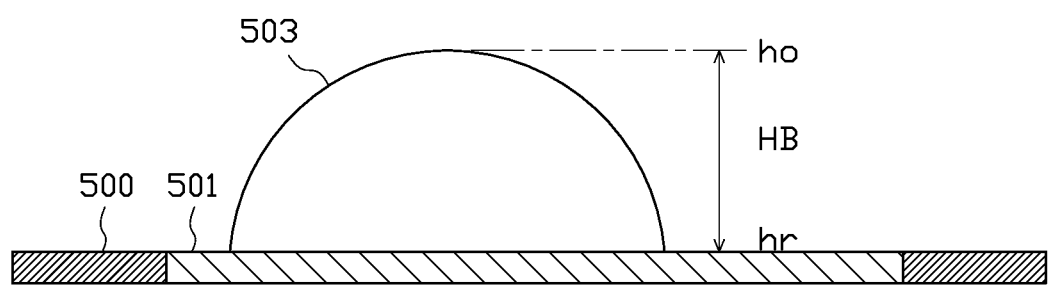
FIG. 21 is a diagram illustrating the principle of height measurement of a solder bump according to one or more embodiments of the invention.

The following describes the principle of height measurement of, for example, a solder bump. As shown in FIG. 21, a height HB of a bump 503 relative to an electrode 501 (substrate 500) is determined by subtracting an absolute height hr of the electrode 501 in the periphery of the bump 503 from an absolute height ho of the bump 503 [HB=ho−hr]. For example, an absolute height at any one point on the electrode 501 or an average value of absolute heights in a predetermined range on the electrode 501 may be used as the absolute height hr of the electrode 501. The "absolute height ho of the bump 503" and the "absolute height hr of the electrode 501" may be determined as the height information $z(\xi,\eta)$ according to one or more embodiments of the invention.

A solder printing inspection apparatus or a solder bump inspection apparatus equipped with an inspection unit configured to inspect the quality of solder paste or a solder bump according to preset quality criteria may be configured to include the three-dimensional measurement device 1 (200, 300).

The three-dimensional measurement device 1 according to one or more embodiments of the invention that employs the optical configuration of the Michelson interferometer and the three-dimensional measurement device 300 according to one or more embodiments of the invention that employs the optical configuration of the Fizeau interferometer are suitable for reflection works, whereas the three-dimensional measurement device 200 according to one or more embodiments of the invention that employs the optical configuration of the Mach-Zehnder interferometer is suitable for transmission works. Using the phase shift method allows for measurement with exclusion of zero dimension (transmitted light).

The configuration of the aforementioned embodiments may be modified to measure a reflection work by omitting the second total reflection mirror 222 and the placement structure 224 and placing the work W at the position of the second total reflection mirror 222.

According to the above respective embodiments, the placement structure 24 (224, 324) on which the work W is placed may be configured to be movable. The surface of the work W may be divided into a plurality of measurement areas, and shape measurement of the entire work W may be performed by performing shape measurement multiple times for the respective measurement areas by successively changing the measurement area.

(b) The configuration of the interference optical system (predetermined optical system) is not limited to those of the embodiments described above. For example, the above embodiments may employ the optical configuration of the Michelson interferometer, the above embodiments may employ the optical configuration of the Mach-Zehnder interferometer, and the above embodiments may employ the optical configuration of the Fizeau interferometer, as the interference optical system. These are, however, not restrictive, but any other optical configuration may be employed to divide an incident light into a reference light and a measurement light and perform shape measurement of the work W.

(c) The configurations of the projection optical systems 2A and 2B (302A and 302B) are not limited to those described in the above respective embodiments. For example, in one or more embodiments of the invention, the light having the wavelength $\lambda_1=1500$ nm is emitted from the first projection optical system 2A (302A) and the light having the wavelength $\lambda_2=1503$ nm is emitted from the second projection optical system 2B (302B). The wavelengths of the respective lights are, however, not limited to these values. The wavelength difference of the two lights may be decreased in order to expand the measurement range.

A modified configuration may cause lights of an identical wavelength to be emitted from the first projection optical system 2A (302A) and the second projection optical system 2B (302B).

As described above, the three-dimensional measurement device (interferometer) using laser light has been known as the three-dimensional measurement device configured to measure the shape of a measurement object. This three-dimensional measurement device is, however, likely to decrease the measurement accuracy by the effect of, for example, fluctuation of the output light from the laser light source.

In the case where only one light (one wavelength) is sufficient for the measurement range, for example, in the case of a relatively small measurement object, the configuration that radiates lights of an identical wavelength from two different light sources and performs three-dimensional measurement using these two lights achieves improvement of the measurement accuracy.

In three-dimensional measurement using two lights, however, there is a need to take an image of an output light with regard to a first light and take an image of an output light with regard to a second light at different timings. This is likely to decrease the measurement efficiency.

For example, in three-dimensional measurement by the phase shift method, when the phase is changed in four different levels, there is a need to obtain four different image data. In the configuration using two lights, a required imaging time is accordingly for four imaging processes at different timings, i.e., a total of eight imaging processes.

The present disclosure that radiates two lights of the same wavelength takes into account the above circumstances. One or more embodiments of the invention provide a three-dimensional measurement device that achieves improvement of the measurement efficiency by using tow lights.

The present disclosure enables imaging of the output light with regard to the first light and imaging of the output light with regard to the second light to be performed simultaneously and thereby obtains a total of eight (or six) interference fringe images with regard to the two different lights in an imaging time for a total of four (or a total of three) imaging processes. As a result, this shortens the total imaging time and improves the measurement efficiency.

For example, in the three-dimensional measurement device 200 according to one or more embodiments of the invention configured based on the principle of the Mach-Zehnder interferometer, one work is irradiated with the two lights (measurement lights) from different directions. This enables the overall image of, for example, a work of a complicated configuration to be measured with the higher accuracy.

According to one or more embodiments of the invention, the projection optical systems 2A and 2B (302A and 302B) are configured to include the light isolators 12A and 12B (312A and 312B) or the like. The projection optical systems 2A and 2B (302A and 302B) may, however, be configured with omission of the light isolators 12A and 12B (312A and 312B) or the like.

In one or more embodiments of the invention, the positions of the first projection optical system 2A (302A) and the second imaging system 4B (304B) placed across the first non-polarizing beam splitter 13A (313A) may be exchanged, and the positions of the second projection optical system 2B (302B) and the first imaging system 4A (304A) placed across the second non-polarizing beam splitter 13B (313B) may be exchanged.

The configuration of the light guiding unit or light guide is not limited to the non-polarizing beam splitters 13A and 13B (313A and 313B) or the like described in the above respective embodiments. Any other configuration may be employed to cause at least part of the first light (second light) emitted from the first irradiator (second irradiator) to enter the first input-output element (second input-output element) and to cause at least part of the output light with regard to the second light (output light with regard to the first light) emitted from the first input-output element (second input-output element) to enter the second imaging unit (first imaging unit). For example, in one or more embodiments of the invention, any other configuration may be employed to cause the first light (second light) emitted from the first projection optical system 2A (second projection optical system 2B) to enter the first surface 20a (second surface 20b) of the polarizing beam splitter 20 and to cause the image of the output light with regard to the second light (output light with regard to the first light) emitted from the first surface 20a (second surface 20b) of the polarizing beam splitter 20 to be taken by the second imaging system 4B (first imaging system 4A).

According to one or more embodiments of the invention, a cube-type non-polarizing beam splitter configured by joining right angle prisms together to be integrated is employed for the first non-polarizing beam splitter 13A (313A), the second non-polarizing beam splitter 13B (313B), and the like. This is, however, not restrictive. For example, a plate-type predetermined half mirror may be employed.

According to one or more embodiments of the invention, a cube-type polarizing beam splitter configured by joining right angle prisms together to be integrated is employed for the polarizing beam splitter 20 (211, 212, 320). This is, however, not restrictive. For example, a plate-type polarizing beam splitter may be employed.

(d) One or more embodiments of the invention perform the phase shift method, based on the four different interference fringe image data having different phases. This is, however, not essential. For example, a modified configuration may perform the phase shift method, based on two or three different interference fringe image data having different phases.

The three-dimensional measurement device 1 according to one or more embodiments of the invention and the three-dimensional measurement device 200 according to one or more embodiments of the invention may be applied to the configuration that performs three-dimensional measurement by another technique different from the phase shift method, for example, the Fourier transform method employed in the aforementioned embodiments.

On the contrary, the three-dimensional measurement device 300 according to one or more embodiments of the invention may be applied to the configuration that performs three-dimensional measurement by another technique different from the Fourier transform method, for example, the phase shift method.

(e) In one or more embodiments of the invention, the polarizers 32A and 32B arranged to make their transmission axis directions changeable are employed as the phase shift unit. In one or more embodiments of the invention, the filter unit 126 including four polarizers having different transmission axis directions is employed as the phase shift unit.

The configuration of the phase shift method is, however, not limited to these embodiments. For example, one or more embodiments of the invention may employ a configuration that moves the reference surface 23 along the optical axis by a piezoelectric element or the like, so as to physically change the optical path length.

One or more embodiments of the invention may employ, for example, the filter unit 126, as the phase shift unit. Such embodiments may also employ a configuration that moves the total reflection mirror 221 (reference surface) along a direction perpendicular to the direction of inclination by a piezoelectric element or the like, while maintaining the inclination of the total reflection mirror 221 at 45 degrees to the Y-axis direction and the Z-axis direction, so as to physically change the optical path length.

In the case where the phase shift method is employed, one or more embodiments of the invention may employ a configuration that moves the half mirror 323 (reference surface) along the optical axis by a piezoelectric element or the like, so as to physically change the optical path length.

(f) One or more embodiments of the invention determine the height information $z(\xi,\eta)$ according to the computational expression in the two-wavelength phase shift method. This configuration is, however, not essential, but a modified configuration may store a numerical table or table data representing the correspondence relationship of the phases $\varphi_1$ and $\varphi_2$ and the fringe orders $m_1$ and $m_2$ to the height information $z$ and refer to the numerical table or table data to obtain the height information. In this modified configuration, it is not necessary to specify the fringe orders.

(g) The configuration of the spectroscopic unit or spectroscope is not limited to the embodiments described above. For example, the spectral optical system 125 according to one or more embodiments of the invention is configured to split the light entering from the interference optical system 3 into four split lights. This is, however, not essential, but the configuration may split the incident light into at least a required number of split lights required for measurement by the phase shift method, for example, into three split lights.

One or more embodiments of the invention split the incident combined light L0 or the like into the four lights LB1 to LB4 or the like having the optical paths arrayed in matrix on the plane perpendicular to the traveling direction of light. In a configuration that uses a plurality of cameras to take the images of the respective split lights LB1 to LB4 or the like, it is not necessary to split the light into split lights arrayed in matrix.

One or more embodiments of the invention employ the spectral optical system 125 configured by assembling and integrating a plurality of optical members (prisms) as the spectroscopic unit. This is, however, not restrictive, but a diffraction grating may be employed as the spectroscopic unit.

(h) The configuration of the filtering unit or filter is not limited to the embodiments described above. For example, according to one or more embodiments of the invention, the filter unit 126 is configured to include the first polarizer 126a having the transmission axis direction of 0 degree, the second polarizer 126b having the transmission axis direction of 45 degrees, the third polarizer 126c having the transmission axis direction of 90 degrees and the fourth polarizer 126d having the transmission axis direction of 135 degrees. The filter unit 126 is configured to obtain four different interference fringe images having phases that differ by 90 degrees each by using these four polarizers 126a to 126d having the transmission axis directions that differ by 45 degrees each and perform the shape measurement by the phase shift method based on the four interference fringe images.

Figure 22:
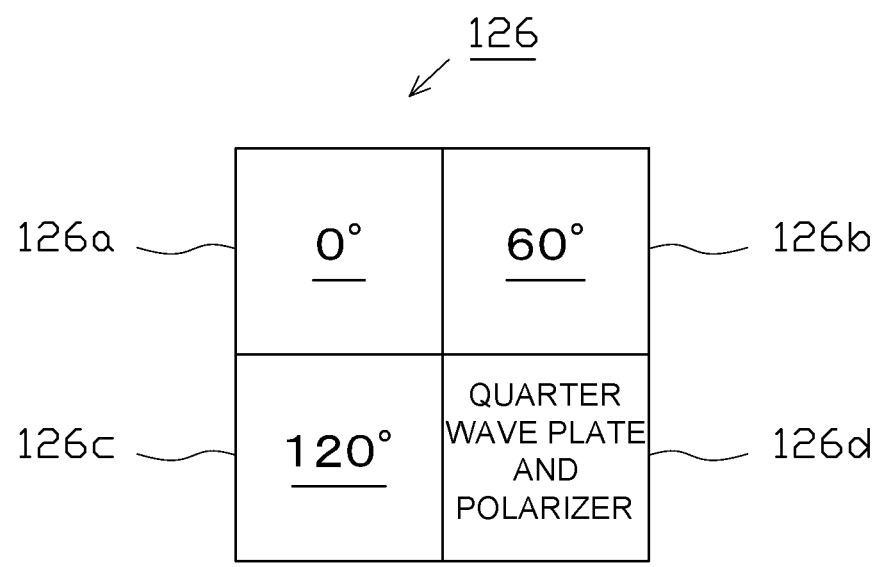
FIG. 22 is a schematic configuration diagram illustrating a filter unit according to one or more embodiments of the invention.

The following configuration may be employed in place of the above configuration to perform shape measurement by the phase shift method based on three different interference fringe images having different phases. For example, as shown in FIG. 22, the first polarizer 126a, the second polarizer 126b, the third polarizer 126c and the fourth polarizer 126d of the filter unit 126 may be respectively configured by a polarizer having a transmission axis direction of 0 degree, a polarizer having a transmission axis direction of 60 degrees (or 45 degrees), a polarizer having a transmission axis direction of 120 degrees (or 90 degrees), and a combination of a quarter wave plate configured to convert the measurement light (for example, clockwise circularly polarized light) and the reference light (for example, counterclockwise circularly polarized light) into linearly polarized lights with a polarizer configured to selectively transmit the linearly polarized light of the measurement light. The combination of the "quarter wave late" with the "polarizer" may be replaced by a "circularly polarizing plate".

This configuration enables a luminance image of the work W, in addition to three different interference fringe images having phases that differ by 120 degrees each (or by 90 degrees each) to be obtained by one imaging processing using one imaging element. This allows for measurement based on the luminance image in combination with the phase measurement by the phase shift method based on the three different interference fringe images. This configuration allows for, for example, mapping with respect to three-dimensional data obtained by the phase measurement by the phase shift method or extraction of a measurement area. As a result, this configuration allows for comprehensive evaluation by combination of a plurality of different measurements and further improves the measurement accuracy.

In the illustrated example of FIG. 15, the combination of the quarter wave plate configured to convert the circularly polarized light into the linearly polarized light with the polarizer configured to selectively transmit the linearly polarized light of the measurement light is employed as the fourth polarizer 126d. This is, however, not essential, but any other configuration may be employed to allow for selective transmission of only the measurement light.

Additionally, another modified configuration may omit the fourth polarizer 126d. For example, this modified configuration may take images of three lights that are respectively transmitted through the first polarizer 126a, the second polarizer 126b and the third polarizer 126c of the filter unit 126 and one light that does not pass through the filter unit 126 (polarizer) but directly enters, with one imaging element.

This configuration has similar functions and advantageous effects to those of the above configuration that employs the combination of the "quarter wave plate" with the "polarizer" as the fourth polarizer 126d. For example, this configuration enables a luminance image of the work W, in addition to three different interference fringe images having phases that differ by 120 degrees each (or by 90 degrees each) to be obtained by one imaging processing using one imaging element.

Even in the case where the images of the measurement light (for example, clockwise circularly polarized light) and the reference light (for example, counterclockwise circularly polarized light) are taken directly, since the reference light is known (or is obtainable in advance by measurement) and is uniform, the signal of the measurement light may be extracted by a post process after imaging, for example, a process of removing this reference light component or a process of removing the uniform light.

The configuration with omission of the fourth polarizer 126d reduces the number of optical components by omission of the "quarter wave plate" and the "polarizer" and thereby achieves the simplified configuration and suppresses an increase in total number of components, compared with the configuration that employs the combination of the "quarter wave plate" with the "polarizer" as the fourth polarizer 126d.

(i) Each of the above embodiments uses the cameras equipped with lenses. The lens is, however, not essential. A focused image may be obtained by calculation according to the relational expression of [Math. 6] given above using a camera without lens.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . three-dimensional measurement device, 2A . . . first projection optical system, 2B . . . second projection optical system, 3 . . . interference optical system, 4A . . . first imaging system, 4B . . . second imaging system, 5 . . . control device, 11A . . . first light emitter, 11B . . . second light emitter, 12A . . . first light isolator, 12B . . . second light isolator, 13A . . . first non-polarizing beam splitter, 13B . . . second non-polarizing beam splitter, 20 . . . polarizing beam splitter, 20a . . . first surface, 20c . . . third surface, 20b . . . second surface, 20d . . . fourth surface, 22 . . . quarter wave plate, 23 . . . reference surface, 24 . . . placement structure, 31A . . . quarter wave plate, 31B . . . quarter wave plate, 32A . . . first polarizer, 32B . . . second polarizer, 33A . . . first camera, 33B . . . second camera, W . . . work

What is claimed is:

1. A three-dimensional measurement device, comprising:
a predetermined optical system that:
splits a predetermined incident light into two lights;
radiates one of the two lights as a measurement light to a measurement object and the other of the two lights as a reference light to a reference surface; and
recombines the two lights to a combined light and emits the combined light;
a first irradiator that emits a first light that comprises a polarized light of a first wavelength and enters a first input-output element of the predetermined optical system;
a second irradiator that emits a second light that comprises a polarized light of a second wavelength and enters a second input-output element of the predetermined optical system;
a first camera that takes an image of an output light with regard to the first light that is emitted from the second input-output element when the first light enters the first input-output element;
a second camera that takes an image of an output light with regard to the second light that is emitted from the first input-output element when the second light enters the second input-output element; and
an image processor that performs three-dimensional measurement of the measurement object, based on interference fringe images taken by the first and the second camera.

2. The three-dimensional measurement device according to claim 1, further comprising:
a first light guide that causes at least part of the first light emitted from the first irradiator to enter the first input-output element and that causes at least part of the output light with regard to the second light emitted from the first input-output element to enter the second camera; and
a second light guide that causes at least part of the second light emitted from the second irradiator to enter the second input-output element and that causes a least part of the output light with regard to the first light emitted from the second input-output element to enter the first camera.

3. The three-dimensional measurement device according to claim 2, further comprising:
a first light isolator that is placed between the first irradiator and the first light guide and that transmits only a light in one direction out of the light emitted from the first irradiator and blocks a light in a reverse direction; and
a second light isolator that is placed between the second irradiator and the second light guide and that transmits only a light in one direction out of the light emitted from the second irradiator and blocks a light in a reverse direction.

4. The three-dimensional measurement device according to claim 1, further comprising:
a first polarizer that gives a relative phase difference between the reference light and the measurement light with regard to the first light; and
a second polarizer that gives a relative phase difference between the reference light and the measurement light with regard to the second light, wherein
the image processor:
measures a phase corresponding to a shape of the measurement object by a phase shift method, based on a plurality of interference fringe images of the output light with regard to the first light taken by the first camera when the output light with regard to the first light is subjected to phase shift a plurality of times by the first polarizer, and obtains the phase as a first measurement value;
measures a phase corresponding to the shape of the measurement object by the phase shift method, based on a plurality of interference fringe images of the output light with regard to the second light taken by the second camera when the output light with regard to the second light is subjected to phase shift a plurality of times by the second polarizer, and obtains the phase as a second measurement value; and
obtains height information specified from the first measurement value and the second measurement value, as height information of the measurement object.

5. The three-dimensional measurement device according to claim 4, further comprising:
a first spectroscope that splits the output light with regard to the first light into a plurality of lights;
a first filter, as the first polarizer, that gives different phase differences to at least a required number of split lights required for measurement by the phase shift method, out of a plurality of split lights split by the first spectroscope;
a second spectroscope that splits the output light with regard to the second light into a plurality of lights; and
a second filter, as the second polarizer, that gives different phase differences to at least a required number of split lights required for measurement by the phase shift method, out of a plurality of split lights split by the second spectroscope, wherein
the first camera simultaneously takes images of at least the plurality of split lights transmitted through the first filter, and
the second camera simultaneously takes images of at least the plurality of split lights transmitted through the second filter.

6. The three-dimensional measurement device according to claim 5,
wherein the spectroscope comprises:
a first optical member that is a triangular prism having a triangular sectional shape along a first plane and comprises a first splitter arranged along a plane that goes through a line of intersection between a first surface and a second surface out of three surfaces along a direction perpendicular to the first plane and that is orthogonal to a third surface; and
a second optical member that is a triangular prism having a triangular sectional shape along a second plane orthogonal to the first plane and comprises a second splitter arranged along a plane that goes through a line of intersection between a first surface and a second surface out of three surfaces along a direction perpendicular to the second plane and that is orthogonal to a third surface, wherein
the third surface of the first optical member is arranged to be opposed to the first surface of the second optical member, such that
a light entering the first surface of the first optical member is split in two directions by the first splitter; a split light reflected by the first splitter is reflected at the first surface toward the third surface, and a split light transmitted through the first splitter is reflected at the second surface toward the third surface, so that two parallel split lights are emitted from the third surface;
the two split lights emitted from the third surface of the first optical member enter the first surface of the second optical member; each of the two split lights is split in two directions by the second splitter; two split lights reflected by the second splitter are respectively reflected at the first surface toward the third surface, and two split lights transmitted through the second splitter are respectively reflected at the second surface toward the third surface, so that four parallel split lights are emitted from the third surface.

7. The three-dimensional measurement device according to claim 6,
wherein the first camera comprises a single imaging element that simultaneously takes images of at least the plurality of split lights transmitted through the first filter, and
the second camera comprises a single imaging element that simultaneously takes images of at least the plurality of split lights transmitted through the second filter.

8. The three-dimensional measurement device according to claim 7,
wherein the measurement object is either solder paste printed on a printed circuit board or a solder bump formed on a wafer substrate.

9. The three-dimensional measurement device according to claim 6,
wherein the measurement object is either solder paste printed on a printed circuit board or a solder bump formed on a wafer substrate.

10. The three-dimensional measurement device according to claim 5,
wherein the first camera comprises a single imaging element that simultaneously takes images of at least the plurality of split lights transmitted through the first filter, and
the second camera comprises a single imaging element that simultaneously takes images of at least the plurality of split lights transmitted through the second filter.

11. The three-dimensional measurement device according to claim 10, wherein the measurement object is either solder paste printed on a printed circuit board or a solder bump formed on a wafer substrate.

12. The three-dimensional measurement device according to claim 5,
wherein the measurement object is either solder paste printed on a printed circuit board or a solder bump formed on a wafer substrate.

13. The three-dimensional measurement device according to claim 4,
wherein the measurement object is either solder paste printed on a printed circuit board or a solder bump formed on a wafer substrate.

14. The three-dimensional measurement device according to claim 1,
wherein the measurement object is either solder paste printed on a printed circuit board or a solder bump formed on a wafer substrate.

15. A three-dimensional measurement device, comprising:
a polarizing beam splitter that:
comprises a boundary surface that splits a predetermined incident light into two polarized lights having polarizing directions orthogonal to each other;
radiates one of the split polarized lights as a measurement light to a measurement object and the other of the split polarized lights as a reference light to a reference surface; and
recombines the two polarized lights to a combined light and emits the combined light;
a first irradiator that emits a first light that comprises a polarized light of a first wavelength and enters a first surface as a first input-output element of the polarizing beam splitter, out of the first surface and a second surface of the polarizing beam splitter arranged to adjoin to each other across the boundary surface;
a second irradiator that emits a second light that comprises a polarized light of a second wavelength and enters the second surface as a second input-output element of the polarizing beam splitter;
a first quarter wave plate placed between the reference surface and a third surface of the polarizing beam splitter which the reference light enters and is emitted from;
a second quarter wave plate placed between the measurement object and a fourth surface of the polarizing beam splitter which the measurement light enters and is emitted from;
a first camera that takes an image of an output light with regard to the first light that is emitted from the second surface when the first light enters the first surface of the polarizing beam splitter;
a second camera that takes an image of an output light with regard to the second light that is emitted from the first surface when the second light enters the second surface of the polarizing beam splitter; and
an image processor that performs three-dimensional measurement of the measurement object, based on interference fringe images taken by the first and the second camera.

16. The three-dimensional measurement device according to claim 15, further comprising:
a first light guide that causes at least part of the first light emitted from the first irradiator to enter the first input-output element and that causes at least part of the output light with regard to the second light emitted from the first input-output element to enter the second camera; and
a second light guide that causes at least part of the second light emitted from the second irradiator to enter the second input-output element and that causes a least part of the output light with regard to the first light emitted from the second input-output element to enter the first camera.

17. The three-dimensional measurement device according to claim 16, further comprising:
a first light isolator that is placed between the first irradiator and the first light guide and that transmits only a light in one direction out of the light emitted from the first irradiator and blocks a light in a reverse direction; and
a second light isolator that is placed between the second irradiator and the second light guide and that transmits only a light in one direction out of the light emitted from the second irradiator and blocks a light in a reverse direction.

18. A three-dimensional measurement device, comprising:
a predetermined optical system that:
splits a predetermined incident light into two polarized lights having polarizing directions orthogonal to each other;
radiates one of the polarized lights as a measurement light to a measurement object and the other of the polarized lights as a reference light to a reference surface; and
recombines the two polarized lights to a combined light and emits the combined light;
a first irradiator that emits a first light that has a first wavelength and enters the predetermined optical system;
a second irradiator that emits a second light that has a second wavelength different from the first wavelength and enters the predetermined optical system;
a first camera that takes an image of an output light with regard to the first light that is emitted from the predetermined optical system;
a second camera that takes an image of an output light with regard to the second light that is emitted from the predetermined optical system; and
an image processor that performs three-dimensional measurement of the measurement object, based on interference fringe images taken by the first and the second camera, wherein
the first light and the second light enter different positions of the predetermined optical system, and
the predetermined optical system:
splits the first light into the reference light that is a first polarized light having a first polarizing direction and the measurement light that is a second polarized light having a second polarizing direction;
splits the second light into the reference light that is the second polarized light and the measurement light that is the first polarized light; and
emits the output light with regard to the first light by recombining the split lights and the output light with regard to the second light by recombining the split lights from different positions of the predetermined optical system.

* * * * *